United States Patent
Pommer et al.

(10) Patent No.: US 6,910,812 B2
(45) Date of Patent: Jun. 28, 2005

(54) SMALL-SCALE OPTOELECTRONIC PACKAGE

(75) Inventors: Richard Pommer, San Clemente, CA (US); Charles B. Kuznia, Encinitas, CA (US); Tri Q. Le, San Diego, CA (US); Richard T. Hagen, Mission Viejo, CA (US); Ronald E. Reedy, San Diego, CA (US); James S. Cable, San Diego, CA (US); Donald J. Albares, San Diego, CA (US); Mark Miscione, Ramona, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 156 days.

(21) Appl. No.: 10/146,550

(22) Filed: May 15, 2002

(65) Prior Publication Data

US 2003/0201462 A1 Oct. 30, 2003

Related U.S. Application Data

(60) Provisional application No. 60/335,021, filed on Oct. 31, 2001, provisional application No. 60/304,387, filed on Jul. 9, 2001, provisional application No. 60/303,695, filed on Jul. 6, 2001, provisional application No. 60/291,348, filed on May 15, 2001, and provisional application No. 60/365,599, filed on Mar. 18, 2002.

(51) Int. Cl.$^7$ ................................................. G02B 6/42
(52) U.S. Cl. ..................... 385/92; 257/200; 257/686; 257/777; 385/14; 385/24; 385/52
(58) Field of Search ................................ 257/200, 686, 257/777; 385/14, 24, 52, 92, 89, 90

(56) References Cited

U.S. PATENT DOCUMENTS 5,159,413 A 10/1992 Calviello et al.
5,574,744 A 11/1996 Gaw et al.

(Continued)

FOREIGN PATENT DOCUMENTS

| EP | 1 028 341 | * 9/1999 | ............ G02B/6/42 |
| WO | WO 99/49514 | 9/1999 | |

OTHER PUBLICATIONS

Wolf, Stanley D., Tauber, Richard N. 1986. Silicon Processing for the VLSI Era. vol. 1: Process Technology, 473–476.
Wolf, Stanley D. 1990. Silicon Processing for the VLSI Era. vol. 2: Process Integration, 376–380.

(Continued)

*Primary Examiner*—David Nelms
*Assistant Examiner*—Dao H. Nguyen
(74) *Attorney, Agent, or Firm*—Yongzhi Yang; Steven J. Hultquist; Marianne Fuierer

(57) ABSTRACT

An integrated circuit/optoelectronic packaging system (100) which comprises OE and IC components packaged to provide electrical input/output, thermal management, an optical window, and precise passive or mechanical alignment to external optical receivers or transmitters. A transparent insulating substrate having electrical circuitry in a thin silicon layer formed on its top side is positioned between the optical fiber and the optoelectronic device such that an optical path is described between the optoelectronic device and the optical fiber core through the transparent insulating substrate. The optoelectronic devices are mounted on the transparent insulating substrate in a precise positional relationship to guide holes in the substrate. The optical fibers are fixed in an optical fiber connector and are held in a precise positional relationship to guide holes in the connector. Alignment is accomplished with complementary guide pins that pass through guide holes in the fiber optic connector and in the transparent substrate.

38 Claims, 36 Drawing Sheets

U.S. PATENT DOCUMENTS

| | | | |
|---|---|---|---|
| 5,574,814 A | | 11/1996 | Noddings et al. |
| 5,631,988 A | * | 5/1997 | Swirhun et al. .............. 385/89 |
| 5,768,456 A | | 6/1998 | Knapp et al. |
| 5,771,218 A | | 6/1998 | Feldman et al. |
| 5,781,682 A | | 7/1998 | Cohen et al. |
| 5,815,623 A | | 9/1998 | Gilliland et al. |
| 6,014,476 A | | 1/2000 | Meyer-Güldner et al. |
| 6,018,249 A | | 1/2000 | Akram et al. |
| 6,034,808 A | | 3/2000 | Isaksson |
| 6,056,448 A | | 5/2000 | Sauter et al. |
| 6,075,908 A | | 6/2000 | Paniccia et al. |
| 6,130,979 A | | 10/2000 | Isaksson et al. |
| 6,137,929 A | | 10/2000 | Rosenberg et al. |
| 6,227,720 B1 | | 5/2001 | Isaksson |
| 6,234,687 B1 | | 5/2001 | Hall et al. |
| 6,243,508 B1 | * | 6/2001 | Jewell et al. ................. 385/14 |
| 6,246,708 B1 | | 6/2001 | Thornton et al. |
| 6,302,590 B1 | | 10/2001 | Moore |
| 6,318,909 B1 | * | 11/2001 | Giboney et al. .............. 385/90 |
| 6,349,159 B1 | | 2/2002 | Uebbing et al. |
| 6,384,473 B1 | | 5/2002 | Peterson et al. |
| 6,450,704 B1 | * | 9/2002 | O'Connor et al. ............ 385/92 |
| 6,526,206 B2 | * | 2/2003 | Kunkel et al. ................ 385/52 |
| 6,600,853 B2 | * | 7/2003 | Wickman et al. ............. 385/24 |
| 2001/0021287 A1 | | 9/2001 | Jewell et al. |
| 2002/0021874 A1 | | 2/2002 | Giboney et al. |

OTHER PUBLICATIONS

Liu, et al. *Ultralow–Threshold Sapphire Substrate–Bonded Top–Emitting 850–nm VCSEL Array.* IEEE Photonics Technology Letters, vol. 14, No. 9, Sep. 2002.

Pu, et al. *Hybrid Integration of VCSEL's to CMOS Integrated Circuits.* IEEE Journal of Selected Topics in Quantum Electronics, vol. 5, No. 2, Mar./Apr. 1999.

Rosenberg, et al. *The PONI–1 Parallel–Optical Link.* $49^{th}$ Electronic Components & Technology Conference, San Diego, CA Jun. 1–4, 1999.

*Element Parallel Array Optical Coupler.* Webpage for OCLI, A JDS Uniphase Company, Nov. 2001.

*OptoCube 40.* Webpage for Corona Optical Systems, Inc., Mar. 2002.

\* cited by examiner

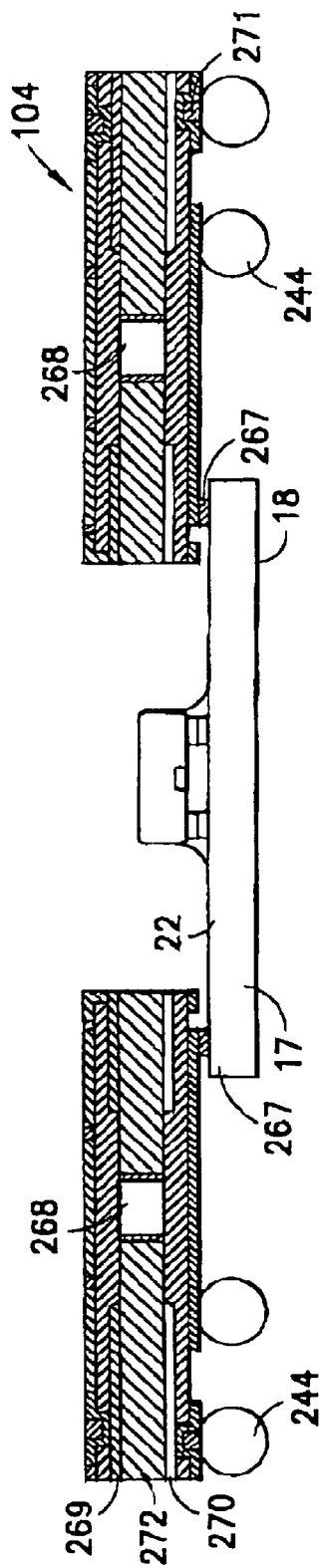
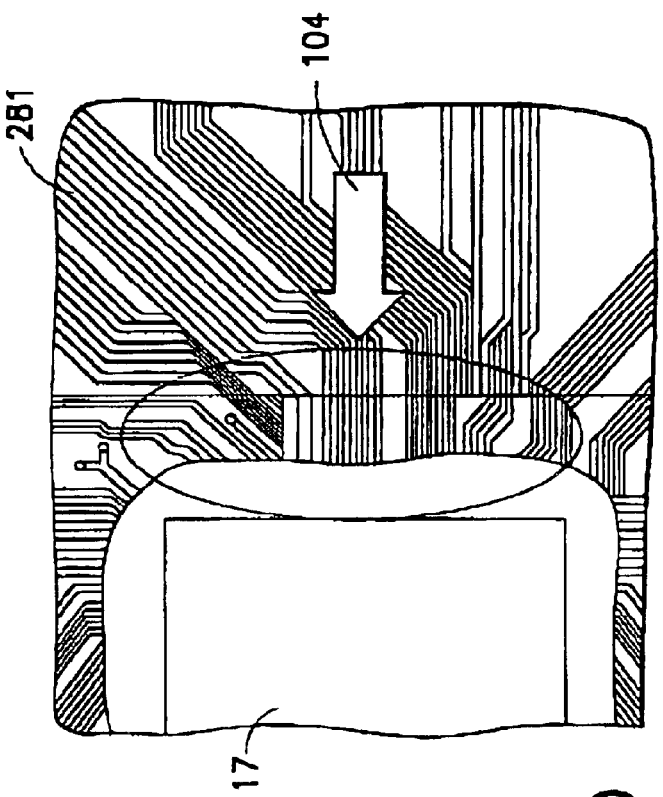
FIG.4C
FIG.4D

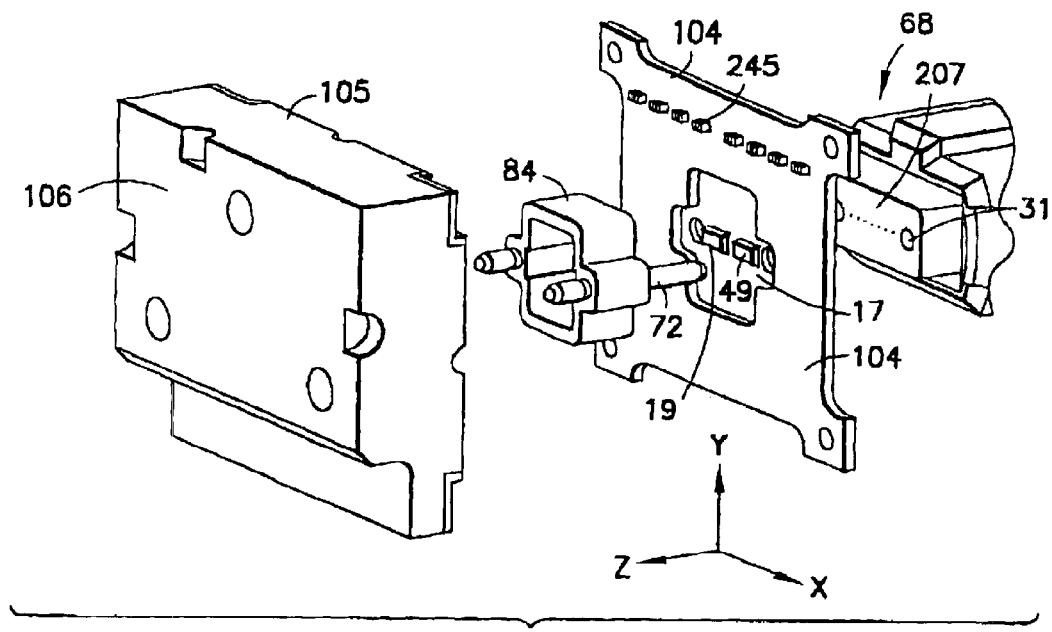
FIG.12C
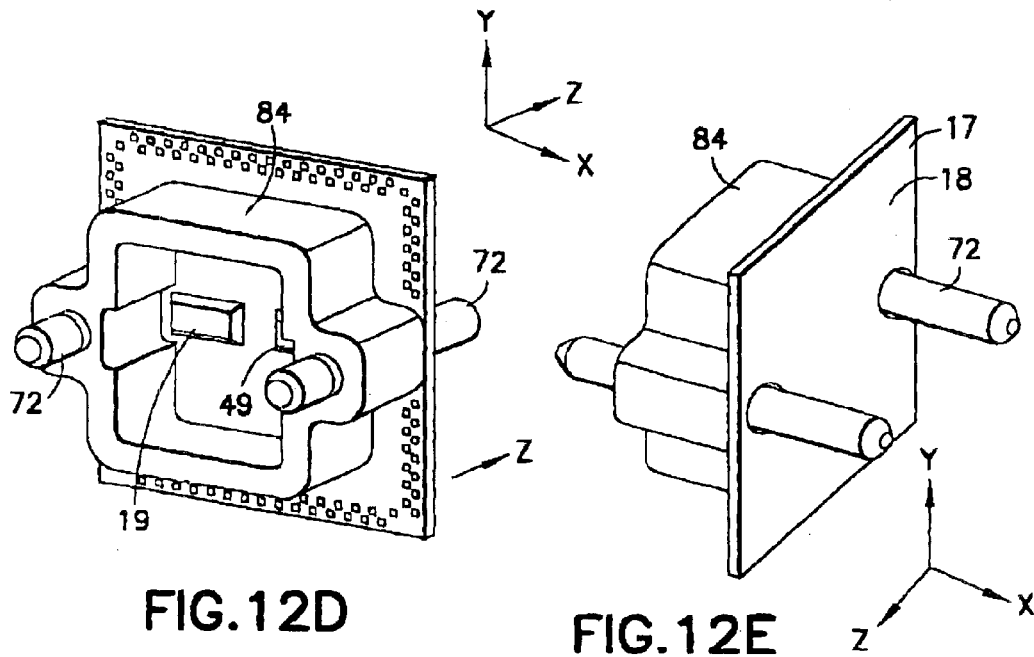
FIG.12D    FIG.12E

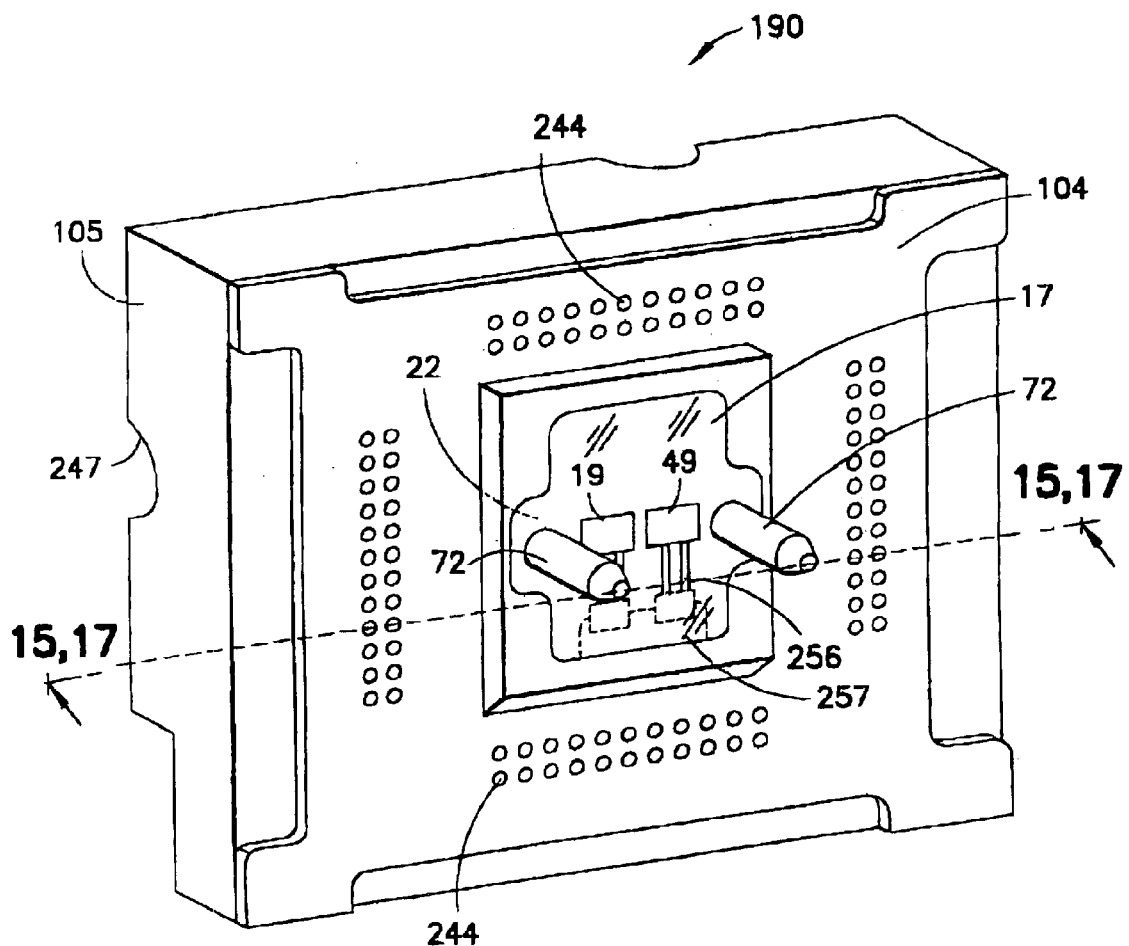
FIG.16
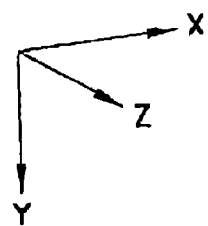

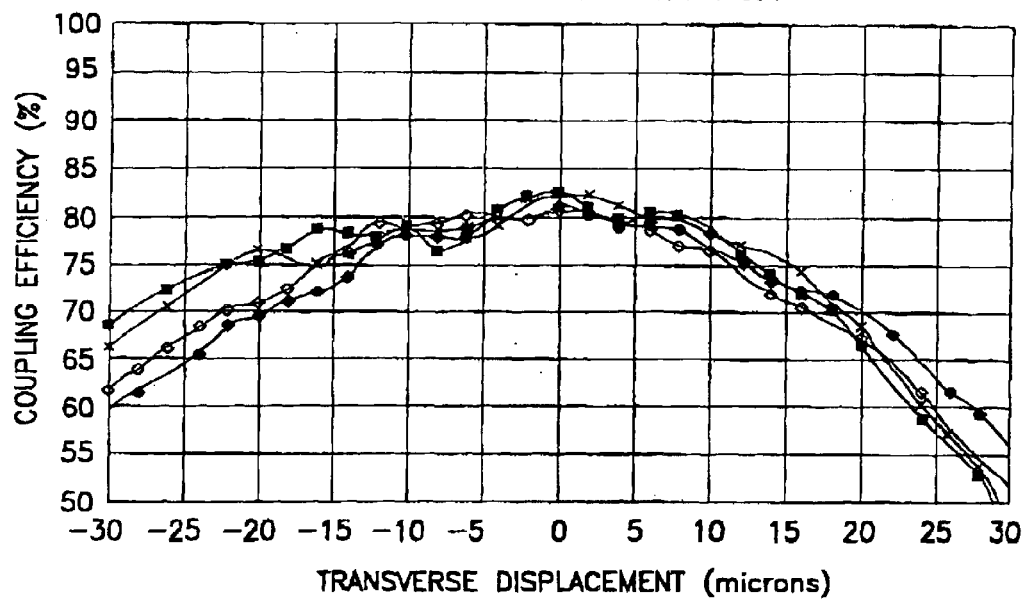
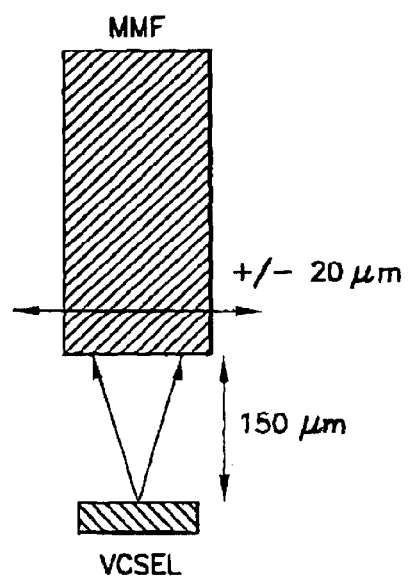
FIG.18

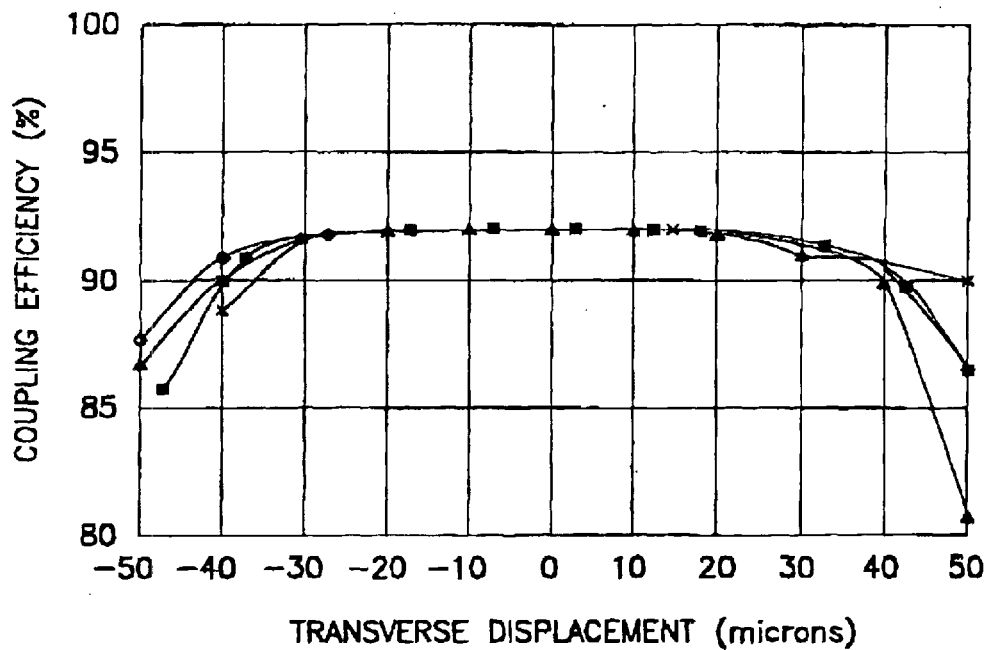
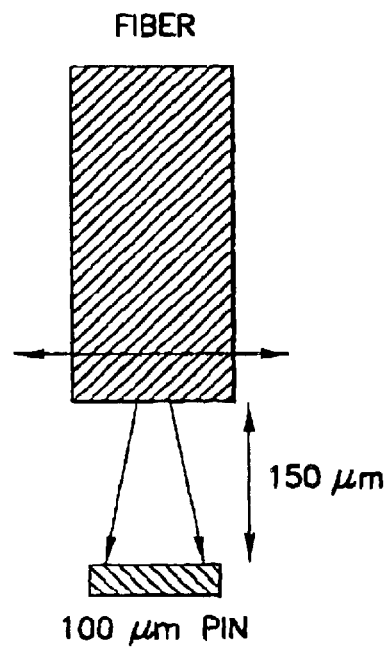
FIG. 19

SMALL-SCALE OPTOELECTRONIC PACKAGE

CROSS-REFERENCE TO RELATED APPLICATIONS

This application claims the priority of U.S. Provisional Patent Applications Ser. Nos. 60/291,348, filed May 15, 2001; 60/303,695, filed Jul. 6, 2001; 60/304,387, filed Jul. 9, 2001; 60/335,021, filed Oct. 31, 2001; and 60/365,599, filed Mar. 18, 2002.

FIELD OF THE INVENTION

The present invention relates to a method and apparatus for coupling light between optical fibers and optoelectronic devices and aligning the optical fibers and optoelectronic devices, for coupling light therebetween, having applicability to the manufacture of a small scale package for an optoelectronic device or arrays of such devices that provides precise alignment and efficient optical coupling.

BACKGROUND OF THE INVENTION

The disclosure of U.S. Provisional Patent Applications Ser. No. 60/291,348, filed May 15, 2001; 60/303,695, filed Jul. 6, 2001; 60/304,387, filed Jul. 9, 2001; 60/335,021, filed Oct. 31, 2001; and 60/365,599, filed Mar. 18, 2002, are hereby incorporated herein by reference in their entireties. This application is related to U.S. patent application Ser. Nos. 09/658,259, filed Sep. 8, 2000; 60/300,129, filed Jun. 22, 2001; and Ser. No. 10/099,523, filed Mar. 15, 2002, the disclosures of which are hereby incorporated herein by reference in their entireties.

Applications that require manipulation of many optical signals are becoming more complex and more commonplace. Such applications include the routing of signals in fiber optic networks, necessitated by, for example, telecommunications and large volumes of internet data traffic. Large volumes of signals must be processed, transmitted to or received from optical fibers, where the optical fibers are typically present as arrays of up to 100×100 fibers; larger arrays are possible and may be expected in the near future. As these optical interconnection networks become more complex and the volume of signal traffic increases, it becomes more and more important to reduce signal loss and cross-talk and to minimize the size of the optical/optoelectronic interconnect package.

Integration of Electronic, Optoelectronic and Optical Functions

The optoelectronic devices that perform optical signal processing tasks, for example, lasers, light-emitting diodes, photodetectors, photomodulators and the like, must be efficiently interfaced with the optical fibers or waveguides used in high speed telecommunications and data networks. Additionally, in an optical communications system, the optical signals are converted to electrical signals, and vice versa. Increasing the integration of the electrical functions with the optoelectronic functions has the potential to increase speed and reduce losses.

A desirable optical/optoelectronic interconnect package will provide high signal-to-noise ratio and high speed; low parasitic capacitance and inductance; high density; low crosstalk between devices; and low power consumption. A desirable optical/optoelectronic interconnect package will allow integration of multiple electrical functions such as driver circuits, signal processing circuits, input/output functions. Furthermore, the optical/optoelectronic interconnect package will enable efficient alignment of optical fibers with optoelectronic devices. Yet further, the optical/optoelectronic interconnect package will be capable of being economically manufactured and tested.

Optical/Optoelectronic Integration

In high speed telecommunications and data networks, the optoelectronic devices must efficiently transmit optical signals to and receive optical signals from the optical transmission grid, that is, optical fibers or waveguides. Optical fibers have an optical core that transmits light and an outer cladding layer that has a lower refractive index than the optical core. Optical fibers used in networks may be multi-mode or single mode, depending on the size of the optical core, and are selected based on the distance over which the optical signal needs to be transmitted and the bandwidth desired. Optical fibers are formed from a variety of materials such as glasses and plastics, glasses being predominant. It is understood that the optical signals are transmitted in the optical core along the fiber's long axis, and at the fiber's end the signals are emitted and received by the optical fiber's optical core, though for shorthand convenience, signal transmission is sometimes said to be by "the optical fiber."

Individual fibers or arrays of fibers may optically connect with an individual optoelectronic (OE) device or an array of OE devices in a one-fiber/one-OE-device relationship, or the fibers may be present as bundles of fibers where a plurality of fibers optically interface with one OE device. Effective coupling between OE device and optical fiber requires precise alignment. A low-loss optical pathway must be defined between the optical fiber core(s) and the active region of the optoelectronic device.

The optical fiber arrays with which the optoelectronic devices must couple are often mounted in fiber optic connectors (ferrules), which are housings that (a) position the fibers in a precisely specified and fixed spaced-apart relationship to each other, and (b) provide means to align and mount the fiber array so that it will mate precisely with an array of optoelectronic devices or another array of optical fibers. Designs for these optical ferrules are increasingly becoming standardized. An example of such a standard optical fiber connector is the "MT" (mechanically transferable) ferrule, which precisely positions an array of optical fibers in a V-groove substrate and provides alignment means in the form of guide holes whose position relative to the fibers is tightly specified. The alignment means employ complementary mechanical alignment members in the form of guide pins.

Therefore a desirable optical/optoelectronic interconnect package and packaging method will facilitate precise alignment and mating with optical fiber ferrules, V-groove substrates, or connectors. The alignment process should position the active areas of the optoelectronic devices in registration with the fiber optic cores with high precision.

U.S. Pat. No. 6,130,979 describes an optoelectronic module having laser diodes mounted on a metal lead-frame structure in an arrangement that corresponds to the position of optical fibers mounted in an optical fiber ferrule. The metal lead frame has a pair of holes for receiving guide pins that are used to align the lead frame to the optical fiber ferrule. Electrical circuitry for driving or controlling the laser diodes is not provided within this structure.

For electrical connection with electrical circuitry for driving or controlling the devices, optoelectronic devices such as vertical cavity surface emitting lasers (VCSELs) typically have two electrical leads. At least one connection is made to the top side of the device, that is the side that bears the optically active (light emitting, light detecting, light modulating, etc.) region. VCSELs typically have a top electrical contact, and the second electrical contact may be made to the opposite (bottom) side, although it is anticipated that newer, faster devices that have both electrical contacts on the top side will increasingly be preferred. Therefore, space constraints figure strongly in the design of packages that integrate electronic functions with optoelectronic devices.

The requirement to make electrical contact to the optoelectronic device on the same side as the region to which light must have access makes it difficult to efficiently configure the light path between the optical fiber and the optoelectronic device, taking into account the need for high speed electronic circuitry for driver or amplifier, control, and I/O functions. This high speed electronic circuitry is typically fabricated on a separate integrated circuit chip. The high speed electronic circuitry is typically formed in silicon, most preferably as CMOS circuitry, but may comprise other device types and can be formed in other materials such as SiGe or InPbP. Because of these constraints, wire bonds are typically used to connect a bonding pad associated with each optoelectronic device with a corresponding bonding pad on the separate integrated circuit chip.

For example, a parallel fiber optic/optoelectronic link designed for high volume use in telecom and datacom switches was recently described by Rosenberg et al. ("The PONI-1 Parallel-Optical Link," $49^{th}$ Electronic Components and Technology Conference, San Diego, Calif. Jun. 1–4, 1999; U.S. Pat. No. 6,137,929). In this system, which constitutes a link between 1×12 arrays of VCSELs and optical fibers, the VCSEL driver circuitry on a silicon integrated circuit chip is wire bonded to the optoelectronic devices; a 1×12 array of OE devices requires 12 wire bonds. A wire bond is required to make a top contact to each VCSEL, necessitating a certain amount of clearance around each VCSEL. The end surfaces of the optical fibers are flush with or extend slightly beyond casing of the optical fiber ferrule (e.g. MT ferrule). Because of the space required for the wire bond, the optical fiber end surfaces cannot be brought flush with or sufficiently close to the optoelectronic devices to make a low-loss optical connection. An optical cover or "faceplate" system is used to transmit light more efficiently between the optical fiber core and the optoelectronic device.

European Patent Application EP 1028341 A2 (by Giboney, Rosenberg, and Yuen) describes a fiber optic-optoelectronic alignment system for use with this type of connector. The alignment system features a printed circuit board which is attached to a mechanical support. The printed circuit board has cutouts or access holes concentric with alignment holes in the mechanical support. Optoelectronic devices are positioned on the printed circuit board, which is then positioned on the mechanical support. Optical fibers in an optical fiber connector that has corresponding alignment holes can be aligned with the mechanical support by means of complementary guide pins. The optical fiber connector and hence the optical fiber ends are separated from and stand off from the optoelectronic devices with a cover positioned in between. The cover has corresponding guide holes through which the guide pins pass and a light-transmissive window through which the optical signals are transmitted.

Wire bonds are often the most physically fragile part of an electronic package. Furthermore, wire bonds introduce parasitic resistance, capacitance and inductance hence increased power dissipation. Krishnamoorthy et al. analyzed the issues involved with integrating optoelectronic components with silicon controlling circuitry, in particular the performance penalty imposed by wire-bonding optoelectronic components rather than flip-chipping ("Optoelectronic-VLSI: Photonics Integrated with VLSI Circuits," IEEE Journal of Selected Topics in Quantum Electronics, Vol. 4, No. 6, November/December 1998, pages 899–912). Their analysis modeled maximum transmission (bit rate) for given power dissipation. Even for relatively low numbers of integrated optoelectronic devices, wire bonding imposed severe penalties on bandwidth and power dissipation.

To avoid these deleterious electrical and mechanical effects and to enable a low-loss optical pathway to be formed more simply between optical fiber and optoelectronic device, it is desirable to minimize the number of wire bonds that are present in an optical communications package. Hence an optoelectronic/optical coupling method that avoided or minimized the number of wire bonds would be desirable.

Electronic/Optoelectronic Integration

Therefore, it is also necessary to combine high density, high speed controlling electronic circuitry (most advantageously fabricated in silicon) with the optoelectronic devices in an intimate fashion that minimizes parasitic capacitance and inductance. More closely integrating the electrical circuits with the optoelectronic devices has the potential to increase speed and reduce losses, but close integration must not lead to excessive heat transfer from the electrical circuits to relatively heat-sensitive OE devices and consequent performance degradation.

At the wavelengths of interest in optical networks, in the visible to infrared ranges, optoelectronic devices (for example, lasers, photodetectors, photomodulators and the like), are typically made by epitaxial processes or monolithically in optically active materials, such as compound semiconductors, most commonly III–V materials, especially GaAs, as well as II–VI semiconductors such as ZnSe, transparent ferroelectrics such as lithium niobate and other related oxide materials, and liquid crystal and other optoelectronic polymers. For example, vertical cavity surface emitting lasers (VCSELs) are typically fabricated in AlGaAs and GaAs on GaAs substrates; photodetectors may be made in various III–V materials such as InP.

The controlling circuitry for the optical/optoelectronic coupling system is most advantageously formed in silicon. Silicon-based metal-oxide semiconductor (MOS) technology is virtually the standard for digital circuits that are used for to control the signal processing tasks in switching systems. No other approach can compare with the high device densities and high yields available with silicon CMOS (complementary MOS) technology, and standard silicon integrated circuit processing technology is so well-developed that it would be desirable to employ standard IC processing steps for the fabrication optical/optoelectronic coupling system to the greatest extent possible. Closely integrating the CMOS circuitry with the optoelectronic devices while minimizing the need for wire bonding could greatly increase both the performance and production efficiency of overall optical/optoelectronic signal processing package.

To date, various methods to integrate electronic and optoelectronic functions have been tried, with less than ideal results. Heteroepitaxial growth of GaAs on silicon, and silicon on GaAs have been explored, but after decades of research, fundamental problems such as the mismatch in the crystal lattice constants, cross-contamination, incompatibilities of device processing, and the difference in the coefficients of thermal expansion of the two materials have prevented this goal from being satisfactorily achieved on a commercial scale, particularly when high performance lasers, photodetectors or drive electronics are required. Epoxy casting, by which completely fabricated chips are mounted in a common epoxy cast and final metal deposited (multi-chip modules) has numerous problems, including high cost and poor parasitics, size, reliability and yield.

Flip-chip bonding is a packaging technique of mounting the active side of a chip toward a substrate. This technique, by which a chip is flipped over and attached to a substrate or other chip by a fusible joint, brings two dissimilar chips into intimate electrical and mechanical contact with each other and can reduce parasitics and improve speed. Commercial machines can perform this operation with great reliability and repeatability. Low temperature infrared (IR) detector arrays have been flip-chipped with silicon readout circuitry; the silicon substrate is transparent to the infrared wavelengths being detected by the IR detector array enabling a simple configuration. However, for the optical wavelengths used in current fiber optic networks, i.e., less than approximately 1 μm and typically about 850 nm, silicon is opaque and hence the substrate needs to be removed by etching or other means to provide optical access to the OE devices. Selectively etching optical access areas to provide light paths to an array of OE devices is a demanding and unattractive manufacturing step.

Furthermore, infrared detectors are generally low speed systems, often operating at Kilohertz speeds. For such low speeds, the parasitic effects of a bulk silicon substrate are virtually non-existent. However, optical communications systems operate at Gigahertz rates, or a million times higher in frequency. These high speeds cause the silicon substrate parasitics to become significant in areas of power consumption, crosstalk, distortion, maximum frequency and noise. These electrical limitations of silicon as a substrate material are true for all wavelengths of light being used. Therefore, even if the silicon is transparent at a given wavelength, it is not an ideal substrate for high speed (multi-Gigahertz) optical communication systems.

Manufacturing Considerations

As link data rates increase, optical links replace electrical links at shorter link distances, including applications such as bus architectures that require large numbers of links. Optical data links combining electronic circuitry, light sources and detectors, and optical fiber receptacles require high volume, low cost manufacturing techniques. Low cost, highly automated manufacturing and testing techniques are well known and available in the electronics industry for packaging components such as electronic integrated circuit chips on printed circuit boards. These techniques can be characterized as "planar" in that the components are affixed, electrically interconnected, and encapsulated on the flat surface of the printed circuit board.

However, these highly automated and precise methods have not heretofore been applied to assembling structures that incorporate integrated circuit chips and optoelectronic devices, packaged in a form that allows for the optoelectronic devices to be readily aligned to optical fibers for forming optical interconnections. The need to provide light access to the optoelectronic devices as well as electrical connections to separate integrated circuit chips has constrained the geometries of such packages. During manufacturing, complex manipulations in three dimensions are required, and the low cost automated assembly and testing techniques are not applicable to all the steps involved in assembling and packaging all the components of an optical data link. Alignment of the optoelectronic device and optical fiber may be a manual or relatively expensive hybrid manufacturing step.

Furthermore, current methods of packaging optoelectronic devices with the associated integrated circuits used for control of the optoelectronic devices do not allow for handling, test and burn-in at the chip scale package level. The optoelectronic devices cannot be "burned in" (stressed at conditions that are designed to simulate extreme conditions the product may encounter and provoke any failures that could occur) and tested under operating conditions until a late stage of manufacturing. Burn-in and test at a late stage, when the components—optoelectronic device die, integrated circuit die, alignment means—have been mounted and assembled into a module, results in yield loss of fully packaged components, leading to overall higher costs.

There is therefore a need for an optical coupling and alignment method that can be used in packaging designs that allow the optoelectronic devices and the associated integrated circuit chips to be tested at an earlier stage, prior to optical data link module assembly. Such packaging designs should be capable of being manufactured by highly automated, low cost manufacturing techniques, preferably using planar manufacturing methods that are well known and have become highly developed in the electronics industry.

Further, a desirable optical coupling and alignment method will enable optical/optoelectronic interconnect packaging designs that have a reduced number of tightly specified or demanding manufacturing steps; have fewer failure-susceptible parts such as wire bonds; and generate a smaller amount of waste heat and/or effectively route waste heat away from heat-sensitive optoelectronic devices. Such optical/optoelectronic interconnect packages may also need to meet multiple standards, such as precisely specified regular spacing between optoelectronic device active areas or between optical fiber cores (e.g., 250 μm pitch); physical dimensions of the optical connections; and reliability characteristics including thermal cycling, humidity resistance and mechanical durability.

In addition, a desirable optical coupling and alignment method will provide an optical/optoelectronic interconnect package capable of being manufactured in an array format for processing optical signals between arrays of optoelectronic devices and arrays of optical fibers. Optical fibers are often provided in 1×12 arrays or "ribbons", although much larger one- and two-dimensional fiber arrays are in development and coming into use. The array sizes can be expected to grow as networks become more complex. Hence a useful packaging system will be configured to handle arrays in a simple and scalable fashion. Networks are increasing in both speed and number of connections in response to increasing data bandwidth demand. As networks increase in size, the number of nodes increases exponentially, because of the requirements to make connections between multiple systems; to provide backup and storage functions; to provide redundant paths, and to allow flexible system operation.

SUMMARY OF THE INVENTION

The present invention describes a method for packaging and a packaging system for optoelectronic devices and integrated circuits, for coupling light between optical fibers and the optoelectronic devices and aligning the optical fibers and optoelectronic devices, for coupling light therebetween The invention overcomes many of the disadvantages and shortcomings of previously described coupling and alignment packages and methods. Furthermore, the present invention includes optical/optoelectronic interconnect packages which are readily manufacturable and that do not sacrifice the speed and power performance of either of the individual electronic or optoelectronic device components.

The inventive optical/optoelectronic coupling structure comprises an optical fiber including a core; an optoelectronic device such as a laser, photodetector or modulator; and a transparent insulating substrate having substantially parallel top and bottom surfaces positioned between the optical fiber and the optoelectronic device in such a way that an optical path is described between the optoelectronic device and the optical fiber core through the transparent insulating substrate, passing through the top and bottom surfaces. The transparent insulating substrate has a thin layer of silicon on its top surface which includes an electrical circuit in electrical communication with the optoelectronic device through a conductive bond.

It is a further objective of the invention to provide methods for fabricating such optical-optoelectronic coupling structures. A method of the invention comprises the steps of:

providing a transparent, insulating substrate having substantially parallel top and bottom surfaces;

forming a thin layer of silicon on at least part of the top surface of the transparent, insulating substrate;

forming an electrical circuit in the silicon layer;

bonding an optoelectronic device to the top surface of the transparent, insulating substrate, in electrical communication with the electrical circuit, and configured to allow light access to the optoelectronic device through the transparent, insulating substrate; and mounting an optical fiber on the back surface of the transparent, insulating substrate such that an optical path is described between the optoelectronic device and the optical fiber core through the transparent insulating substrate.

In the practice of the invention, the transparent, insulating substrate bearing a thin layer of silicon may comprise an ultrathin silicon-on-sapphire substrate.

The electronic circuits in the silicon layer are typically CMOS devices, though they may be of any form suited for the application. Especially preferred CMOS devices include VCSEL drivers, receiver circuits for photodetectors, and other signal/data processing and switching circuits.

Preferred optoelectronic devices are light-emitting devices such as lasers and diodes, light detecting devices such as photodetectors, and light modulators, such as quantum well modulators. Preferred light emitting optoelectronic devices are fabricated in III–V materials; and preferred light detecting devices are fabricated in III–V, IV and II–VI materials. For infrared and visible light, especially preferred light emitting devices are fabricated on GaAs substrates, and light detecting devices are fabricated in GaAs, InGaAs, Si, or Ge. In the practice of the present invention, it is an advantage that optoelectronic devices of more than one type of material may be incorporated into the hybrid module. For example, an advantageous combination comprises a II–VI based photodetector input, fabricated for example in HgCdTe, as input, in combination with a III–V based VCSEL output, fabricated for example in GaAs.

In another aspect, the invention provides an optical/optoelectronic coupling structure based on a transparent insulating substrate, wherein electrical circuitry that provides optoelectronic device control and other functions is present one or more integrated circuit chips that are bonded to the transparent substrate. Such optical interfaces comprise an optical fiber including a core; an optoelectronic device attached by a first electrically conductive bond to a transparent insulating substrate, wherein the transparent insulating substrate has substantially parallel top and bottom surfaces; the transparent insulating substrate is positioned between the optical fiber and the optoelectronic device such that an optical path is described between the optoelectronic device and the optical fiber core through the transparent insulating substrate, passing through the top and bottom surfaces of the transparent insulating substrate; the top surface of the transparent insulating substrate has electrically conductive traces thereon; an electrical circuit formed in an integrated circuit chip, wherein: the integrated circuit chip is attached to the top surface of the transparent insulating substrate by a second electrically conductive bond; and the electrical circuit is in electrical communication with the optoelectronic device through the first and second conductive bonds and the electrically conductive traces. The optoelectronic device is selected from the group consisting of lasers, light-emitting diodes, photodetectors, and modulators, with VCSELs being of special interest.

To overcome the limitations of the previous approaches, the invention describes an optical/optoelectronic coupling system with simple, passive alignment of optical fibers to optoelectronic devices, and a high level of integration of electronic, optoelectronic, and optical functions. The system provides high rate optical transmission with low optical loss and low electrical parasitics.

In one aspect, the invention provides:

an optical fiber held in an optical fiber connector; wherein:

the optical fiber connector has a first alignment means comprising a pair of guide holes; and the optical fiber is held in a precise positional relationship to the first alignment means;

an optoelectronic device mounted on a transparent insulating substrate, wherein:

the transparent insulating substrate has substantially parallel top and bottom surfaces and is positioned between the optical fiber and the optoelectronic device such that an optical path is described between the optoelectronic device and the optical fiber through the transparent insulating substrate, passing through the top and bottom surfaces; and the transparent insulating substrate has a second alignment means comprising a pair of guide holes corresponding to the first alignment means; and the optoelectronic device is mounted on the transparent insulating substrate in a precise positional relationship to the second alignment means; and alignment members comprising a pair of guide pins complementary to the first and second alignment means, whereby the optical fiber and optoelectronic device are aligned when the alignment members are coupled with the first and second alignment means.

In the optical/optoelectronic coupling system, the optoelectronic device is bonded to the transparent insulating substrate by means of an electrically conductive bond and is in electrical communication with electrical circuitry on the transparent insulating substrate. The electrical circuitry may be present in a thin silicon layer on the transparent insulating substrate or may be present in an integrated circuit chip flip-chip bonded to the transparent insulating substrate.

In preferred embodiments, the transparent insulating substrate is selected from the group consisting of sapphire and glasses. In some embodiments, the transparent insulating substrate is sapphire and the thin silicon layer is an ultrathin silicon-on-sapphire layer. The substrate guide holes may be formed by ultraviolet laser drilling.

In another aspect, the invention provides methods for fabricating optical-optoelectronic coupling structures, coupling arrays of optoelectronic devices to arrays of optical fibers. In one embodiment, the method includes the general steps below, which may be performed in the following order or in different order:

provides a transparent, insulating substrate having substantially parallel first and second surfaces;

forming a thin layer of silicon on at least part of the first surface of the transparent, insulating substrate;

forming an electrical circuit in the silicon layer;

providing alignment reference marks on the first surface;

drilling guide holes in the transparent insulating substrate (by UV laser drilling or other suitable methods) in a precise positional relationship to the alignment reference marks;

bonding an optoelectronic device to the first surface of the transparent, insulating substrate, in electrical communication with the electrical circuit, and configured to allow light access to the optoelectronic device through the transparent, insulating substrate, wherein the optoelectronic device is mounted on the transparent insulating substrate in a precise fixed positional relationship to the alignment reference marks;

mounting and mating the integrated electronic/optoelectronic module support member onto a support member equipped to provide electrical connections and which supports guide pins complementary to the substrate guide holes; and mounting and mating an optical fiber connector having complementary guide holes onto the guide pins thereby to align the optical fiber with the optoelectronic device.

In another embodiment, the method includes the general steps below, which may be performed in the following order or in different order: providing a transparent, insulating substrate having substantially parallel top and bottom surfaces;

forming electrically conductive pathways and alignment reference marks on the top surface of the transparent insulating substrate;

drilling guide holes in the transparent insulating substrate (by UV laser drilling or other suitable methods) in a precise positional relationship to the reference marks;

bonding an integrated circuit chip to the top surface of the transparent insulating substrate;

bonding an optoelectronic device to the top surface of the transparent, insulating substrate, in electrical communication with the integrated circuit chip by means of the electrically conductive pathways, and configured to allow light access to the optoelectronic device through the transparent, insulating substrate, wherein the optoelectronic device is mounted on the transparent insulating substrate in a precise fixed positional relationship to the alignment reference marks;

mounting and mating the integrated electronic/optoelectronic module support member onto a support member equipped to provide electrical connections and which supports guide pins complementary to the substrate guide holes; and mounting and mating an optical fiber connector having complementary guide holes onto the guide pins thereby to align the optical fiber with the optoelectronic device.

To overcome the limitations of the previous approaches, the invention provides a simple coupling and alignment method by which a small scale optical/optoelectronic interconnect package can be manufactured using low cost, high volume techniques that have been well developed in the electronics industry. The geometry of the small scale package allows for an essentially planar manufacturing process flow. The small scale package can be designed with advantageous geometry, in contrast to prior art methods of packaging optoelectronic devices with integrated circuits.

The small scale optoelectronic package includes an optoelectronic device flip chip bonded to a transparent, electrically insulating substrate. Optical access to the optoelectronic devices is provided through the transparent insulating substrate, which acts as a "window" to protect the optoelectronic devices. The small scale optoelectronic package may comprise an optoelectronic device flip chip bonded to the front, electronic circuit-bearing side, of an integrated circuit chip which comprises a transparent, insulating substrate upon which one or more areas comprising a thin layer of device-quality silicon have been formed. Electronic devices formed in the thin silicon layer include those circuits necessary for control of the optoelectronic devices, e.g., VCSEL drivers, photodetector signal amplifiers, and optionally various other functionalities such as EEPROM memory, as well as optional passive devices integrated on-chip.

The small scale optoelectronic package may comprise one or an array of many optoelectronic devices which may all be of the same type or may be of different types. Thus the package may be used to make a light receiver (e.g., photodetectors), a light modulator, a light emitter (e.g., lasers or light-emitting diodes), or an optical transceiver (photodetectors and lasers). The small scale optoelectronic package further includes alignment means for aligning such optoelectronic devices to optical fibers.

The small scale optoelectronic package can be manufactured, burned in and tested at normal or higher than normal operating speeds using high volume automated techniques. The small scale optoelectronic package is tested by means of a test socket that can be mated with the package using automated pick-and-place equipment. The test socket passively aligns the optoelectronic devices with optical fibers or waveguides, mates bonding pads with BGA-style electrical connections in the small scale package, and tests the electrical performance of the integrated circuit chip and the electrical and optical performance of the optoelectronic devices. While the manufacturing line may be quite standardized, the test sockets are designed for the particular small scale optoelectronic package they will be used to test. Thus, great variations in the functionalities included in the small scale package can be accommodated with minimal and simple changes to the assembly line, since the test socket, which is relatively small and simple, is modified as needed.

The present invention provides a small scale optoelectronic package and method for making the package. Examples of the invention include:

a package for vertical cavity surface emitting lasers (VCSELs), for efficiently coupling light emitted by the VCSELs into optical fibers for signal transmission;

a package for photodetectors, for efficiently coupling light emitted by optical fibers into the active areas of the photodetectors for signal reception;

a light transceiver comprising a package including (i) a first array of optoelectronic devices comprising photodetectors for signal reception; (ii) a second array of optoelectronic devices comprising light-emitting devices (e.g., lasers, light-emitting diodes) for signal transmission; (iii) a common transparent insulating substrate to which the first and second arrays of optoelectronic devices are both flip-chip bonded; (iv) CMOS electrical circuitry formed in a thin silicon layer on the transparent, insulating substrate and in electrical communication with the first and second arrays of optoelectronic devices; and (v) an alignment means for aligning the first array of optoelectronic devices with a corresponding first array of optical fibers and the second array of optoelectronic devices with a corresponding second array of optical fibers.

An optical-optoelectronic coupling structure of the invention employs an optoelectronic device electrically connected through flip-chip bonds to controlling CMOS circuitry formed in a thin silicon layer on selected areas of the top surface of a transparent, insulating substrate to which the optoelectronic device is flip-chip bonded; that is, an integrated "flip-chip optoelectronic/silicon-on-insulator module." The flip-chip optoelectronic/silicon-on-insulator module is mounted on an optical-fiber-bearing carrier such that an optical path is described between the optoelectronic device and the optical fiber core, passing through the transparent substrate.

In one aspect, the invention provides an optoelectronic small scale package that includes one or more optoelectronic devices flip-chip bonded to a top surface of a transparent insulating substrate such that optical access to the optoelectronic devices is through the transparent insulating substrate; and optical fiber passive alignment means attached to the transparent insulating substrate in precise spatial relationship to the optoelectronic devices; wherein the transparent insulating substrate has on its top surface at least one area comprising a thin film of silicon having electronic devices formed therein and in electrical contact with the optoelectronic devices. A PCB-like supporting member is configured for mounting of the transparent insulating substrate. A thermally conductive support, for mounting the transparent insulating substrate and PCB-like supporting member thereto, is configured for heat removal from the silicon electronic devices. In preferred embodiments, the thin silicon film on transparent insulating substrate comprises ultra-thin silicon on sapphire. The optoelectronic devices may be selected from diverse devices that send, receive or manipulate optical signals, such as photodetectors and lasers. The alignment means desirably comprises a precision alignment insert molded from plastic and configured to retain fiber optic ferrule guide pins, for example, guide pins associated with an MT connector.

In another aspect, the invention provides a method for making a small scale optoelectronic package comprising the steps of:

flip chip bonding one or more optoelectronic devices to a top surface of a transparent insulating substrate such that optical access to the optoelectronic devices is through the transparent insulating substrate; and attaching optical fiber passive alignment means to the transparent insulating substrate in precise spatial relationship to the optoelectronic devices.

In another aspect, the invention provides a method for making a small scale optoelectronic package comprising the steps of:

forming alignment reference marks on a transparent insulating substrate;

flip chip bonding one or more optoelectronic devices to a top surface of the transparent insulating substrate such that optical access to the optoelectronic devices is through the transparent insulating substrate, wherein the optoelectronic devices are positioned in a fixed location relative to the alignment reference marks; and attaching optical fiber passive alignment members to the transparent insulating substrate in a fixed location relative to the alignment reference marks.

Preferably, the alignment members are selected from (1) precision guide pin holders; (2) guide pins; and (3) precision drilled guide holes.

In another aspect, the invention is a method for testing the small scale optoelectronic package by engaging the small scale package with a test socket, wherein the test socket and the small scale package have complementary electrical and optical connecting structures and the test socket has electrical and optical signal generating and detecting capability; and testing the electrical and optical responses of the small scale package. The method further comprises exposing the package to conditions that are at least as stringent as the conditions that the small scale package is exposed to under routine use before testing its responses.

BRIEF DESCRIPTION OF THE DRAWINGS

FIG. 4C shows a schematic cross-section of one example of an interposer board comprising a high-density interconnect substrate. FIG. 4D shows an example of a pattern of electrically conductive traces on an interposer board, for routing electrical signals from an attached integrated circuit die toward electrical connections that are near the edge of the board and are spread apart at a much greater pitch, for example a typical ball-grid-array.

FIG. 12C is an exploded side-view schematic representation of the FIG. 12B embodiment of the small scale package of the invention, aligned for coupling with an array of optical fibers mounted in a fiber optic connector. FIGS. 12D and 12E are front and back views of a subassembly of the small scale package of the invention, comprising the transparent insulating substrate with flip-chipped optoelectronic devices, attached to a precision guide pin retainer.

FIG. 16 is a view of the optical output surface of a small scale package according to the present invention.

FIG. 18 shows plots of coupling efficiency vs. transverse offset ($\mu$m) for a VCSEL coupling to a multimode optical fiber through sapphire substrates of various thicknesses at various VCSEL driving currents.

FIG. 19 shows plots of coupling loss (dB) vs. lateral offset ($\mu$m) for a PIN photodetector coupling to a multimode optical fiber through sapphire substrates of various thicknesses at various VCSEL driving currents.

DETAILED DESCRIPTION AND PREFERRED EMBODIMENTS

Definitions

Figure 1:
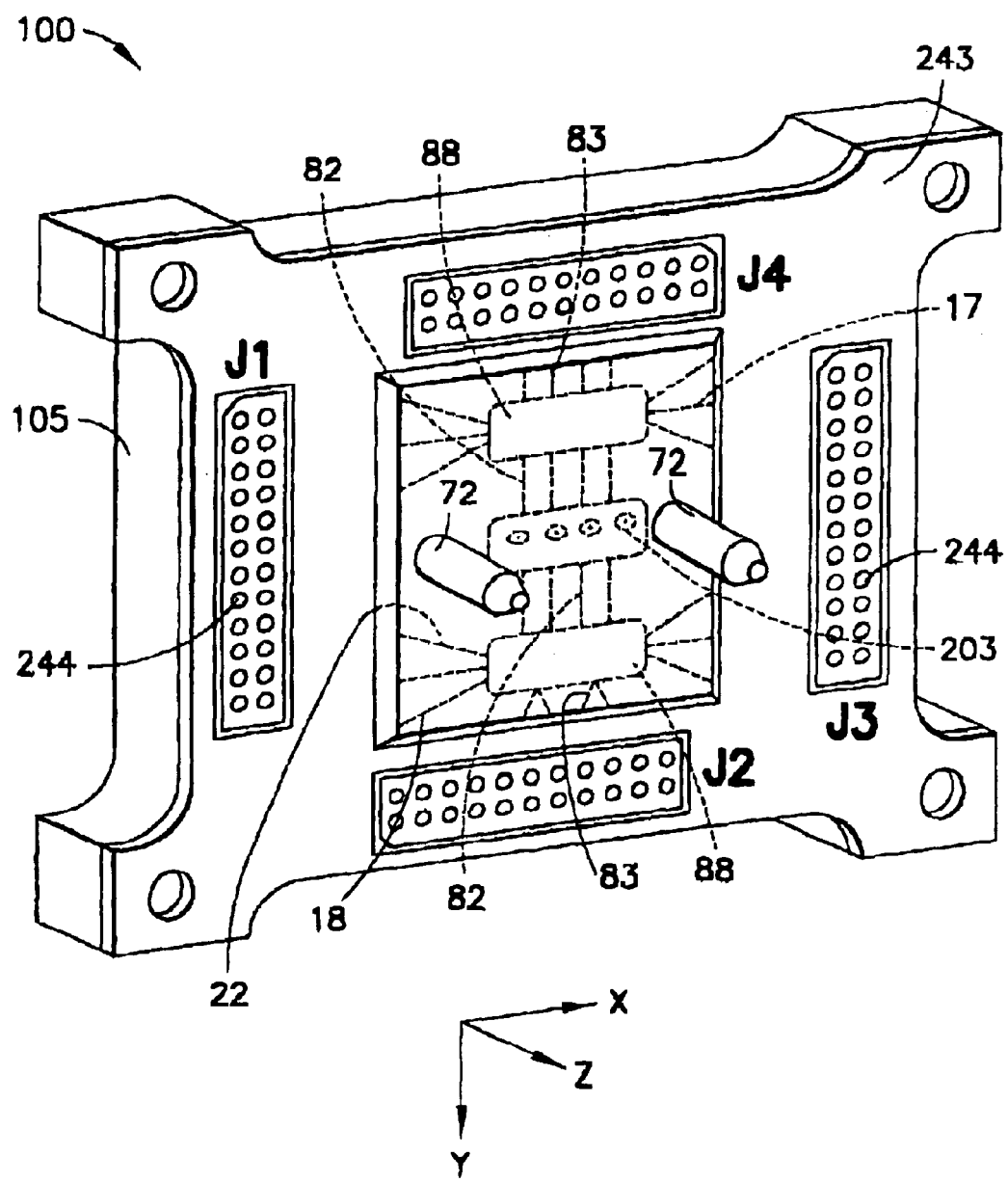
FIG. 1 is a front view of a small scale package for optoelectronic devices and integrated circuits with alignment members for mechanically aligning the optoelectronic devices to external optical receivers or transmitters.

As used herein, the following terms are defined as follows:

The "transparent insulating substrates" useful in the practice of the invention include those transparent, electrically insulating substrates on which may be formed silicon layers suitable for electronic circuitry as well as transparent, electrically insulating substrates such as glass that are well-suited to bonding to integrated circuit chips.

Integration of silicon and optoelectronic devices on a common insulating transparent substrate requires that an effective method for forming silicon CMOS devices on the transparent, insulating substrate be used. Examples of and methods for making such silicon-on-sapphire devices are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). "Ultrathin silicon-on-insulator" or "ultrathin SOI" refers to composite substrates comprising high quality thin films of silicon on single crystal transparent, insulating substrates, such as sapphire or spinel. "Ultrathin silicon-on-sapphire" or "UTSi" refers to composite substrates comprising high quality thin films of silicon on single crystal sapphire. These composite substrates are prepared and processed by the methods described in previously referenced U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555. Typically, the "ultrathin" silicon films are characterized by thickness less than approximately 270 nm and an areal density of electrically active states in regions not intentionally doped which is less than approximately $5 \times 10^{11}$ cm$^{-2}$. By the methods described in the patents listed above, electronic devices can be formed in an extremely thin layer of silicon on a transparent, insulating substrate, such as a synthetic sapphire wafer. This "ultrathin" silicon layer maximizes the advantages of the insulating substrate and allows the integration of multiple functions on a single chip. Traditional transistor isolation wells required for thick silicon are unnecessary, simplifying transistor processing and increasing circuit density.

The invention is applicable to transparent substrates in general. In the context of the optical/optoelectronic coupling structures, "transparent substrates" are substrate materials that, at the wavelength of interest, transmit sufficient light for signal transmission purposes. At the wavelengths used in many current fiber optic systems, e.g. in the range of about 850 nm, silicon is considered opaque. Sapphire is transparent at this wavelength, as are some other oxide materials such as spinel.

Preferred embodiments of the OE/IC packages of the invention employ optoelectronic devices integrated with controlling CMOS circuitry formed in silicon on transparent, insulating substrates to overcome the limitations of the previous approaches. A preferred method is described in U.S. patent application Ser. No. 09/658,259, "Integrated Electronic-Optoelectronic Devices," filed Sep. 8, 2000, the disclosure of which is hereby incorporated herein by reference. This application discloses a method to integrate high density, high speed CMOS devices, which are formed in thin layers of silicon grown on transparent, insulating substrates, with optoelectronic devices, using the technique of flip-chip bonding. For the controlling circuitry, the advantages of using a composite substrate comprising a thin monocrystalline silicon layer on a supporting insulating substrate (for example a crystalline oxide material such as sapphire or spinel) include the substantial reduction of parasitic capacitance between charged active regions and the substrate and the effective elimination of leakage currents flowing between adjacent active devices. These advantages are especially apparent for operation at high frequencies. Furthermore, sapphire is transparent to a very wide range of optical wavelengths and possesses excellent optical homogeneity; its coefficient of thermal expansion closely matches that of GaAs; and it is an excellent electrical insulator and a moderate thermal conductor. The substrate's transparency allows the integrated electronic/optoelectronic modules to be fabricated using the flip chip process without the need for wire bonds to each OE device.

Other transparent insulating substrates may alternatively be employed. Various glasses provide other examples of transparent, insulating substrates. Because glasses are not single crystalline substrates as is sapphire, the provision of a silicon layer on a glass substrate, where the silicon is suitable for high speed CMOS circuitry, is technically challenging. However, such silicon layers have been described previously (G. Liu et al., "Polycrystalline silicon thin film transistors on Corning 7059 glass substrates using short time, low-temperature processing," Appl. Phys. Lett. 62(20), May 17, 1993, pp. 2554–2556; G. Liu et al., "Selective area crystallization of amorphous silicon films by low-temperature rapid thermal annealing," Appl. Phys. Lett. 55(7), Aug. 14, 1989, pp. 660–662). Thin film silicon-on-glass is therefore an alternative technique for integrating silicon circuitry into optical-optoelectronic interfaces using a transparent insulating substrate.

Integrated electronic/optoelectronic modules, comprising optoelectronic devices and CMOS circuitry in ultrathin silicon-on-insulator, integrated by the flip-chip bonding methods disclosed in U.S. patent application Ser. No. 09/658,259, "Integrated Electronic-Optoelectronic Devices," filed Sep. 8, 2000, previously cited and incorporated by reference, are herein referred to as "flip-chip optoelectronic/ultrathin silicon-on-sapphire modules" or "flip-chip optoelectronic/silicon-on-insulator modules."

In an approach that is being used for RF circuits, integrated circuits formed in silicon, GaAs, or other suitable substrates are flip-chip bonded to glass substrates ("Advanced RF Packaging Using Passive Integration," D. Pedder, Micro Tech 2001 paper djp-0, 1, Jan. 2001; "Thin Film RF Module Design for High Volume Applications," M. J. Robinson et al., IEEE Colloq. "Packaging and interconnects at microwave and mm-wave frequencies," London, 26, Jun. 2000). In these RF devices, the glass substrate is used for the relatively large passive devices, especially inductors, that are to be integrated more closely with the active circuitry. However, in the practice of the present invention, the transparency of the glass substrate permits this flip-chip silicon IC on glass technique for to be used for integrating silicon circuitry into optical-optoelectronic interfaces.

"Glass substrates" employ any glass material capable of being fabricated as a high quality substrate, flat, smooth, and free of light-absorbing defects. High quality glass is relatively inexpensive and readily available, with conductive traces (e.g., indium tin oxide) already patterned thereon, due to its use in the flat panel display industry. Such flat panel display glasses are useful in the practice of the present invention. Techniques to mount one or more integrated circuit chips on a glass substrate are known and may be used to add functionality to the optical-optoelectronic interface structure.

"Optoelectronic devices" refers to devices that detect, emit, modulate, or manipulate light. Exemplary optoelectronic devices include but are not limited to lasers, light-emitting diodes, photodetectors, and light modulators.

"CMOS devices" refers to Complementary Metal Oxide Semiconductor devices such as MOSFETs which are fabricated in silicon. Silicon-based CMOS technology is capable of achieving an extremely high density of devices in consistently high yields.

"Conductive bonds" and "conductive contacts" refer to bonds between two different substrates formed by a region or metal, alloy or other electrically conductive material interposed directly between a surface of the first substrate and a surface of the second substrate. By comparison with wire bonds, conductive bonds contribute much less electrical parasitic effects which otherwise would limit high-speed operation in a system involving more than one substrate. The conductive bond material is selected to be suitable for the particular application. For small-scale systems involving only a few interconnections between substrates, conductive adhesives such as silver-epoxy may be employed. In larger scale applications involving more connections, flip-chip bonding is preferred. Materials for use in flip chip bonding can be selected according to criteria well known in the microelectronic fabrication art, (e.g., K. W. Goossen et al.,

*IEEE Photonics Technol. Lett.*, Vol. 5(7), pp. 776–778, 1994; more recently Pu et al., *J. Selected Topics Quantum Electronics*, Vol. 5, No. 2, pp. 201–207, 1999). The conductive bond or contact may or may not have adhesive or structural functions in addition to its current-carrying role.

"Bonding pads" as used herein refers to regions of conductive material formed in a predetermined pattern on the surface of an electronic or an optoelectronic device, in electrical communication with the device. The bonding pads are used to form conductive bonds, or they may serve as the pad to which a wire bond is attached. In some embodiments of the invention, the bonding pads may be used directly for a flip-chip bonding step, where they are placed in physical contact and exposed to heat and/or pressure, whereupon they fuse to form an electrically conductive physical bond. In other embodiments, the bonding pads may be provided with a "solder ball," a material selected to fuse upon exposure to heat and/or pressure to provide an electrically conductive physical bond between the two bonding pads.

The acronym "BGA" refers to "ball-grid-array," that is an array of approximately spherical electrically conductive bumps for forming electrical interconnection between the conductive traces on a printed circuit board and components mounted thereon. "CSP" refers to chip scale package; "OE" refers to optoelectronic device; "IC chip" refers to the integrated circuit chip bearing the electrical control circuitry for the OEs, whether they are on a separate OE chip or formed on the same IC chip.

"In registration" refers to optoelectronic device—optical fiber pairs or sets of such pairs that are sufficiently well-aligned to transmit an optical signal with low loss.

In current optical systems, arrays of optical fibers are typically mounted in housings or connecters that hold the fibers in precisely spaced-apart relationship to each other by means of various housing or mounting structures such as optical ferrules and V-groove substrates. "MT" (mechanically transferable) ferrules are standardized housings for arrays of optical fibers for use in MT connectors, within which the optical fibers are positioned with high precision in a spaced-apart arrangement and provided with a mechanical means of alignment with a second array of OE devices or fibers by means of guide holes and alignment or guide pins. It is very advantageous for an optical/optoelectronic coupling device to be able to connect in a simple fashion to MT or other standardized connectors, and thus to be capable of insertion into existing optical networks, and to precisely align the optical fiber cores with the optoelectronic devices.

"Mechanical alignment members" refers herein to mechanical structures such as guide pins or guide holes for passive alignment of a first structure by means of complementary mechanical alignment members in the second structure.

As used herein, the expressions "integrated circuit chip" and "CMOS chip" refer to a chip or electronic substrate bearing electrical circuitry that includes functions to control the optoelectronic device, and may include other functions needed to manage or amplify the optical signal transmission process. The "integrated circuit chip" is typically silicon, but may be selected from silicon, GaAs, SiGe, and the like. The electronic circuits in the silicon layer of a silicon integrated circuit chip are typically CMOS devices, though they may be of any form suited for the application. Especially preferred CMOS devices include VCSEL drivers, receiver circuits for photodetectors, and other signal/data processing, amplification, and switching circuits. Many such well known circuits are available to the integrated circuit designer and are selected for their suitability to the particular optical interface application.

IC/OE Packages

The inventive small scale integrated circuit/optoelectronic packaging structure and method are based on the use of a transparent insulating substrate as a central element. The transparent insulating substrate has electrically conductive traces and electrically circuitry such as drivers, signal processing circuits, etc., provided by means of (a) areas where a thin layer of silicon is formed, e.g., by the ultrathin silicon-on-sapphire or the thin-film-on glass techniques described above, in which electrical devices and circuits are formed; and/or (b) one or more integrated circuit chips attached to it by electrically conductive bonds, e.g., by flip chip bonding.

The invention will now be described in detail with reference to the figures. Similar numerals refer to similar structures within successive figures. The figures are generally illustrative and are not shown to scale or in actual proportion. Throughout the figures, x, y, and z axes are provided in a consistent orientation to show the direction from which the structure is being viewed. In general, x is defined as the direction along a line defining a 1×n array of optoelctronic devices; y is a direction perpendicular to that array, and z is a direction parallel to the mechanical alignment members and normal to the optical output surface.

In the practice of the invention, individual fibers or arrays of fibers may optically connect with an individual optoelectronic (OE) device or an array of OE devices in a one-fiber/one-OE-device relationship, or the fibers may be present as bundles of fibers where a plurality of fibers optically interface with one OE device. Thus the figures are generally illustrative and are not to be construed as limiting to a particular size or number of optical fibers.

FIG. 1 shows an embodiment of the invention, an IC/OE packaging system 100 which comprises OE and IC components packaged to provide electrical input/output, thermal management, an optical window, and precise passive or mechanical alignment to external optical receivers or transmitters (fibers, waveguides, CWDM module, free space, MEMS mirror, etc.). IC/OE packaging system 100 employs a transparent insulating substrate 17 with a first, interior optoelectronic surface (OE surface) 22 and an opposing, exterior optical output surface 18. In the descriptions that follow, the "OE surface" of an IC/OE packaging system is defined as the interior surface of the transparent insulating substrate to which one or more OE devices (203, shown as visible through the transparent substrate 17) are bonded in an orientation such that optical access to the OE devices is through the transparent substrate. The optical output surface serves as a window for the packaged devices. The preferred transparent insulating substrate materials—sapphire, glasses—are very well suited for this role.

Also present on the interior OE surface are electrical circuit devices 88 and connections 82 and 83, for signal and control functions such a VCSEL drivers, amplifiers for managing signals from photodetectors, etc. In the embodiment shown, electrical circuit devices on the interior surface 22 are formed in a thin silicon layer on surface 22 of the transparent insulating substrate. In alternative embodiments, electrical circuitry may separately or supplementally be located in separate IC chips flip-chip bonded to surface 22.

The interior OE surface 22 is provided with precision alignment features with respect to which all alignment steps are performed. The OE devices, the electrical features such as circuitry and especially bonding pads, and the passive mechanical alignment members, e.g., guide pins 72 (or in alternative embodiments, precision guide holes) are all aligned to the alignment features on the interior OE surface 22. Thus surface 22 may also be referred to as the "master alignment surface." The alignment features are preferably formed by the photolithographic processes that are used to form the electrical circuit devices and connections, and hence they are formed with the extremely high precision characteristic of such processes. Alignment to one set of alignment features on the same side of the substrate minimizes the accumulation of alignment variances and enables good through-substrate optical coupling between a packaged OE device and an external optical receiver or transmitter possessing complementary mechanical alignment members.

The "optical output surface" is defined herein as the exterior surface (18) of the transparent insulating substrate, (a) through which optical signals pass between the OE devices and external optical receivers or transmitters and (b) which presents two or more mechanical alignment members (here guide pins 72; in alternative embodiments the mechanical alignment members can be precision guide holes) for alignment to the external optical receivers or transmitters by means of complementary alignment members that the external optical receivers or transmitters possess.

The transparent insulating substrate serves interiorly as the base for mounting the OE devices, the locus of the electrical features, the locus of the alignment reference features for all alignment steps including the alignment of the OE devices and the mechanical alignment members for aligning external optical signal transmitters/receivers to the OE devices. The transparent insulating substrate serves exteriorly as the optical window for optical signal transmission to/from the OE devices and the surface to which the optical transmitter/receiver is butt-coupled or in close contact. All alignment functions and structures are located within the perimeter of the transparent insulating substrate. All alignment steps take place on the same substrate surface.

In preferred embodiments, the transparent insulating substrate comprises sapphire, because of its excellent hardness and mechanical strength, the ability to form high quality silicon CMOS devices on it, its optical properties, its thermal properties, its chemical resistance, and because it takes an excellent optical polish. Preferably the electrical circuitry comprises ultra-thin silicon-on-sapphire CMOS circuits. Preferred mechanical alignment members comprise guide pins or precision guide holes. Preferred alignment reference features comprise marks or electrical circuit features deposited on 22 during electrical circuit fabrication, e.g., by photolithographic processes, and hence are formed with the extremely high precision characteristic of such processes.

IC/OE packaging system 100 is "quasi-monolithic," that is, it is physically rugged and environmentally sealed for convenient handling. In preferred embodiments, the "optical window" 17 comprises sapphire, which is extremely hard and scratch resistant. The packaging system derives rigidity from a sturdy heat sink 105 (e.g., a "copper cap") which is attached to a support member 243, which typically comprises a printed circuit board-type structure. The transparent insulating substrate 17 is attached to the support member 243 by means of conductive bonds; 243 has an open area beneath 17 for optical access to the OE devices. The exemplary packaging system 100 is fully environmentally sealed by means of the adhesives that attach 17 to 243 and 243 to 105; further environmental protection is provided by interior fill materials.

IC/OE packaging system 100 provides advantageous thermal management by means of the heat sink or heat spreader 105, whose interior surface (not visible in FIG. 1) is contoured to approach closely to the electrical circuitry, which is spaced apart from the OE devices so that heat can be more efficiently transferred to the heat spreader than to the OE devices though substrate 17.

IC/OE packaging system 100 is highly versatile; a variety of OE components can be packaged along with a variety of electrical functions. The package provides highly precise passive mechanical alignment to any external optical signal transmitter or receiver possessing complementary mechanical alignment members. In preferred embodiments, the mechanical alignment members are chosen to be a standardized type such as guide pins for alignment to fiber optic connectors possessing complementary guide holes.

IC/OE packaging system 100 can be made with a consistent "form factor" (size, shape, and electrical inputs and outputs) for insertion into standard optical networks, yet it may provide a variety of different OE functions. The support member 243 of system 100 is referred to as an "interposer board" because it translates the small scale electrical features of the electrical circuitry on 22 to the larger physical scale of a typical printed circuit board or fiber optic connector. Electrical contact features 244 (e.g, solder bumps for BGA connections) provide connectivity for signal transmission, electrical power, etc.

The packaging system of the invention resulted from a rethinking of the details of efficiently coupling light between an optical source or receiver and an OE device, integrating high performance CMOS circuits, in concert with a motivation to design a structure that could be economically and yet precisely manufactured. The OE/IC package of the invention combines integrated circuit fabrication technology (e.g., photolithography) to create highly precise alignment features on the OE surface, positioned within an accuracy of fractions of a $\mu$m; IC packaging technology, because unlike typical optical/OE connectors, the invention's package (a) does not require 3-D assembly manipulations and (b) is designed to be of similar form factor to typical IC packages so it can take advantage of well-developed IC manufacturing and packaging technology; and optical connector technology, which has developed highly precise and rigorously standardized sets of alignment structures and schemes.

Optical Coupling

Figure 2A:
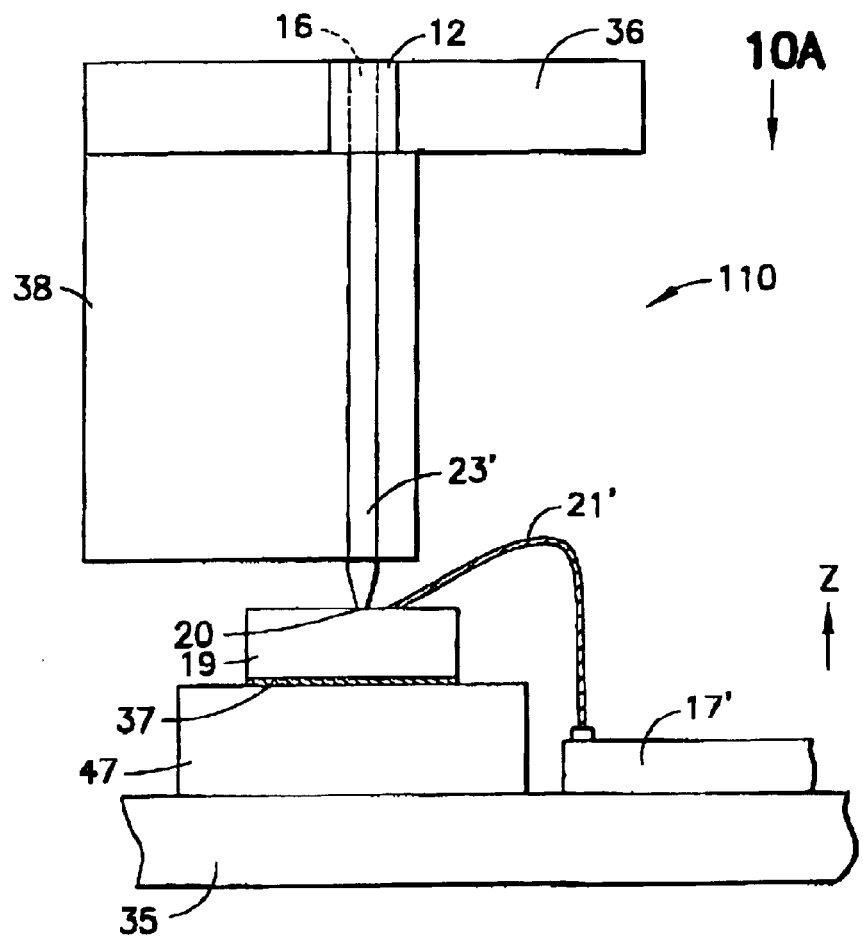
FIG. 2A is a schematic side-view representation of a prior art optical/optoelectronic interface provided for comparison with FIG. 2B, which is a schematic side-view representation of an optical/optoelectronic interface according to the present invention.

For comparison, FIG. 2A is a schematic side-view representation of a prior art optical/optoelectronic interface 110 (Rosenberg et al., "The PONI-1 Parallel-Optical Link," 49$^{th}$ Electronic Components and Technology Conference, San Diego, Calif. Jun. 1–4, 1999) between a VCSEL and an optical fiber. The optical fiber 12 is presented in ferrule 36. VCSEL 20 emits light in path 23' for transmission to optical fiber core 16. VCSEL 20 is mounted on carrier 47 which sits on base 35 (a flexible printed circuit in this case). Carrier 47 includes conductive pathway(s), to which the VCSEL's back electrical contact 37 make electrical connection. The VCSEL driver and other control circuitry are on silicon substrate 17'. The top electrical contact to VCSEL 20 is connected to the VCSEL driver via wire bond 21'. The presence of the wire bond makes it impossible to bring ferrule 36 with optical fiber 12 close to the VCSEL, creating the need for optical face plate 38, which transmits the light from the VCSEL to the fiber core 16 by means of a tightly packed fused microarray of small diameter optical fibers.

Figure 2B:
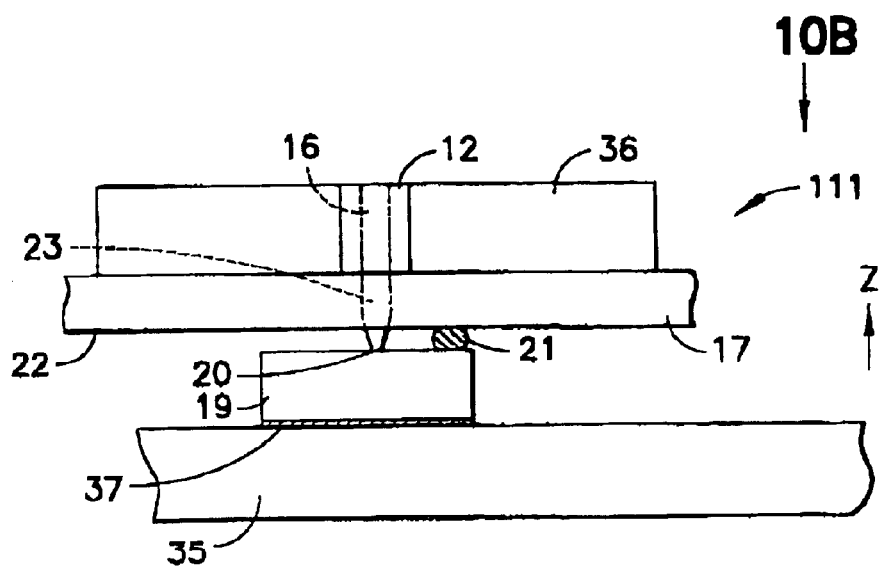
FIG. 2C is a schematic side-view drawing of an optical/optoelectronic interface of the present invention for coupling VCSEL light emission into a multi-mode optical fiber, with optional VCSEL-monitoring photodetectors shown.
FIG. 2D is a top view of an exemplary VCSEL-monitoring photodetector.

FIG. 2B is a schematic side-view representation of an optical/optoelectronic interface 111 according to the packaging system of the present invention. Again, the optical fiber 12 is presented in ferrule 36. VCSEL 20 emits light in path 23 for transmission to optical fiber core 16. VCSEL 20 is mounted on base 35 (a flexible or rigid printed circuit, multichip module, or the like). The VCSEL's back electrical contact 37 connects to electrically conductive pathways on the base 35. In contrast to the situation in FIG. 2A, the VCSEL driver and other control circuitry are in a thin silicon layer (not shown) on surface 22 of transparent substrate 17. The top electrical contact to VCSEL 20 is connected to the VCSEL driver via conductive bond 21, formed by flip-chipping or other suitable technique. Because light is transmitted on pathway 23 through the transparent substrate, the structure is conveniently configured to bring the ferrule 36 with optical fiber 12 very close to the VCSEL so that its emitted light may be efficiently transmitted to fiber core 16. The ability to transmit light through substrate 17 is very advantageous not only for efficient optical transmission but also for improved electrical performance, since the parasitics associated with the wire bond are avoided; physical robustness, since a fragile structure is avoided; and improved manufacturability.

The "fiber" employed in FIG. 2B may be any light transmitting fiber, such as standard glass optical fibers, plastic optical fibers, or bundled arrays of fibers, or may comprise a waveguide such as a molded plastic or glass waveguide. The advantageous configuration provided by the inventive coupling structure is advantageous for all optically interfacing to all possible fiber types. Furthermore, the fibers may be of the multimode or single mode type.

In preferred embodiments, the transparent insulating substrate comprises sapphire, whose hardness and scratch resistance are suitable for close contact with optical fibers. In the practice of the invention, it has surprisingly been found that very close contact or "butt-coupling" is possible without damaging the substrate or the optical fiber. This permits minimization of the distance between the optical fiber core and the active area of the OE device.

Optical-optoelectronic coupling structures as shown in FIG. 2B are made by methods that include the general steps of:

(1) providing a transparent, insulating substrate having substantially parallel top and bottom surfaces;

(2) forming a thin layer of silicon on at least part of the top surface of the transparent, insulating substrate;

(3) forming an electrical circuit in the silicon layer and alignment reference marks on the top surface;

(4) bonding an optoelectronic device to the top surface of the transparent, insulating substrate, in a precise spatial relationship to the reference marks, in electrical communication with the electrical circuit, and configured to allow light access to the optoelectronic device through the transparent, insulating substrate; and (5) providing mechanical alignment members on the top surface, in a precise spatial relationship to the reference marks, and (6) connecting an optical fiber on the bottom surface of the transparent, insulating substrate such that an optical path is described between the optoelectronic device and the optical fiber core through the transparent insulating substrate, by means of a complementary alignment member.

Figure 2C:
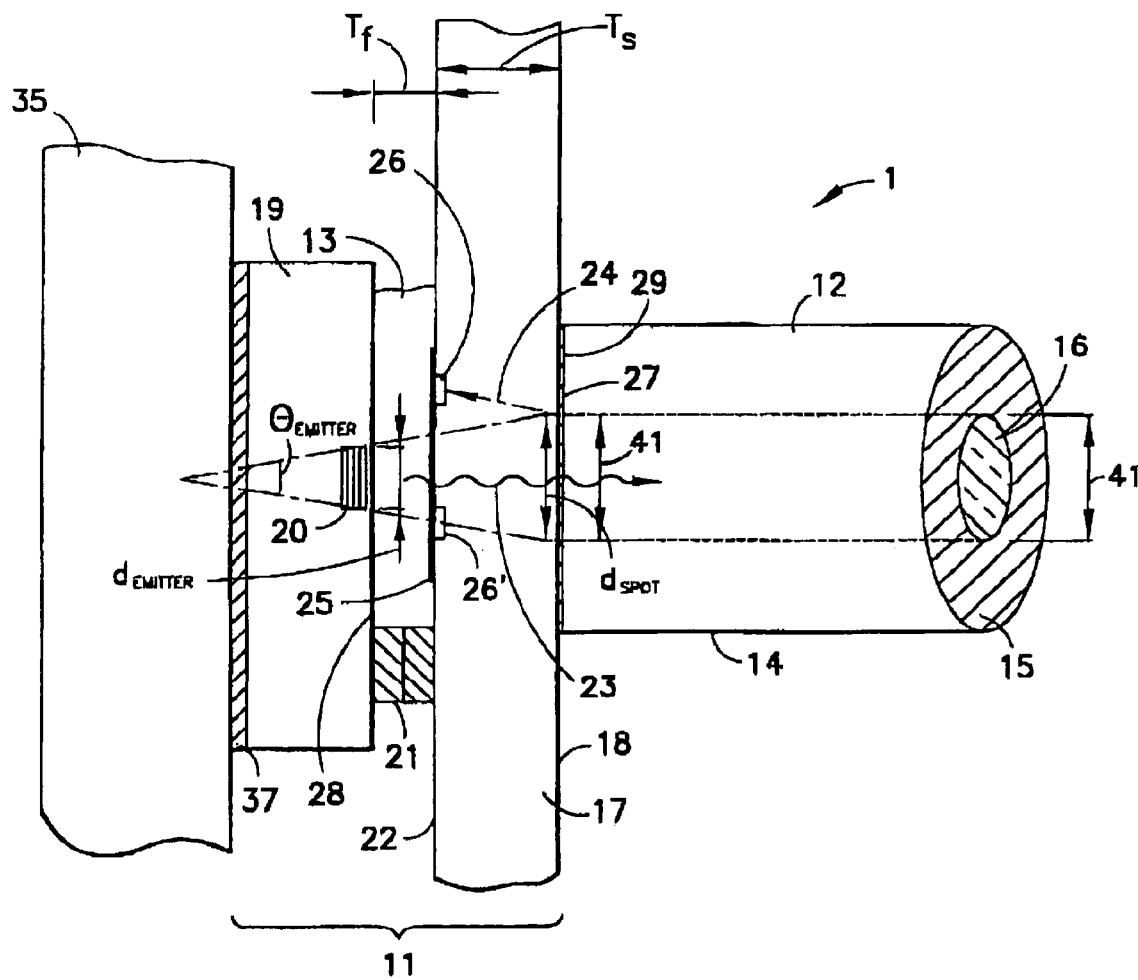

FIG. 2C is a schematic side-view representation of an optical/optoelectronic coupling structure 1 of the invention. The optoelectronic device employed in this coupling structure is a light-emitting device, in this case a vertical cavity surface emitting laser (VCSEL). The coupling structure comprises (a) an integrated electronic-optoelectronic module 11 and (b) an optical fiber 12 in optical communication with the optoelectronic device. In module 11, the optoelectronic substrate 19 is connected via a conductive bond 21 to the electronics substrate 17, which is a transparent substrate, e.g. sapphire, spinel, glass.

Referring to FIG. 2C, optical fiber 12 has optical core 16, cladding layer 15, and surface 14. The optical fiber is contacted end-on to the optical output surface 18 of a transparent insulating substrate 17. An antireflective coating 27 may optionally be provided on the surface of the transparent insulating substrate in the region of the contact with the optical fiber end. A region of the OE surface 22 of the transparent insulating substrate 17 bears a thin layer of silicon containing electrical circuitry (not shown). Such electrical circuitry is typically CMOS circuitry, but may be any type of electrical circuitry that is desired for the application in which the optical/optoelectronic coupling structure is used. The transparent insulating substrate is selected from, e.g., sapphire, spinel, glasses and the like. In preferred embodiments, the silicon layer and the electrical circuitry formed therein are ultrathin silicon-on-sapphire (UTSi) type as described earlier. The electrical circuitry includes functions to control the optoelectronic device, in this case a VCSEL driver, and may include other functions needed to manage the optical signal transmission process. The electrical circuitry is located in a region of surface 22 that does not interfere with light transmission into the optical fiber core, which has diameter 41.

Optoelectronic chip 19 has VCSEL 20 formed on top surface 28. Substrate 19 is an optoelectronic material, e.g. a III–V material such as GaAs. Conductive bond 21 forms an electrical connection between the electrical circuitry in the silicon layer on substrate 17 and conductive structures (not shown) on surface 28 of optoelectronic substrate 19, thus to provide an electrical connection between the silicon circuitry and the top side of VCSEL 20 The back contact 37 to a base is of standard type. The VCSEL 20 emits light in optical pathway 23 directed into optical fiber core 16. The space between optoelectronic substrate 19 and transparent insulating substrate 17 may optionally be filled with an optical underfill material 13. The region of surface 22 in the optical path 23 may optionally be provided with a light management coating 25.

The optoelectronic device or device array is flip-chip mounted on the transparent insulating substrate to form an integrated electronic-optoelectronic module. The OE device is mounted by means of electrically conductive bonds, formed by flip chip bonding or other similar techniques or comprising an electrically conductive adhesive, and is in electrical communication with the electrical circuitry by means of the electrically conductive traces. The optical pathway is through the regions of the IC chip that do not have silicon circuitry thereon, i.e. through the transparent insulating substrate. Light emitting devices such as VCSELS or LEDs emit light through the transparent substrate; light receiving devices such as photodetectors receive light through the transparent substrate.

The optoelectronic device or devices, e.g., VCSELs may have back electrical contacts, or alternatively, both electrical contacts may be formed to its top surface. Electrical circuits, e.g, a VCSEL driver, amplifier, and other control circuitry are formed on the integrated circuit chip. Such electrical circuitry is typically CMOS circuitry, but may be any type of electrical circuitry that is desired for the application in which the optical/optoelectronic coupling structure is used. The electrical circuitry includes functions to control the optoelectronic devices, e.g. VCSEL drivers, and may include other functions needed to manage the optical signal transmission process. E.g., the top electrical contact to each VCSEL is connected to the VCSEL driver via a conductive bond, formed by flip-chip bonding or other suitable technique, and conductive traces, formed from a conductive material, e.g., aluminum, copper, or other metals or alloys, on the transparent substrate.

There are a number of techniques available to the practitioner to position and flip-chip bond the OE to the IC chip with high accuracy. In one embodiment, the optoelectronic device or device array is attached to a surface of the transparent insulating substrate in a precisely defined positional relationship to features on that surface of the transparent insulating substrate, such as electrical traces or registration marks. In another embodiment, the optoelectronic device or device array is attached to a surface of the transparent insulating substrate in a precisely defined positional relationship to the guide holes in the transparent insulating substrate, wherein the guide holes have been formed in a precisely defined positional relationship to features on that surface of the transparent insulating substrate, such as electrical traces or registration marks.

It has previously been thought that optical coupling between an optoelectronic device and an optical waveguide would need to be optimized by including a lens in the optical path. For example, U.S. Pat. No. 6,243,508 proposes lens designs to increase the tolerance to misalignment between optoelectronic device and optical waveguide, but does not propose a lens-less design or an operating range for which a lens is unnecessary. However, the inclusion of lenses brings disadvantages as well, such as adding signification cost to the overall module. The lens costs include processing and yield loss due to misalignment or misprocessing of the lenses. When the lenses are processed at the wafer scale, errors in processing or alignment can spoil an entire processed wafer of integrated circuitry.

If the optoelectronic device is a laser, reflection of light output from the laser back into the laser cavity can cause undesirable fluctuations in the optical output power of the emitter. If too much power is coupled back into the laser from the reflection from the end of the optical fiber, instabilities occur in the laser and the output power oscillates up and down, causing extra and damaging amounts of jitter as the received signal pulses. The aperture (which defines the area in which light exits the laser cavity) of a typical VCSEL device is less than 15 microns in diameter. Unfortunately, an optical lens can perform efficient coupling of back-reflected light into the laser cavity by focusing light to small area on the laser aperture. This problem has been recognized; e.g., U.S. Pat. No. 6,349,159 ("Lenses that launch high bandwidth modes into a fiber optic cable while eliminating feedback to a laser") describes a lens designed such that light reflected from the end of the optical filter is not focused at a location at which the light is emitted by the laser One reason that lenses have previously been considered necessary is the difficulty in simulating multi-mode emitter optical characteristics. Typical multimode devices emit light consisting of hundreds of transverse modes. These modes also change with time constants smaller than the signal, rendering accurate simulation of these characteristics virtually impossible.

It is a significant advantage of the IC/OE package of the present invention that it provides good through-substrate optical coupling between optical fibers and flip-chipped OE devices.

FIG. 2C shows the optical path for coupling light from a light emitter to the optical core of a multi-mode optical fiber (MMF). The light output of the emitter diverges in pattern that can be approximated by a cone. The "divergence angle" $\theta_{emitter}$ of an emitter as described here measures the full angle which confines 86% of the light energy exiting the emitter. Emitter devices can be designed to produce a certain divergence angle. For example, a typical multimode oxide-confined VCSEL emitting at a wavelength of 850 nm typically has a divergence angle of less than 32 degrees for light propagating in a medium with a refractive index near unity (such as air). The divergence angle of light propagating in a material having a refractive index greater than unity is reduced and can be calculated using Snell's Law, i.e., the ratio of refractive indices in two materials is inversely equal to the ratio of the sine of their angles of propagation. For example, light from a VCSEL with a divergence angle of 32 degrees diverges at 18 degrees in sapphire which has a higher refractive index of 1.8.

In the arrangement of FIG. 2C, the light exiting the emitter 20 first propagates in underfill medium 13 for a short distance $T_f$ before entering the transparent, insulating substrate 17. The propagation distance is determined by the height of the conductive bonds 21 attaching the emitter to the transparent insulating substrate. After propagating through the transparent insulating substrate the spot size (defined as the diameter required to confine 86% of the light energy) can be approximated by $$d_{spot}=2*T_s*\tan(\theta_{emitter}/2)+d_{emitter}$$

where $T_s$ is the thickness of the transparent, insulating substrate, $\theta_{emitter}$ is the emitter divergence angle within the transparent, insulating substrate and $d_{emitter}$ is the spot size of the light as it exits the emitter. This approximation holds if the height of the conductive bonds 21 is much smaller (less than about 25%) of the thickness $T_s$ of the transparent, insulating substrate.

To optimize coupling, it is desirable to use low-profile bonds for the flip-chip bonds 21. Preferred bonds include metallic bump bonds such as gold-gold bump bonds. Such bonds can be fabricated in a range of bond heights. The bonds are preferably less than 25 µm in height and more preferably less than about 20 µm, by comparison with solder ball bonds, which have bond heights in the range of from about 50 µm to about 150 µm. The solder ball bonds have been commonly selected is (e.g., see U.S. Pat. No. 6,243,508) for their other desirable properties. The present invention takes advantage of lower profile bonds as part of the design that gives efficient lens-less optical coupling.

Coupling efficiency of the emitter to the fiber core is determined by three conditions: 1) the diameter of the spot size $d_{spot}$ is approximate equal or less than the diameter (41) of the fiber core; 2) a large percentage of the emitter light is diverging within a cone angle lower than that defined by the numerical aperture of the fiber; and 3) the VCSEL is aligned to the fiber core within close tolerances. When these three conditions are met, no lens is required to aid in coupling of the emitter to the fiber core.

Consider an example for coupling a VCSEL having a maximum divergence angle of 32 degrees to a MMF having a core diameter of 62.5 microns and a numerical aperture of 0.275. Assume a spot size of 10 microns as the light exits the VCSEL. For a transparent, insulating substrate of sapphire and thickness of less than 166 microns, the spot size at the fiber is smaller than the fiber core.

In a system where the distance from the light emitter to the substrate is short relative to the substrate thickness, for through-substrate coupling of the light emitter to an optical fiber having an optical core diameter of $d_{core}$, wherein: the light emitter is characterized by a divergence angle $\theta_{emitter}$; $d_{emitter}$ is the diameter of the spot size of the emitted light as it exits the light emitter; and $T_s$ is the thickness of the transparent insulating substrate; $T_s$ is preferably selected so that:

$$T_s \leq (d_{core} - d_{emitter})/2\alpha\tan(\theta_{emitter}/2).$$

where α is an overlap constant, defining the desired ratio of the fiber core diameter to the beam diameter entering the fiber. For α=1, the beam diameter is equal to the fiber core diameter. For typical applications, it is preferred that $0.5 \leq \alpha \leq 1.5$.

For light propagating from a MMF core to the active region of a photodetector, the light exiting the fiber core has a divergence angle determined by the spatial modes with the core, typically less than 20 degrees, and has a spot size less than 50 microns as the light exits the fiber.

In a system where the distance from the photodetector to the substrate is short relative to the substrate thickness, for through-substrate coupling of the photodetector to an optical fiber having an optical core diameter of $d_{core}$, wherein: the fiber is characterized by a divergence angle $\theta_{fiber}$ in the substrate material; $d_{detector}$ is the diameter of the active area of the photodetector; and $T_s$ is the thickness of the transparent insulating substrate; $T_s$ is preferably selected so that:

$$T_s \leq (d_{detector} - d_{core})/2\alpha\tan(\theta_{fiber}/2)$$

Here α defines the desired ratio of the PIN active area diameter to the beam diameter entering the detector. For typical applications, it is preferred that $0.5 \leq \alpha \leq 1.5$.

Sapphire is a preferred substrate; its strength enables its use at relatively thin thicknesses; it does not seem to have been previously appreciated that its thickness can be selected in a range that permits lens-less through-substrate coupling.

In standard optical connectors, the optical fiber end surfaces are polished to high smoothness and may extend for a small distance beyond the ferrule housing. End surface 29 of optical fiber 12 is extremely flat and smooth, and the sapphire optical output surface 18 is polished to a high level of smoothness and flatness. The flatness of these surfaces typically varies less than λ/4 per cm². Smoothness of the sapphire substrate, measured by the "scratch and dig" specification, is better than 10–5. Nonetheless, optional coatings may be included at the interface to control and standardize light transmission and reflection at their interface. The optional coating 27 is selected for management of light transmission and reflection at the interface between the fiber end surface 29 and surface 18 of the transparent insulating substrate 17. The area of concern is the approximately circular area that corresponds to the optical fiber core, defined by diameter 41, which for some commonly used fiber types, may be approximately 50 μm or 62 μm. An optional coating 27 will be applied to at least this area and optionally more broadly.

In some applications, it may be required to attenuate the optical output of the emitters. For example, to maximize performance of VCSEL devices, they are operated at higher intensity than typically desired. VCSELs operated at low intensity require a longer time to change between two states of optical output power, i.e. the two states of optical power representing the signal being transmitted through the fiber communication system. To maximize the amount of data transmitted through the fiber communication system, the VCSEL should change states rapidly. The VCSEL also requires operation at a higher intensity to avoid relaxation oscillation as the optical output transitions between states. Relaxation oscillation causes undesirable fluctuations in optical power adding noise to the communication system.

Thus the VCSEL device performance is optimized at certain optical output power. However, eye-safety standards (such as those issued by the Center for Devices and Radiological Heath within the U.S. Dept of Health and Human Services) limit the amount of light that can be coupled into the fiber. These conflicting requirements require attenuation of the optical output of VCSEL devices. An optional attenuation coating may comprise a thin film, typically less than about 50 μm in thickness, of absorbing material between the fiber core and the transparent, insulating substrate. Many types of films are available for this purpose; examples include polyimides, poly ether ethyl ketones, and polyetherimides. These films can be loaded with absorbing/scattering materials such as carbon or ceramic to form an absorbing layer.

For reflection management, coating 27 may be formed from materials such as $SiO_2$ which is advantageous because formation of $SiO_2$ layers is part of standard processing conditions. In some embodiments, the coating is a so-called "quarter-lambda" coating, that is, a coating whose refractive index is the geometric mean of the refractive indices of the sapphire substrate (η=1.76) and the optical fiber core. Glasses used in optical fibers include, for example, BK7 borosilicate crown glass, which is composed mainly of $SiO_2$, $Ba_2O_3$, $Na_2O$, and $K_2O$, and has refractive index $\eta_D^{23}$=1.5164; quartz ($SiO_2$) has refractive index $\eta_D^{23} \cong 1.46$; $KZF_2$ glass, antimony flint glass composed mainly of $SiO_2$, $Ba_2O_3$, $Na_2O$, and $Sb_2O_3$, has refractive index $\eta_D^{23}$=1.5294. In the case of a system operating at λ=850 nm, when the interface is between a sapphire substrate and quartz optical fiber, a useful antireflection coating may have thickness 144.5 nm and refractive index approximately $\eta = \sqrt{1.46*1.76} = 1.60$.

An optional coating 25 may be selected for management of light reflection at the interface between OE surface 22 of the transparent insulating substrate 17 and optional fill material 13 or air. In some embodiments, the coating is a so-called "quarter-lambda" coating, that is, a coating whose refractive index is the geometric mean of the refractive indices of the sapphire substrate (η=1.76) and the substance it is in contact with—air or fill material 13. For example, in the case of a system operating at λ=850 nm, when the interface is between a sapphire substrate and air, a useful antireflection coating may have thickness 144.5 nm and refractive index $\eta = \sqrt{1*1.76} = 1.32$.

The optional optical underfill material 13 may be a gel, fluid, or solid with a refractive index close to that of sapphire to reduce refractive-index discontinuities that can cause reflective loss. Material 13 is selected to have properties suitable for use in the optical connector, such as low optical loss; good stability over the range of temperatures in which that the connector will be used; chemical stability; low out-gassing and volatility characteristics; and absence of light-absorbing microscopic particulates. Other desirable properties may in some circumstances include high adhesive strength and flexibility. Underfill materials well-suited to optical applications are well-known to the practitioner and may be selected, based on chemical, physical and optical properties, from various well-characterized polymeric materials such as epoxies, acrylates, polyphenylene oxides, polyphenylene sulfides, and the like, and mixtures and copolymers thereof, curable in situ by any appropriate means. On the other hand, optical gels or fluids allow pliable mechanical connections between rigid parts; some advantageous materials are viscoelastic and can take up the differential thermal expansion of precision optical parts without inducing excessive stresses or delamination. In some applications photo-stability, that is stability upon x-ray, ultraviolet, or sunlight exposure (non-yellowing), is important. Many index-matching materials such as optical coupling fluids tailored for use in optical communication systems are commercially available (for example, Nye Optical Products, Fairhaven, Mass., provides many materials suitable for this application). Optical gels, which are polymer formulations having a range of refractive index attainable and are designed to serve as a "bridge" for light signals, are especially useful.

The optical underfill may perform several functions. Preferably the optical underfill closely matches the refractive index of the top surface of the OE device to minimize optical reflection back into the OE device. Typical ranges for this optical index is 1.3 to 1.8. The underfill material needs to have a high spectral transmission of 96% or better in the range of the VCSEL wavelength; for example, for an 850 nm VCSEL spectral transmission is preferably ≧96% in 800 to 900 nm wavelength range. The optical underfill material also forms an environmental seal to protect against moisture and particle contamination between the active regions of the OE devices and the passivation layer on the sapphire surface. Moisture absorption by the optical underfill material is preferably less than 0.01% after 24 hours of immersion in water at 23° C. The optical underfill may also serve as an electrical insulator for flip-chipped OE devise contacts. High speed VCSELs have both positive and negative contacts on a 125 $\mu$m pitch on the front sides of the devices, and will short out over time if not electrically isolated. The optical underfill material will preferably have volume resistivity greater than $10^{13}$ ohm-cm to maintain electrical isolation. The underfill material adds mechanical strength for the attachment of the OE devices. VCSELs and photodetectors are made from very brittle materials such as GaAs and are easy to damage during assembly. The optical underfill material preferably has good adhesive strength with typical die shear strengths over 2,000 psi. Integrated circuit packages can be subjected to temperatures as high as 260° C. for several minutes during assembly processes, and therefore the optical underfill should not thermally degrade at temperatures less than about 300° C., and outgassing should be less than 1% at 250° C. A preferred optical underfill material has the following properties: index of refraction 1.556; spectral transmission of >96% at 375 nm to 900 nm; water absorption of 0.075%; volume resistivity of $10^{14}$ ohm-cm; die shear strength of 2,400 psi; thermal degradation temperature of 342° C.; outgassing of 0.77% at 250° C. meeting NASA outgassing requirements for space flight programs.

The electrical circuitry on surface 22 may optionally be provided with a photodetector 26 positioned to sample light reflected, e.g. on path 24, from the interface between the optical fiber end and the bottom surface 18 of the transparent insulating substrate. Alternatively, the electrical circuitry on surface 22 may optionally be provided with a photodetector 26' positioned to sample light from path 23 between the VCSEL and the fiber core. The photodetector 26 or 26' provides a signal that can be processed by the electrical circuitry for feedback control of the VCSEL driver to ensure that arrays of VCSELs emit light of the same intensity despite differences that may be inherent as a result of variations in the VCSEL production process or that may result from differential aging or temperature effects. Such photodetectors suitable for use in the optical/optoelectronic coupling structure are preferably capable of being fabricated in silicon-on-insulator and must be of appropriate size and sensitivity.

Figure 2D:
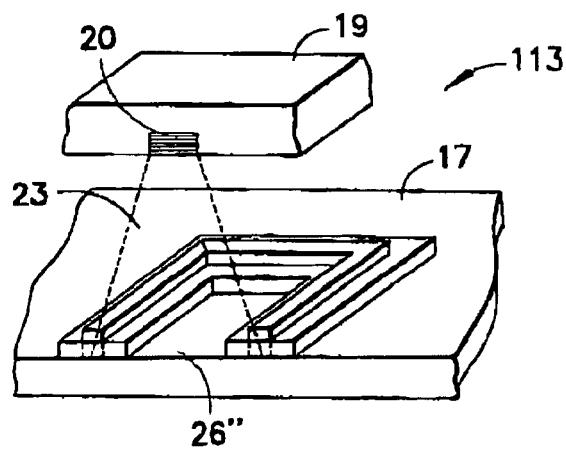

Examples of photodetectors suitable for integrated control of a VCSEL and control systems are described in detail in applicant's copending patent application U.S. Appln. No. 60/300,129, the contents of which were incorporated by reference. Such a photodetector comprises a dynamic threshold MOS (DTMOS) transistor formed in ultrathin silicon-on-sapphire. The DTMOS photodetector lends itself to fabrication in a novel toroidal layout, such as shown in FIG. 2D, a close-up schematic top view of an optional photodetector 26" that samples a small amount of light from around the edge of light beam 23 emitted by the VCSEL 20. For simplicity, the optical fiber and the conductive bonds and bases for VCSEL substrate 19 and transparent substrate 17 are omitted from this close-up view.

If the VCSEL is of the type that requires two top electrical contacts, the contacts are provided by conductive bonds 21 and layer 37 represents a thermally conductive bond to support base 35. If the VCSEL requires a top contact and a back contact, layer 37 represents an electrically and thermally conductive bond to electrically conductive areas on support base 35.

FIGS. 2B–2D show a schematic detail of one fiber interfacing with one optoelectronic device, but it will be appreciated that an m×n array of optoelectronic devices may interface with an m×n array of optical fibers by means of such structures. Currently, the arrays are often 1×12 arrays, but 2×24 arrays are available, and the size of the m×n arrays is expected to grow significantly as optical networks increase in size and complexity. It is an advantage of the present invention that the coupling structures are readily manufactured in array form. Furthermore, while the coupling structure was illustrated primarily using a VCSEL as exemplary OE device, it will be readily appreciated that other OE devices such as modulators and photodetectors may be employed.

Figure 3:
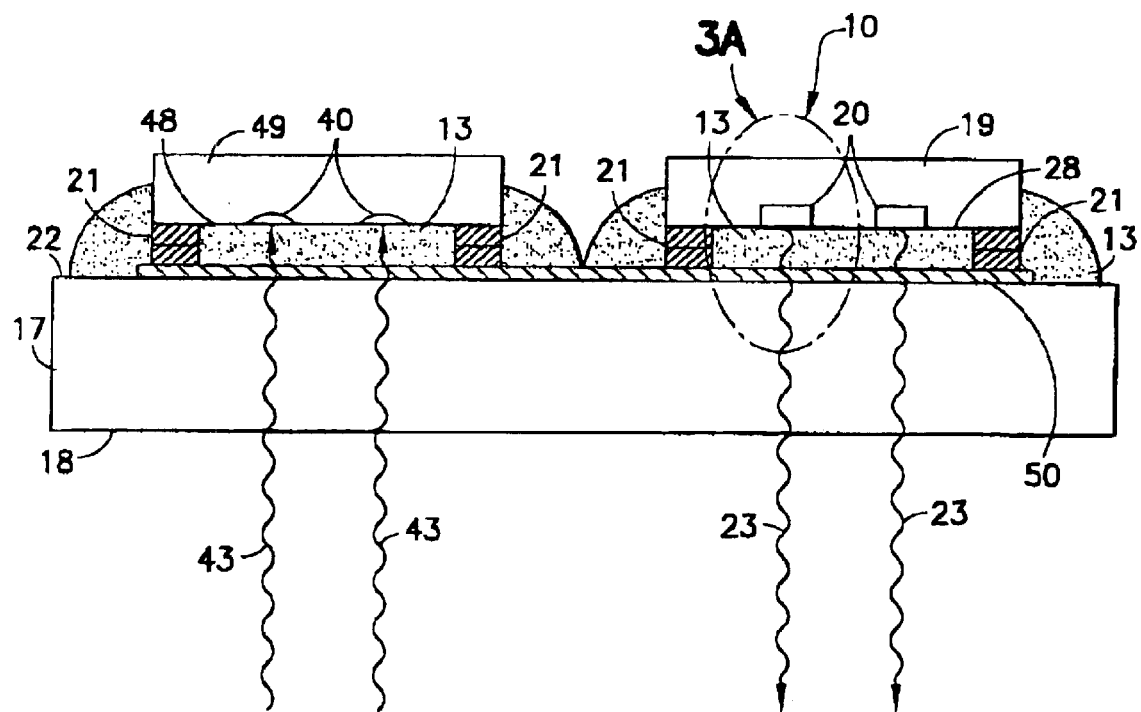
FIG. 3 is a schematic diagram showing optoelectronic device dies flip-chip bonded to a transparent insulating substrate to form a light transceiver. Inset
Figure 3A:
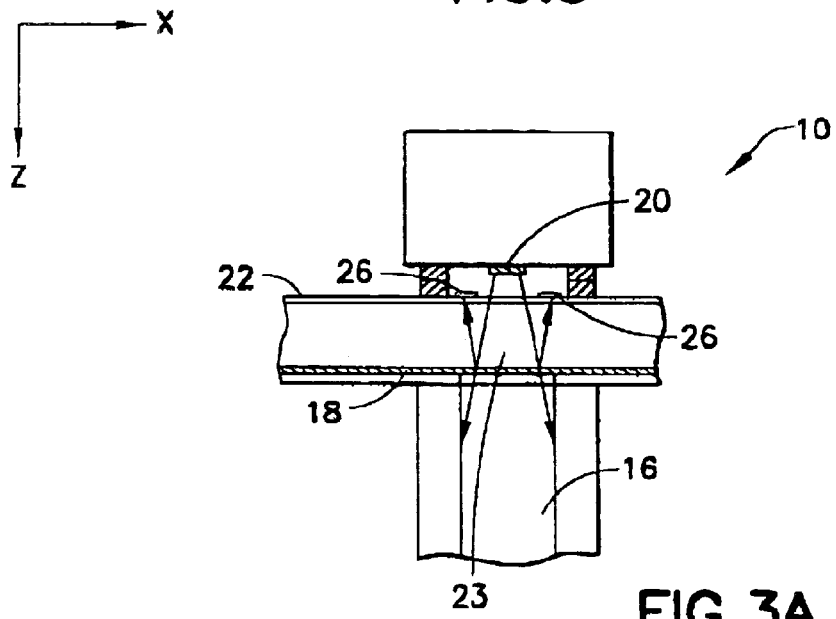
FIG. 3A shows a close view of one flip-chipped VCSEL emitting light directly into one optical fiber core and by reflection onto two monitoring photodetectors.

FIG. 3 shows a schematic of an electronic/optoelectronic flipped-chip ultrathin silicon on sapphire ("FOCUTS") structure as disclosed in U.S. patent application Ser. No. 09/658,259, filed Sep. 8, 2000, "Integrated Electronic/Optoelectronic Devices, and Method of Making the Same," for incorporation into the package of the present invention. Integrated structure 10 is a transceiver comprising a transparent insulating substrate 17 having a first OE surface 22 and a second optical output surface 18. Upon OE surface 22, areas of a device-quality silicon thin film 50 are present, within which electronic circuits are formed (detail not shown). By means of conductive bonds 21, the top surface 48 of OE chip 49, which bears photodetectors 40, and the top surface 28 of OE chip 19 which bears VCSELs 20, are flip-chip bonded the OE surface 22 of transparent insulating substrate 17. Flip chip bonding forms the conductive bond 21 to bonding pads on the respective die surfaces; the bonding pads are in electrical contact with the circuitry and devices on each die (for simplicity this detail is not shown). Preferably, the bonds 21 are low profile bump bonds. An underfill material 13 is optionally provided to protect the sensitive optotelectronic devices from environmental degradation, as described in detail above. Photodetectors 40 receive an optical signal 43; VCSELs 20 emit an optical signal 23, allowing 10 to function as a transceiver.

The inset detail 10a shows more closely a VCSEL 20, illustrating good coupling of VCSEL emitted light 23 into optical fiber core 16. Some light reflects back from the optical output surface 18. If desired, a reflective coating can be present on selected areas of 18 to enhance reflection. Photodetectors 26 are positioned to sample this light, and can provide feedback control to the VCSEL driver circuit in the silicon layer on surface 22

An element of the IC/OE package of the invention is an optical connector, wherein an integrated electronic-optoelectronic module is mounted on a stage or supporting member that also supports related electronics and electrical interconnections. The stage may be a flexible or rigid printed circuit board, a multichip module, or any support material that provides electrical connection between the integrated electronic-optoelectronic module and other functions such as input/output to an optical network.

Packaging Aspects and Thermal Management

Figure 4A:
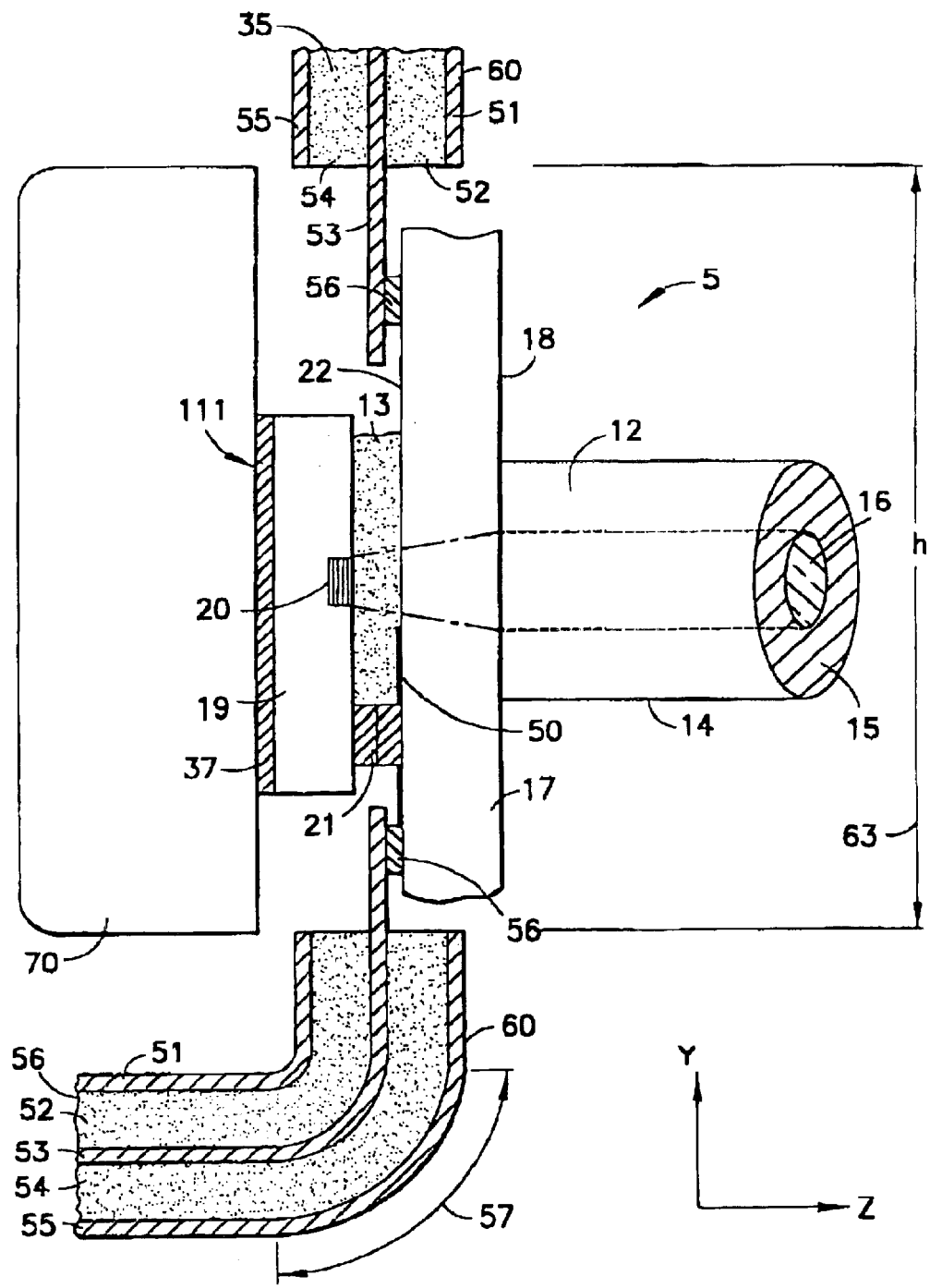
FIG. 4A is a schematic side-view representation of an optical connector comprising an optical/optoelectronic coupling structure mounted on a printed circuit board.

FIG. 4A shows a schematic side-view representation of an example of an optical connector 5 comprising (a) an integrated electronic-optoelectronic module 111 which is mounted on a printed circuit board 35 with facing surface 60 and which includes an optoelectronic device 20; and (b) an optical fiber 12 having optical core 16 which is optically coupled to the optoelectronic device 20. The integrated optoelectronic module 111 and its connection to optical fiber 12 are as described for FIGS. 2B, 2C and 2, with inclusion of any of the optional features such as antireflective coatings, fills, and photodetectors possible. While FIG. 4A shows a connector employing an optoelectronic device which is a light emitting device, it will be readily apparent that analogous connectors may be built wherein the optoelectronic device is a photodetector, light modulator, etc.

Referring to FIG. 4A, flexible printed circuit board 35 comprises electrically conductive layers 51, 53 and 55 separated by insulating layers 52 and 54 respectively. The number of layers may vary, and many different materials may be used to construct these electrically conductive layers; in many printed circuit boards they are copper. The insulating layers likewise can be made from many different materials; in many printed circuit boards they are formed from a polyimide. In this example, the board is of the flexible type, and can include a bend such as shown at 57, to allow the optical connector conveniently to fit into an optical network. An opening of height h (63) and width w (not shown) is made in the printed circuit board. Middle conductive layer 53, which is electrically connected to other functions in and devices attached to the printed circuit board, extends into this opening from the top and bottom optionally backed by an insulating support member (not shown). OE surface 22 of insulating substrate 17 is connected to layer 53 by means of one or more conductive bonds 56. The electrical circuitry in the thin silicon layer 50 is in electrical communication with layer 53 by means of these conductive bonds. Other functions are readily provided on the printed circuit board, for example, another chip whose function is to serve as an interface with the network system can be bonded to the printed circuit board. By varying this chip, a standard optical connector can communicate with networks of many different formats. A heat sink 70 is provided which may be in thermal contact with the OE devices by thermally conductive adhesive or through a back electrical contact 37, if the devices use a back contact.

Figure 4B:
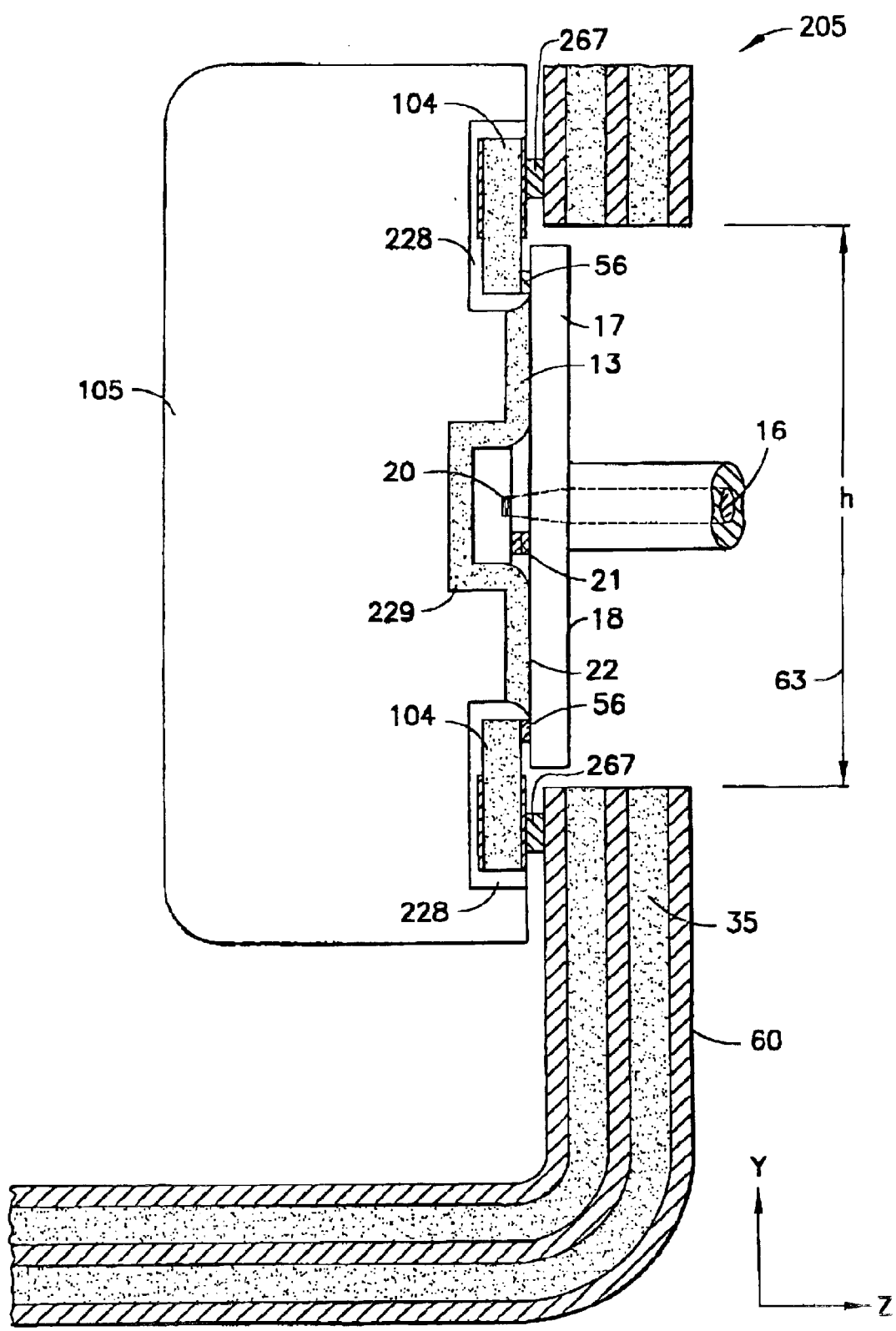
FIG. 4B is schematic side-view representation of an optical connector comprising an optical/optoelectronic coupling structure mounted on an "interposer" board, which is itself mounted on a printed circuit board.

FIG. 4B shows another embodiment 205 of the OE/optical interface, in a cutaway cross-section. In this embodiment, the transparent substrate 17 is mounted on an "interposer board" (104), which herein refers to a support member that provides physical support and electrical connection between the integrated flip-chipped electronic-optoelectronic module and other functions such as input/output to an optical network, and which is sized to provide a scaling in size from the IC-scale of the OE and electrical devices to a larger, printed-circuit BGA scale suitable for incorporation into optical networks. There is an open area formed in interposer board 104 of height h (63) and width w perpendicular to the plane of the drawing. Transparent substrate 17 is mounted over the opening by means of conductive bonds 56 to OE surface 22 of 17. The interposer board may be mounted on (and in electrical contact with electrical traces on) a second support, e.g., flexible printed circuit board 35, similar to the flexible support member of FIG. 4A, which provides added functionality and a different physical size and form for a selected application. A heat sink 105 is provided, which is in thermal contact by way of back electrical contacts to the OE devices, or through a thermally conductive adhesive 229, which can be the same as or different from optical underfill material 13.

The use of an interposer board for immediate mounting of the transparent insulating substrate is advantageous for a number of reasons. The OE devices can be flip-chipped to the transparent substrate; bonded to the interposer board; the interposer board adhesively attached to a backing heat sink; and this subassembly can be environmentally sealed to provide a rugged and versatile subassembly for mounting in a variety of applications characterized by different geometries.

Optoelectronic devices, lasers in particular, are sensitive to temperature variations. Various optical properties will change with temperature; for example, the optical wavelength, the output intensity, and the angle of beam divergence all vary with temperature. Most commercial VCSELs cease emitting light at temperatures above 110° C., which is just 20° C. higher than many telecom requirements. Therefore it is desirable to provide an efficient thermal relief path for the OE devices and minimize the thermal exposure to other heat producing components in the system, such as active circuitry. The thermally conductive adhesive 229 which bonds the heat sink 105 to the interposer board 104 is selected to have good thermal conductivity to move heat away from the areas that generate heat—the active CMOS circuitry and the OE devices. The thermal adhesive must also absorb the mismatch of thermal expansion coefficients of the various components; preferred thermal adhesives are slightly flexible after curing and have low ionic impurities but not as low as typically required by the optical underfill.

Preferred thermally conductive adhesives will have the following properties: thermal conductivity>3 W/m-° C.; glass transition temperature Tg>80° C.; volume resistivity>$10^{13}$ ohm-cm; ionic impurities Cl<50 ppm, Na<25 ppm, K<10 ppm; die shear>3,000 psi; CTE<60 ppm; degradation temperature>300° C. Especially preferred thermally conductive adhesives will have the following properties: thermal conductivity$\geq$4 W/m-° C.; Tg$\geq$90° C.; volume resistivity$\geq$$10^{14}$ ohm-cm.; ionic impurities Cl$\leq$20 ppm, Na$\leq$10 ppm, K$\leq$10 ppm; die shear strength$\geq$4,000 psi; CTE$\leq$55 ppm; degradation temperature$\geq$340° C. Optical underfill 13, any flip chip underfill, the thermal adhesive, and any other fills or adhesives must all be rated for use from −55° C. to +125° C.

The OE/IC packages of the invention are preferably characterized by having a thermal gradient of no more than 10° C. from the back of the heat sink to the base of the OE devices and the active CMOS circuitry. Most of the heat generated in the package is generated by the CMOS circuitry. For current devices, typical power dissipation of the drive circuitry for a VCSEL is 100 mW/channel and for the VCSEL device power is 10 mW. The power dissipation of the amplifier circuitry for a photodetector is 35 mW/channel and the photodetector device power is 5 mW. Therefore, the package layout positions the OE devices much closer to the heat sink than to the active circuitry, and the active circuitry faces the heat sink. An optical substrate such as sapphire has an average thermal conductivity of 30 W/m-K in the operating temperature range of the OE devices. As discussed earlier, preferred sapphire substrates are less than about 250 μm thick. Consequently the sapphire substrate does not transmit heat very effectively in the lateral direction. Glass substrates have even lower thermal conductivities.

The active CMOS circuitry is preferably located at a distance from the OE devices to minimize lateral heat transfer. The optical underfill can be selected to be a poor thermal conductor, which increases thermal barrier, to increase the isolation of heat emanating from the CMOS circuitry on the transparent substrate. The heat sink is preferably contoured to follow the heat generating surfaces of all active devices. Preferably the active circuitry is located 25 to 125 μm from the heat sink, and more preferably 75 to 100 μm. Copper is preferred for the heat sink because it has good mechanical stiffness, can support mechanical alignment means, has a high heat conductivity of 400W/m-K, and can economically be manufactured by well-known methods, e.g., stamping, coining, metal injection molding, etc. The heat sink is bonded to the interposer board with a thermally conductive adhesive which adds mechanical stiffness to the package and completes the thermal path.

A finite element model consisting of 590,000 nodes and 360,000 elements was constructed of an OE/IC package as shown in FIG. 1 constructed using the preferred materials. Thermal analysis of the package was done using ASSYS software. Packages were built and measured to verify the model. A convergence of 4% was obtained. The analysis showed temperature uniformity of better than 2° C. was achieved across VCSEL and photodetector arrays. Thermal isolation between the active regions of the CMOS circuitry and the OE devices was excellent. Less than 1° C. was coupled from the active regions to the OE devices. The temperature gradient from the back of the heat spreader to the base of the OE devices was less than 3° C. and to the active CMOS circuitry was less than 4° C. All these thermal results were much better than typical industry norms at present.

FIG. 4C shows a cross-section of an example of an interposer board 104 attached to transparent substrate 17 and in electrical contact with electrical features on surface 22, by means of bonds 267. BGA-type electrical connecting members provide electrical connection to external systems. Interposer 104 is preferably a printed circuit board type material, providing many functionalities by means of features such as microvias 268, ground plane 269, power plane 270, solder mask area 271 and core material 272 (e.g., polyimide).

FIG. 4D shows an expanded view of the fan-out of conductive traces 281, on the interposer board 104, from the high density area of the attached transparent substrate die toward the BGA joint locations. The interposer routes the fine pitch I/O on the die, typically <250 μm pitch, to the pitch of the larger, next level assembly PCB, typically 0.5 mm to 1.27 mm. It is desirable to minimize the interconnect joints and circuit lengths from the die to the solder joints on the package. Flip-chip joints are used instead of wire bonds to minimize lead inductance. In most BGA packages the flip-chip joints are on the top side of the interposer substrate and the solder balls for the next assembly are on the bottom. This requires the interposer to use stacked micro-vias to transfer signals from the top side to the bottom side.

Alignment

Good optical coupling requires highly accurate alignment of OE device to optical fiber core. Uniform coupling between arrays of optoelectronic emitters (e.g., VCSELs) and arrays of multimode fiber (MMF) cores on a one-to-one basis ensures that each of the fibers in the array receives a nearly equal amount of optical power. Precise alignment of all fibers to their corresponding emitter aids in achieving this goal.

The transparent insulating substrate is provided with holes. In one embodiment, these holes serve as clearance holes for guide pins associated with optical ferrule alignment means. In another embodiment, the holes are used as a passive alignment means, precisely mating with the guide pins associated with the optical ferrule alignment means. The holes are of a suitable size to accommodate guide pins used with an optical fiber ferrule or other fiber array housing and may be of any suitable shape, e.g., generally circular, elliptical or triangular. The holes can be positioned with center-to-center tolerances of at least 20 μm, and preferably at least 5 μm. The holes may be formed by drilling; a laser with output in the ultraviolet wavelength range is a useful tool to accomplish hole drilling with minimum amount of slag being generated. A number of sapphire substrates were provided with alignment guide holes by means of UV laser drilling at λ=355 nm. The alignment holes were found to have good surface smoothness and reproducibility. Laser drilling techniques are in general well-suited to positioning the holes with a highly accurate spacing therebetween, and use of the UV wavelengths allows holes to be formed with clean edges and smooth wall profiles when applied to the transparent insulating substrates useful in the practice of the invention, e.g., sapphire, glass.

The method of the invention provides that all alignment steps for placing OE devices, electrical features, and mechanical alignment members for bringing optical fibers into alignment with the OE devices are accomplished by alignment to one or more alignment reference features on the interior OE surface of the transparent insulating substrate. The reference features are formed during fabrication of the electrical features by highly precise circuit fabrication methods such as precision photolithographic patterning with photomasks. Photomasks used for patterning features on substrates are extremely precise; current technology has a placement accuracy better than 0.01 μm and a resolution better than 0.130 μm. Both the transparent, insulating substrate and the optoelectronic devices are fabricated with precision alignment features visible on their surfaces.

Semiconductor packaging assembly lines use flip-chip bonding machines to package physically small components. A wide variety of flip-chip machines are available. Commonly there is a trade-off between alignment accuracy and time required to perform bonding. An example of a flip-chip machine suitable for the practice of the invention is a Toray Engineering model FC2100/FC2200, which can be configured in a high or low accuracy version. The high accuracy version has +/−2 μmn accuracy and requires 15 seconds per bond. The low accuracy version has +/−5 μm accuracy and requires 1.8 seconds per bond. The accuracy is defined as a "3-sigma" number, meaning that the probability that the parts are aligned to the stated accuracy is greater than 99.8% according to a normal probability distribution.

The OE devices should be positioned relative to mechanical alignment members within a tolerance of approximately ±20 μm to enable effective optical communication between fiber optic core and OE device. A tolerance of less than approximately ±15 μm is preferred. In embodiments in which single-mode optical fibers are employed, the tolerance should be less than about ±2 μm, and should preferably be less than ±1 μm. The optical fiber ends should be as close as possible to the active areas of the OE devices for low loss transmission of light between the optical fiber cores and the OE devices.

The alignment required in the practice of the invention consists of two steps:

(1) alignment of a reference feature on the OE device to a reference feature on the interior OE surface of the transparent, insulating substrate and bonding of the OE device to the substrate; and (2) alignment to a reference feature and formation or attachment of mechanical alignment members to the interior OE surface of the transparent insulating substrate. These two steps can be performed in either order.

Step (1) is preferably performed with equipment suitable for automated extremely precise attachment of die to substrates, such as a flip-chip bonding machine, such as described above. The bonding machine aligns features on the optoelectronic device to reference features on the interior OE surface of transparent, insulating substrate.

Step (2) aligns a mechanical alignment member to reference features on the interior OE surface of the transparent substrate. The mechanical alignment member is capable of passively aligning and optical fiber to the OE device by means of complementary mechanical alignment features possessed by the optical connector. Examples of mechanical alignment members include precision guide holes, precision guide pins, and features created in the surface of the transparent substrate itself. Examples of methods for performing step (2) include precision laser dicing to form accurate guide pin holes in the transparent, insulating substrate whose location is accurately aligned to substrate reference features; and using a precision guide pin holder which is flip-chip bonded to the transparent, insulating substrate in a precise relationship to the location of the reference features.

The guide hole approach involves forming precision guide holes in the transparent, insulating substrate using a laser of appropriate wavelength for cutting the material. The laser is positioned over a precision stage. Precision stages are available today with positional accuracy of 2 µm or smaller. The laser uses features on the transparent, insulating substrate to create a well defined hole that is accurately positioned. Alignment accuracy (between optoelectronic device and fiber core) achievable with commercially available laser systems using this method is about +/−1.5 µm. The overall alignment accuracy in production is determined by the root-sum-square of the individual tolerances. The precision guide holes hold alignment members such as precision guide pins, which penetrate through the guide holes to emerge on the optical output surface of the package. The guide pins can engage complementary guide holes in, e.g., fiber optic connectors.

Figure 5A:
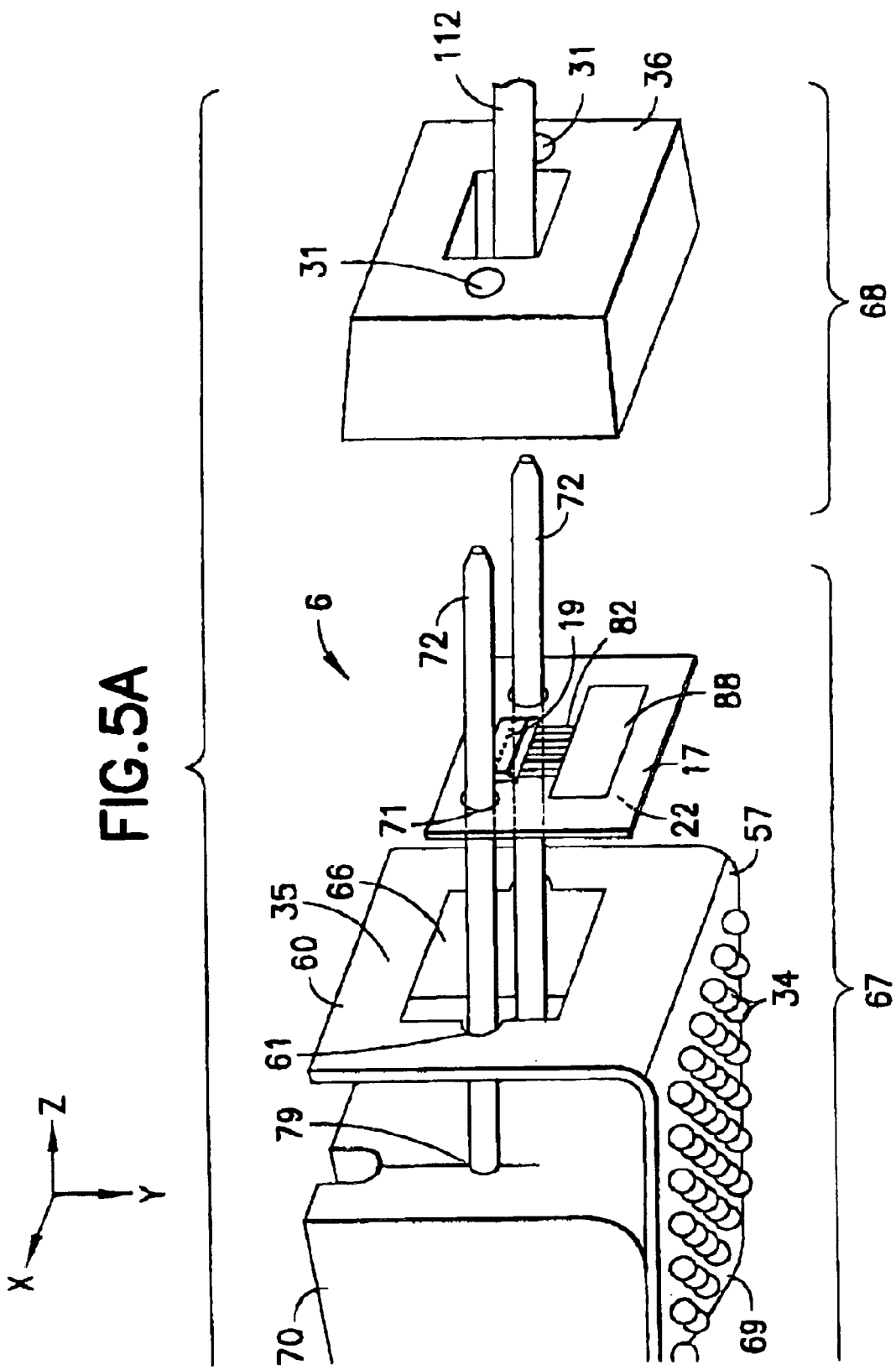
FIG. 5A is an exploded side-view schematic representation of one embodiment of the small scale package of the invention, for packaging optoelectronic devices and integrated circuits with alignment members for mechanically aligning the optoelectronic devices to optical fibers in an external fiber optic connector with complementary alignment features.

FIG. 5A shows an exploded side-view schematic representation of an OE/IC package according to one embodiment of the invention, which accomplishes alignment by means of mechanical alignment members comprising substrate guide holes. A support-mounted integrated OE/IC packaging system 67 for coupling to fiber optic connector 68 is shown. The optical fiber component 68 comprises a ribbon array 112 of optical fibers terminating in an optical connector 36, which is provided with precision guide holes 31 therethrough. The fiber optic connector 36 holds the optical fiber array 112 in a precise positional relationship to guide holes 31. Standardized ferrules are capable of aligning arrays of fibers to tolerances of within 1 µm core-to-core and are commercially available (USConnec, etc.). Standardized ferrules such as MT or MTP ferrules may be employed as fiber optic connector 36.

The support-mountable electronic-optoelectronic module 67 comprises a transparent insulating substrate 17 with an optoelectronic device chip 19 mounted on interior OE surface 22 thereof. Surface 22 faces away from the fiber optic connector, in the (−z) direction. The optoelectronic device array is mounted with its active area facing surface 22, so that it transmits or receives signals through substrate 17. Electrical circuitry 88 on surface 22 is in electrical communication with OE device chip 19 by means of electrically conductive traces 82 on surface 22. The OE device chip 19 is positioned on surface 22 in a precise positional relationship to the guide holes 71.

Substrate 17 is mounted on support member 35. Support member 35 is provided with window 66, whose perimeter includes cutout areas 61 which are slightly larger than and line up with substrate guide holes 71. Support member 35, or, if 35 is a multilayer material, facing surface 60 thereof, is formed from a conductive material, e.g., copper, or is provided with conductive traces (not shown) so that it may provide electrical connection to the substrate 17 and/or OE chip 19 by means of electrically conductive bonds. In some embodiments, support member 35 is a printed circuit board. FIG. 5A shows a support member which is a flexible printed circuit board. Support 35 forms an approximately 90 degree bend at 57. Lower surface 69, approximately orthogonal to facing surface 60, may be provided with electrically conductive bonding means 34, e.g., solder bumps, by means of which electrical connections can be formed to the electrically conductive traces or surface of the support and thence to the electrical circuits on surface 22 of substrate 17 and the OE devices. Support member 35 is backed by support block 70 which provides rigid mechanical support and may serve as a heat sink. In the FIG. 5A embodiment, support block 70 is provided with mounting recesses 79 which hold guide pins 72. These mounting means do not need to hold the pins in a highly precise position, since alignment is accomplished at the substrate and fiber optic connector level.

When the optoelectonic/optical coupling system is assembled, guide pins 72 pass through cutouts 61 in support 35, guide holes 71 in substrate 17, and are fixed in fiber optic connector guide holes 31. The optical fibers are in a fixed positional relationship to the connector guide holes 31, and the OE devices are in a fixed positional relationship to the substrate guide holes 71, and thus assembly of the coupling system by means of the alignment members (guide pins) 72 brings the optoelectronic devices into precise alignment with the optical fibers with no additional or active steps necessary.

Manufacture

Optical/optoelectronic coupling systems as shown in FIG. 5A are made by methods that include the general steps of:

(1) drilling guide holes in a transparent insulating substrate (by UV laser drilling or other suitable methods);

(2) forming the integrated electronic/optoelectronic module on the transparent insulating substrate as described for FIG. 1, wherein the optoelectronic device is mounted on the transparent insulating substrate in a precise fixed positional relationship to the substrate guide holes;

(3) mounting and mating the integrated electronic/ optoelectronic module support member onto a support member equipped to provide electrical connections and which supports guide pins complementary to the substrate guide holes; and (4) mounting and mating an optical fiber connector having complementary guide holes onto the guide pins thereby to align the optical fiber with the optoelectronic device.

The system of FIG. 5A is shown with the guide pins retained in the mounting block for mating with a "female" fiber optic connector. It will be appreciated that the invention can be practiced in the other orientation as well, with guide pins retained in the optical fiber connector and inserted into the optoelectronic module. The orientation shown in FIG. 5A is, however, preferred, because it does not require the transparent substrate to be subjected to repeated insertions of the guide pins therethrough.

Figure 5B:
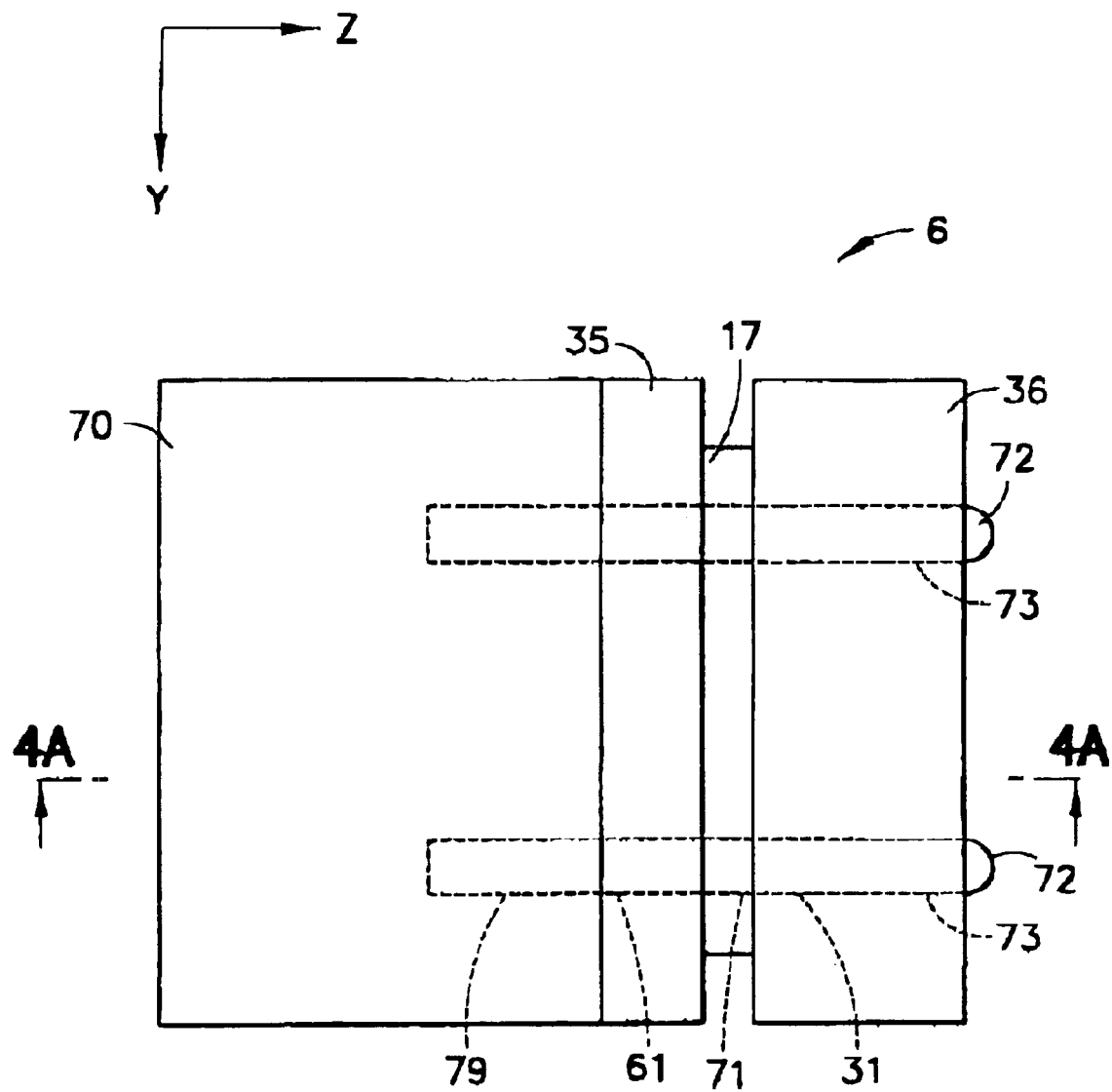
FIG. 5B is a top view of the package of FIG. 5A in tight connection with a fiber optic connector.

FIG. 5B is a top view 3 of an integrated optical/optoelectronic coupling system as in FIG. 5A. Transparent insulating substrate 17 is pinned by guide pins 72 between optical connector 36 and support member 35, in the continuous pathway 73 comprising connector guide holes 31, substrate guide holes 31, cutouts 61, and mounting block recesses 79. The OE chip 19 extends into the window area defined by 66 in FIG. 5A and is not visible in this view.

Figure 5C:
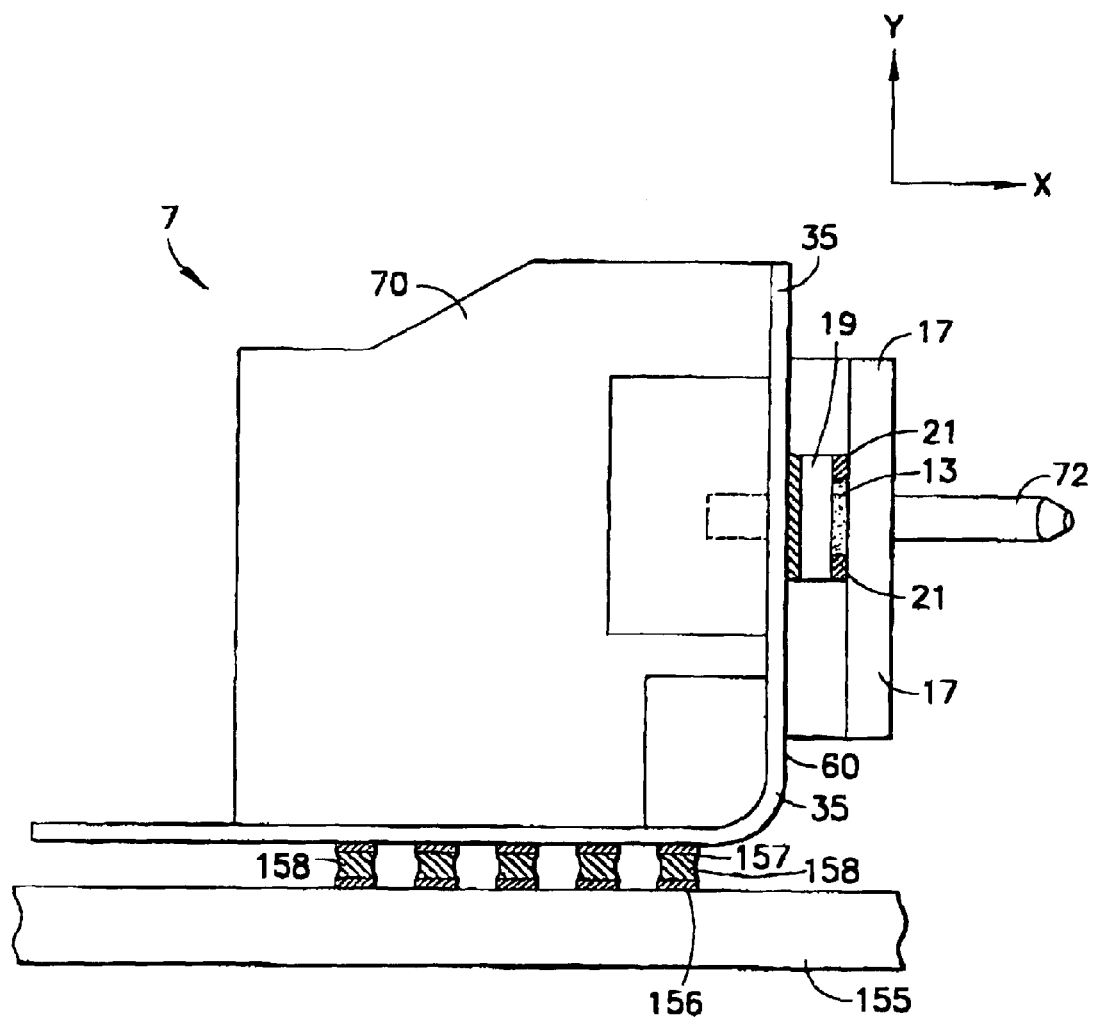
FIG. 5C is a cutaway side view of the package of FIG. 5A, showing the package mounted on a printed circuit board.

FIG. 5C is a side view schematic representation of the assembled optoelectronic module 7 of the integrated optical/optoelectronic coupling system of FIG. 5A, attached to an electrical connector mounting system 97 which comprises an electrical connector member 155 provided with electrically conductive regions (not shown) which are in electrical communication with the optoelectronic module by means of one or more electrically conductive bonds 158 formed to bonding pads 157 on support member 35 and bonding pads 156 on electrical connector member 155. By means of these connections, electrical signals may be transmitted to and from and power connections made to the electrical connector 155.

Figure 5D:
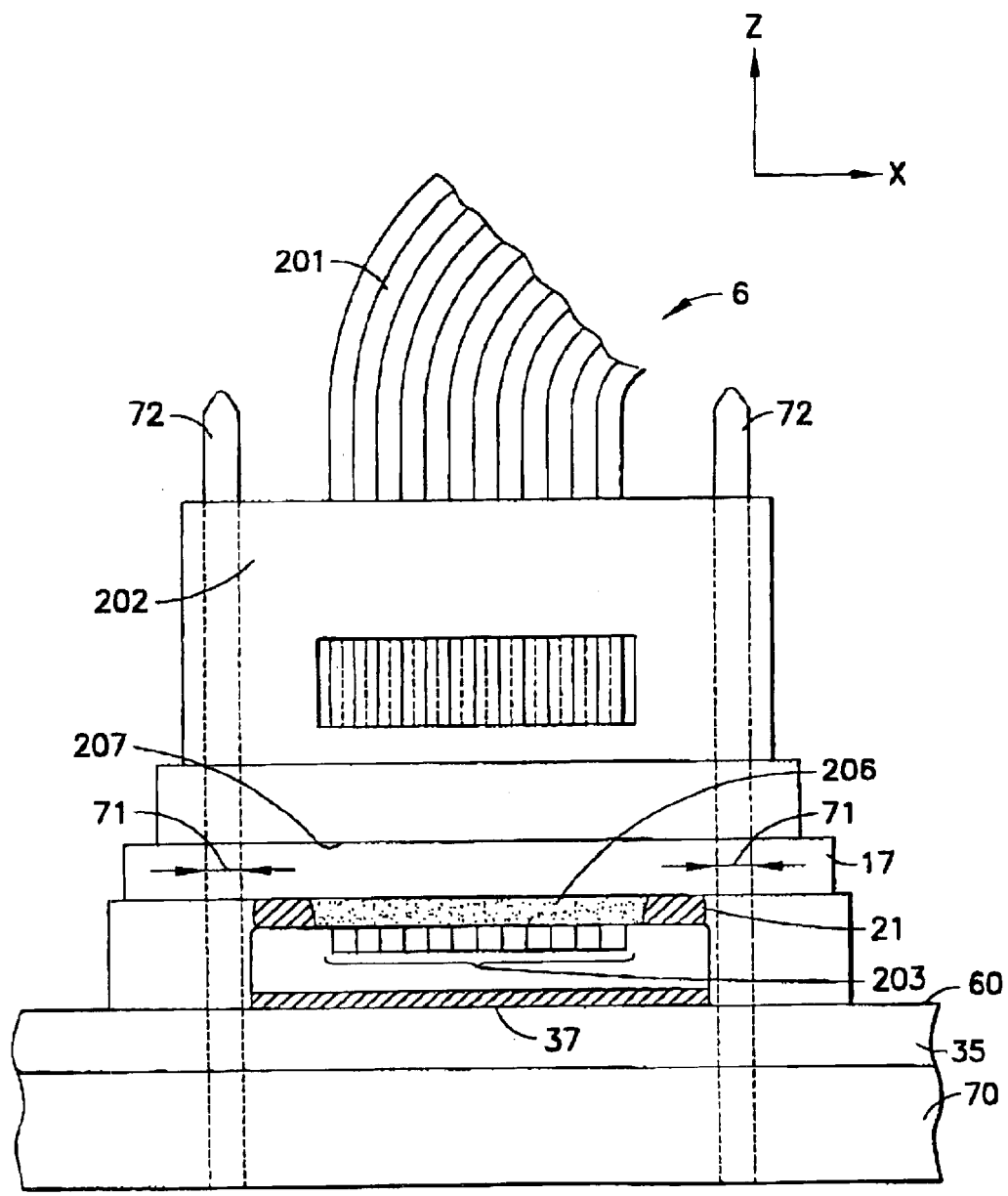
FIG. 5D is a cutaway top view schematic representation of the package of FIG. 5B, assembled in tight connection with a fiber optic connector.

FIG. 5D is a cutaway top view schematic representation of the integrated optical/optoelectronic coupling system 6 of FIG. 5A, assembled. A ribbon array (1×12) 201 of optical fibers mounted in an optical ferrule 202 is coupled with a 1×12 array 203 of optoelectronic devices in a similar fashion to that shown in FIGS. 2B, 2C and 3. The optoelectronic devices are bonded by means of electrically conductive bonds 21 to transparent insulating substrate 17. The optical fiber ends are flush with or extend a small distance beyond the end surface 207 of the ferrule and are very close to the optoelectronic devices. The space 206 between the optoelectronic devices and the transparent insulating substrate may optionally be filled with a refractive index matching material such as an optical gel or an optical adhesive or sealing compound. The OE devices are thus sealed from environmental effects.

The optoelectronic devices and the precision guide holes 71 are precisely positioned with respect to alignment marks on the OE surface 22 of transparent insulating substrate 17. A number of vision-aided alignment processes are known that can be employed to align and mechanically place the optoelectronic devices relative to the reference marks. Laser-drilling can likewise be performed with high precision relative to reference marks.

Figure 5E:
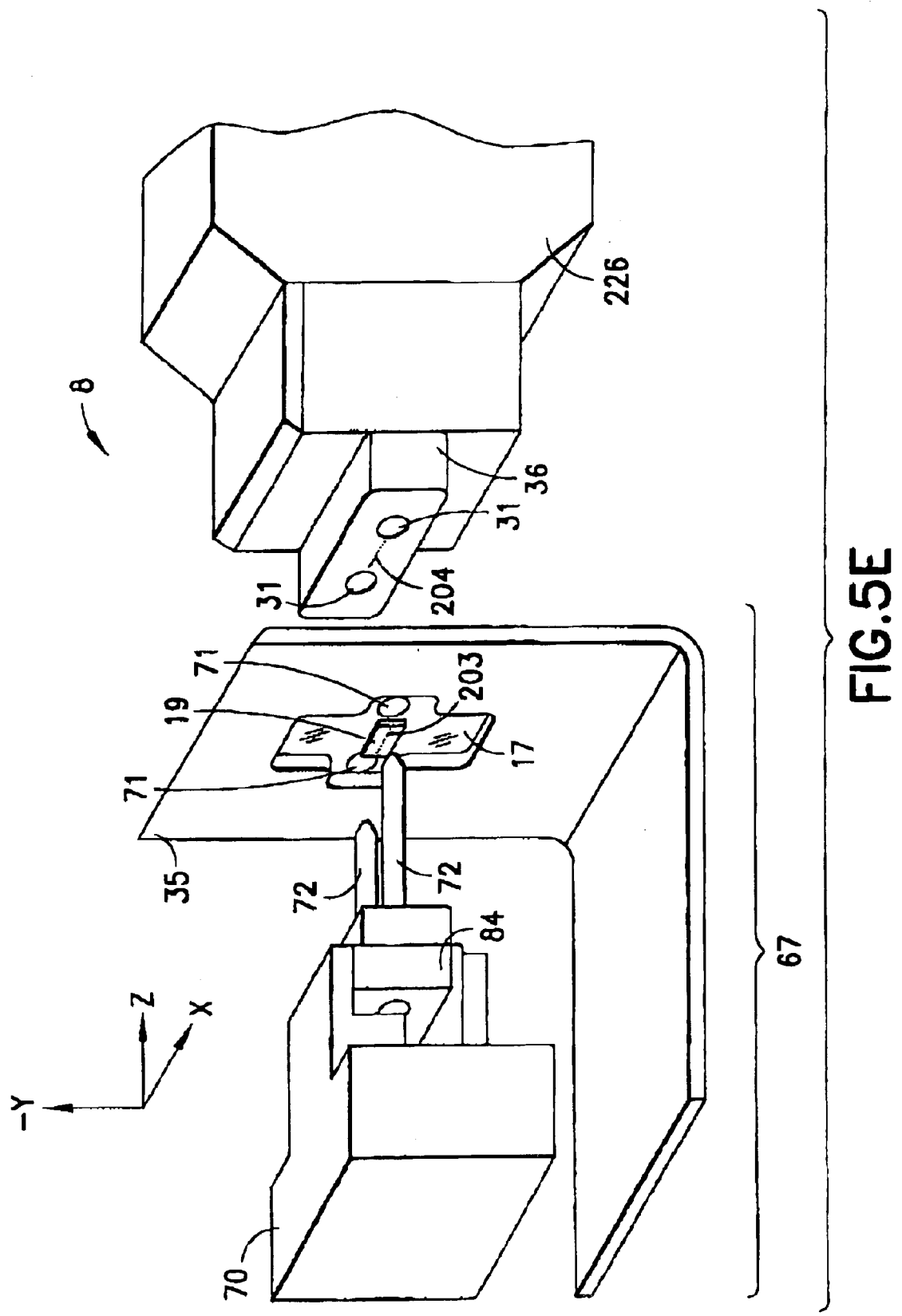
FIG. 5E is an exploded side-view schematic representation of the FIG. 5A embodiment of the small scale package of the invention, aligned for coupling with an array of optical fibers mounted in a fiber optic connector.

FIG. 5E is an exploded side-view schematic representation of an integrated optical/optoelectronic coupling system 8 similar to the embodiment shown in FIG. 5A. System 8 comprises an array of optical fibers mounted in a fiber optic connector 36. The fiber ends 204 are flush with or extend slightly beyond the front surface 207 of ferrule 36. The fibers ends are in registration with an array 203 of optoelectronic devices in optoelectronic chip 19, which is flip chip bonded to transparent insulating substrate 17 as shown in FIGS. 2B, 2C and 3. A guide pin retaining insert 84 is retained in mounting block 70, which is so shaped as to make thermal contact with areas of the OE device array and/or substrate 17. Fiber optic connector 36 is mounted in a housing 226 whose purpose is to protect the connector and make it easy to handle the system without directly touching the alignment parts. The optoelectronic module may also be enclosed in a housing (not shown). The housings are typically made of plastic or other moldable material.

Figure 5F:
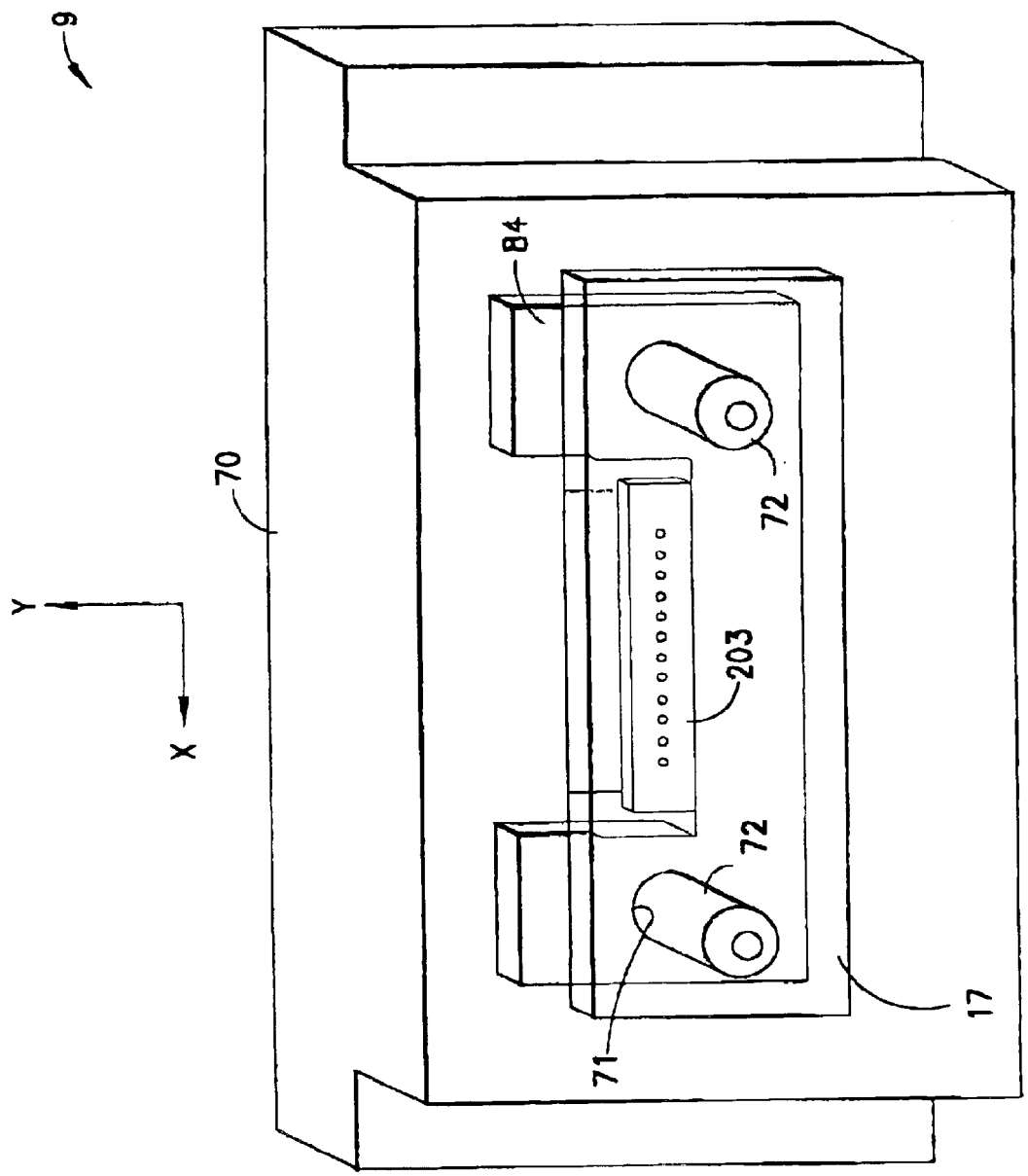
FIG. 5F is a front view of the FIG. 5A embodiment of the small scale package of the invention.

FIG. 5F is a front view 9 of the optoelectronic module portion of the integrated optical/optoelectronic coupling system of FIG. 5E. Guide pin retaining member 84, visible through transparent substrate 17, is shaped to avoid interfering with light transmission to/from the optoelectronic device array 203.

The guide pin retaining insert is preferably formed in of the same or similar material and in the same or similar process as the fiber optic connector with which the guide pins will mate, and is preferably formed with at least as high precision. The guide pin insert can be attached; or alternatively the guide pins can be attached separately. The attachment process is preferably performed by automated and precise assembly equipment (often called "pick and place" equipment).

Figure 6A:
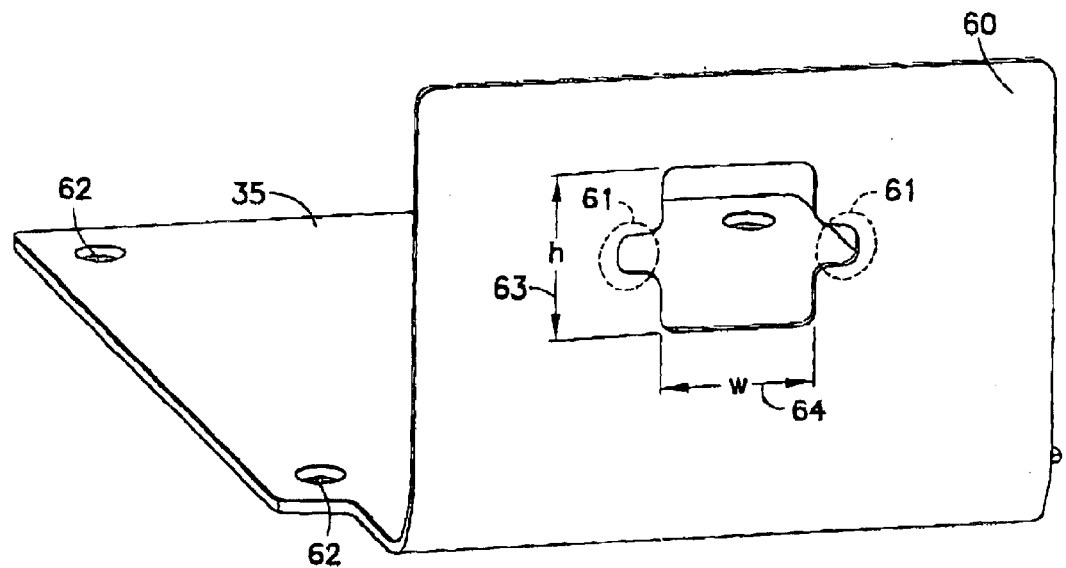
FIGS. 6A–6E show an exploded schematic view of a package according to FIG. 4A, comprising a flexible printed circuit board (FIG. 6A); to which is mounted a transparent insulating substrate flip-chip bonded to an array of optoelectronic devices (FIG. 6B); aligned by means of guidepins to an array of optical fibers (FIG. 6C) which are positioned in a fiber optic connector (FIG. 6D); the package includes a heat sink (FIG. 6E).
Figure 6B:
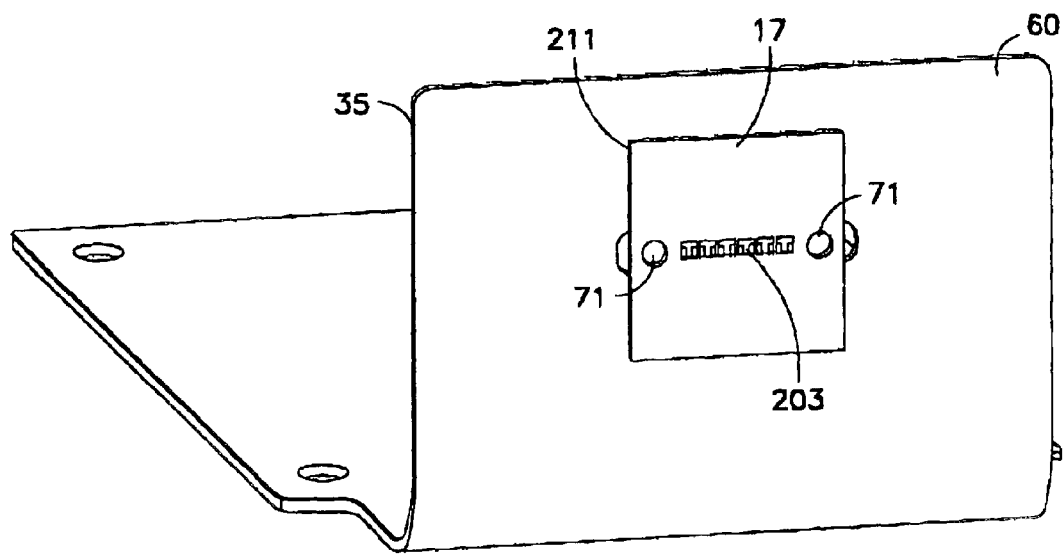
Figure 6C:
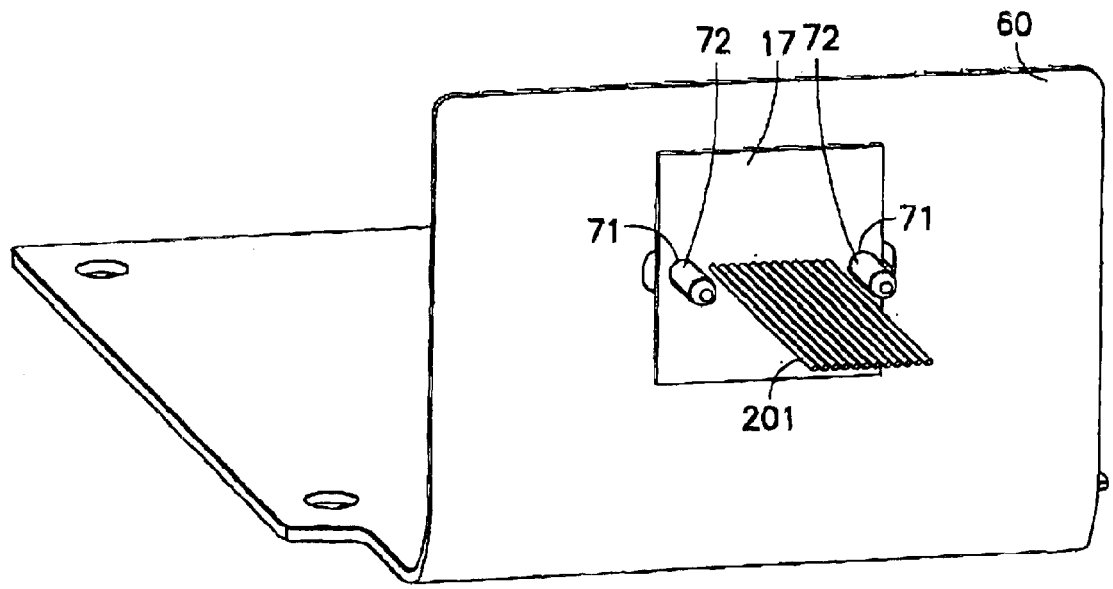
Figure 6D:
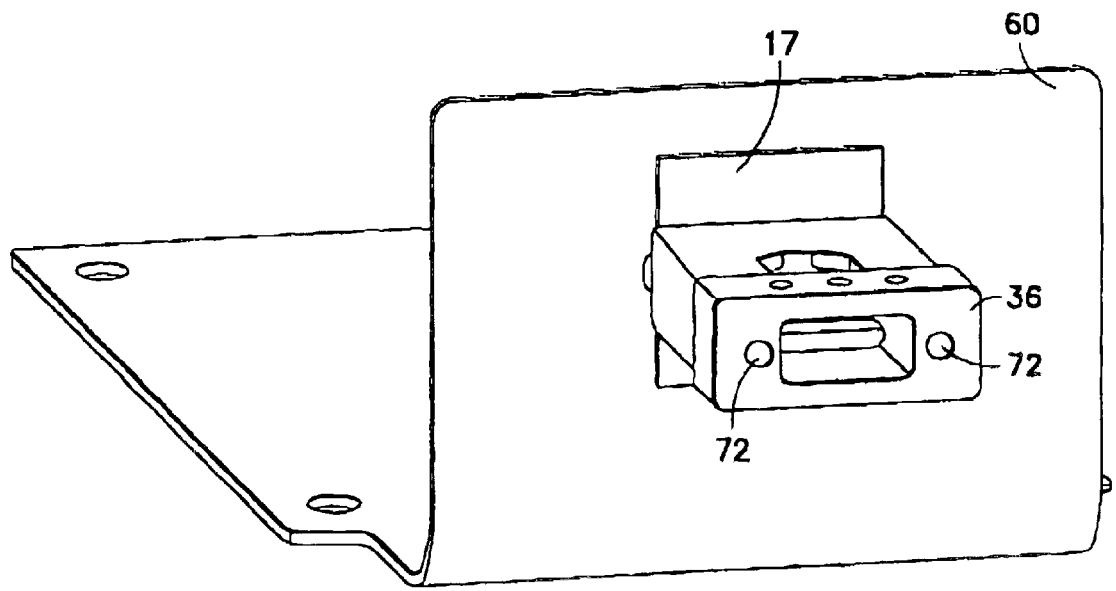
Figure 6E:
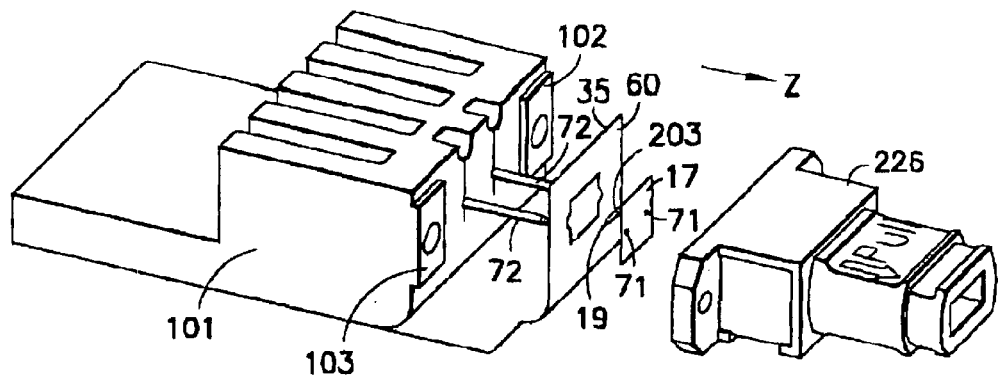

FIGS. 6A–6E show an exploded schematic view of an example of an optical connector such as was shown in FIGS. 5–F, comprising a flexible printed circuit board (FIG. 6A); to which is mounted an integrated electronic-optoelectronic module comprising a transparent insulating substrate flip-chip bonded to an array of VCSELs (FIG. 6B); aligned by means of substrate guide holes to an array of optical fibers (FIG. 6C); where the fibers are positioned in an MT ferrule (FIG. 6D); and where the integrated electronic-optoelectronic module is provided with a heat sink (FIG. 6E).

FIG. 6A shows a supporting stage comprising a printed circuit board 35 with conductive facing surface 60 as described earlier as an example of a configuration suitable for mounting an optical/optoelectronic coupling structure. Printed circuit board 35 has an opening of height 63 and width 64 that has cutout regions 61 that are of a size slightly larger than the cross-section of the guidepins that will be used to mount the integrated electronic-optoelectronic module on the board. Board 35 has optional mounting holes 62 that can be used to attach the board to a heat sink or other structure.

FIG. 6B shows a schematic view of a partial structure comprising an integrated electronic-optoelectronic module 211 positioned over the opening in the printed circuit board 35 and being prepared for mounting on printed circuit board 35. Visible through the transparent substrate 17 is an array 203 of optoelectronic devices. The optoelectronic devices array is mounted on the transparent substrate by means of one or more conductive bonds, as was shown previously. The optoelectronic device array can be positioned with great accuracy on the transparent substrate using the technique of flip-chip bonding. Substrate 17 includes two guide holes 71 that have been drilled in a precisely spaced relationship. The purpose of these guide holes is align the substrate 17 to a ferrule containing the array 201 of optical fibers. The guide holes are of a suitable size to accommodate guide pins used with the ferrule or other fiber array housing and may be of generally circular or elliptical shape. The guide holes can be positioned with center-to-center tolerances of at least 20 $\mu$m, and preferably at least 5 $\mu$m. The guide holes may be formed by drilling; a laser with output in the ultraviolet wavelength range is a useful tool to accomplish hole drilling with minimum amount of slag being generated.

FIG. 6C shows a partial structure that includes guide pins 72 in the guide holes 71 and an array of optical fibers 201 whose optical cores are brought into registration with the optoelectronic devices in array 203.

FIG. 6D shows a partial structure that includes a ferrule 36 which positions the fibers for precise alignment and mating to the optoelectronic device array by means of guide pins 72. Standardized ferrules are capable of aligning arrays of fibers to tolerances of within 1 $\mu$m core-to-core and are commercially available (USConnec, etc.). Standardized ferrules such as MT or MTP ferrules are useful in the practice of the invention.

FIG. 6E shows an exploded view of the optical connector components including a heat sink and a ferrule housing. The optical fiber array within a standard ferrule, V-groove mount, or other positioning means is within a housing 226. The printed circuit board 35 is mounted on a support structure 101 that functions as a heat sink or is connected to a heat sink and that has guide plates 102 and 103 for connecting to the housing 226. Guide pins 72 pass through the cutouts 61 in board 35 and through guide holes 71 in transparent substrate 17, on the front side of which is mounted the optoelectronic substrate 19 that bears optoelectronic device array 203.

Many modifications and variations on the arrangement shown in FIGS. 6A–6E are possible within the scope of the invention. Preferred embodiments will include precise alignment of optical fiber core(s) with optoelectronic device(s) that are formed on a substrate that is a suitable material for optoelectronic devices, with control electronics present in a thin silicon layer on a transparent insulating substrate that is connected to the optoelectronic device substrate by a conductive bond and located between the optical fibers and the optoelectronic device substrate.

In general, the precision with which the optical fiber cores can be brought into registration with the optoelectronic devices depends on the precision of:

(1) the positioning and spacing of the optoelectronic devices on the optoelectronic chip;

(2) the spacing of the optical fiber cores in the ferrule or other array housing or V-groove substrate;

(3) the optoelectronic device array bonding to the transparent substrate;

(4) the locations and diameters of the guide holes in the transparent substrate.

Figure 7:
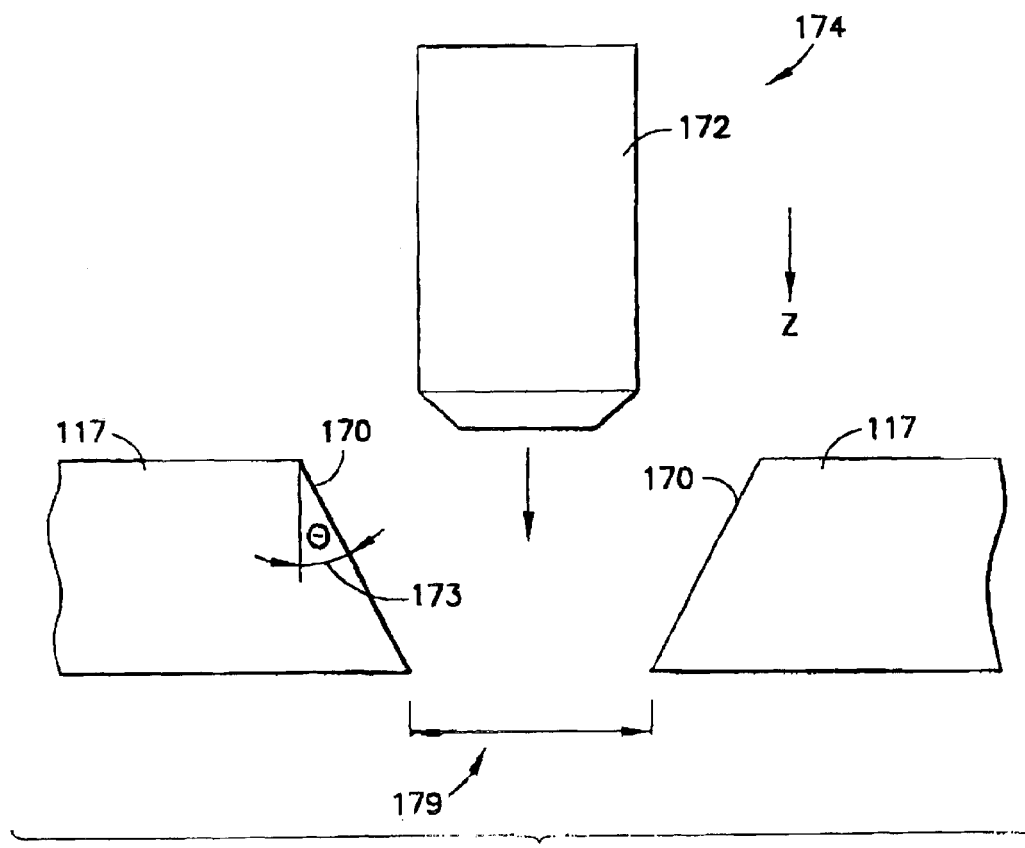
FIG. 7 is a schematic representation the wall profile of the substrate guide hole configured to receive the guide pin.

FIG. 7 is a schematic representation of a pin-guide hole system 174 where the guide hole 179 formed in substrate 117 is configured to receive the guide pin 172. It has been found that guide hole wall profiles with a small angle inward from the vertical are advantageous in terms of easily inserting the guide pin and assembling the module. Angles $\theta_{hole}$ (173) in the range of about 1° to about 40° are advantageous for guide pin insertion, with angles from about 1° to about 10° being preferred. The taper preferably begins near the top surface of the substrate and continues to the bottom. The shape of the taper is generally conical. Variations from conical shape along the wall of the hole may exist, but will preferably be less than 50 $\mu$m from that of a perfectly conical shape.

Figure 8A:
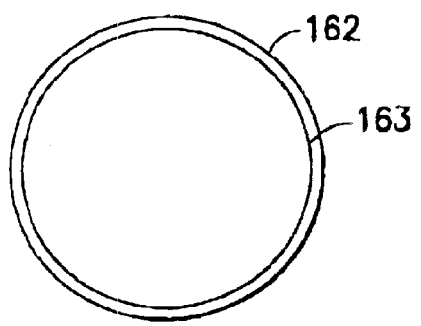
FIGS. 8A, 8B, and 8C show three examples of guide hole shapes for the guide holes in the transparent insulating substrate.
Figure 8B:
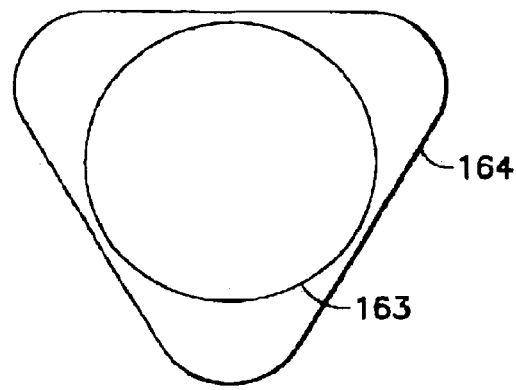
Figure 8C:
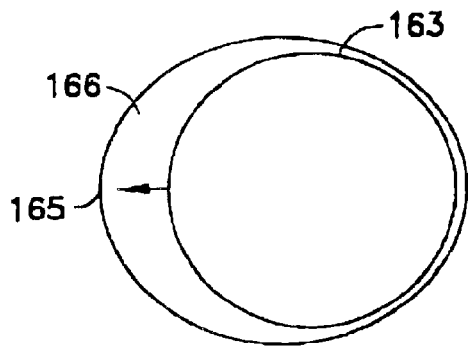

FIGS. 8A, 8B, and 8C show three guide hole shapes that are useful in forming the optical-optoelectronic interfaces. The round hole profile 162 shown in FIG. 8A matches the guide pin 163 shape. This round shape is useful for aligning the substrate to the fiber connector when coefficient of thermal expansion (CTE) of both the fiber connector and substrate is a close match (within 10%). The round guide hole will maintain alignment of the substrate to the fiber connector in the plane of the substrate.

The elliptical shaped hole profile 165 shown in FIG. 8C is useful when the CTE of the substrate and fiber connector do not match. The fiber connector and substrate assembly may see a temperature excursion of 300° C. as it is mounted into a larger assembly. The elliptical hole allows the guide pin 163 to move during large temperature excursions. Pins are most often placed when parts are at room temperature. As the parts heat up, the pins move along the elliptical hole in direction 166. During operation, the pins are at the centermost position in the hole.

The triangular hole profile 164 of FIG. 8B may be used in combination with an elliptical hole. The triangular hole aids in inserting the guide pin into the hole and removing the guide pin from the hole. Less surface area of the hole is in contact with the guide pin than the elliptical or round hole.

Figure 9:
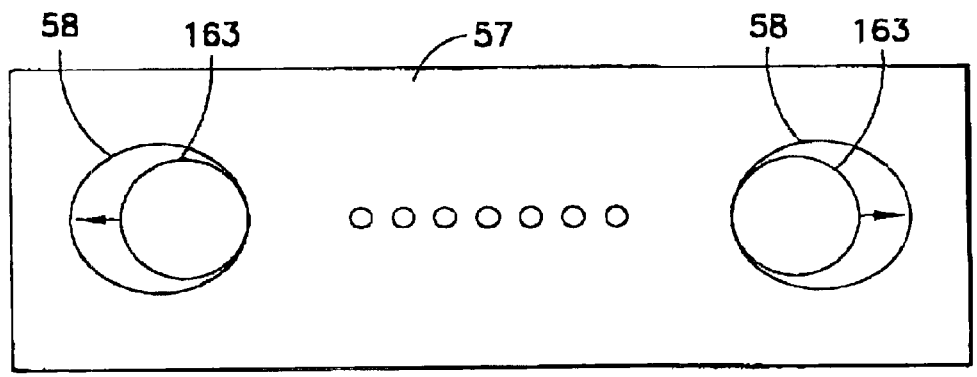
FIG. 9 shows a transparent substrate with elliptical guide holes with guide pins positioned therein.

FIG. 9 shows a transparent substrate with elliptical guide holes 58. Guide pins 163 are free to move outward when the module heat up and expands.

Figure 10A:
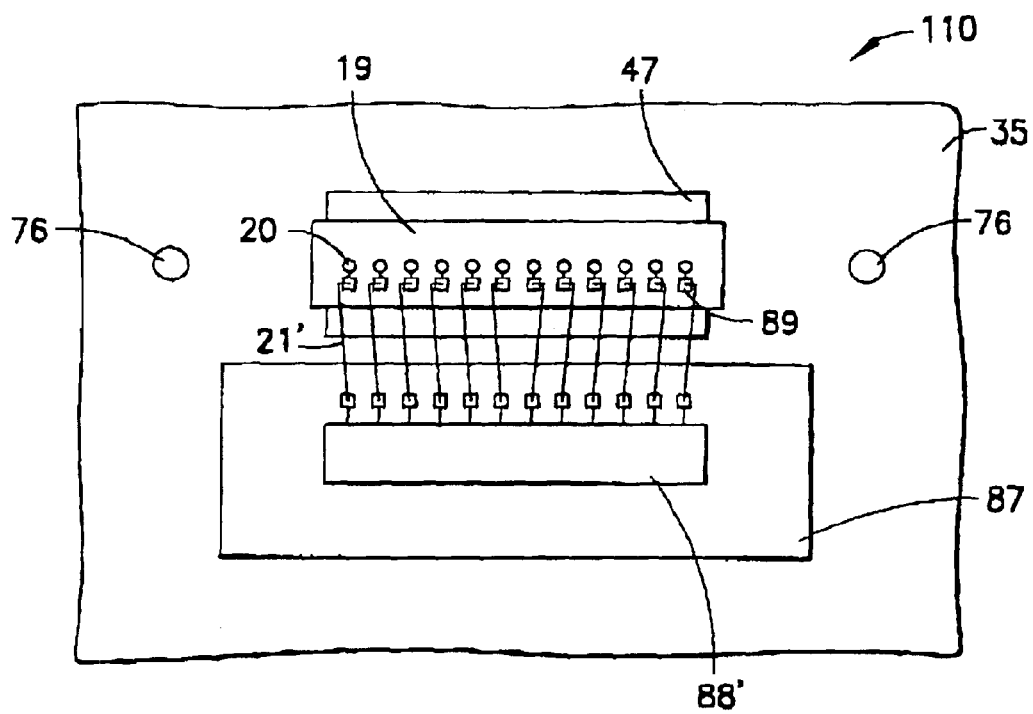
FIG. 10A is a view of the optoelectronic surface of a prior art structure for interfacing 1×12 arrays of fibers and VCSELs provided for comparison with FIG. 10B, which is a view of the optoelectronic surface of a package of the present invention.
Figure 12A:
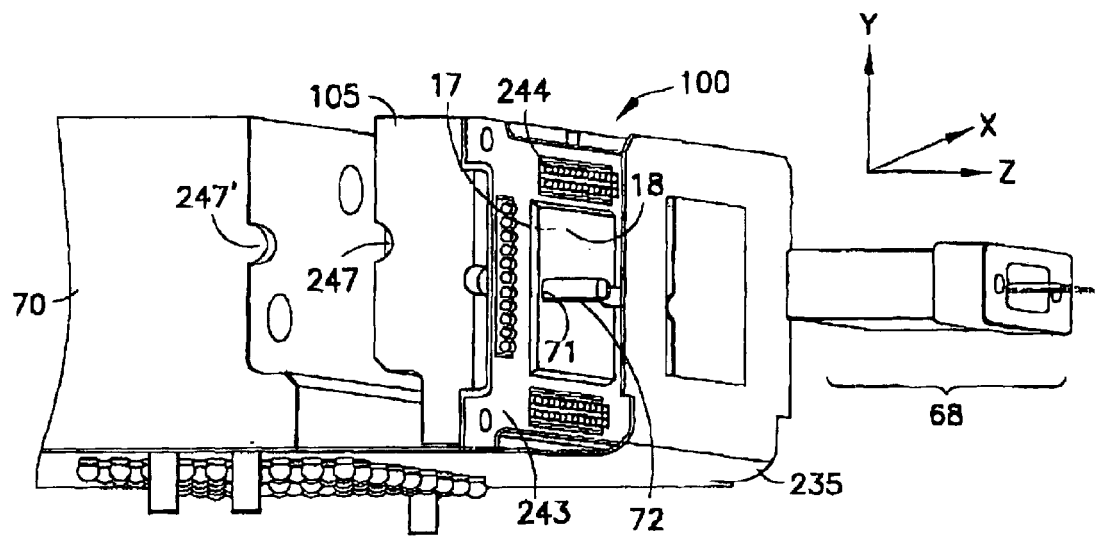
FIG. 12A is an exploded side-view schematic representation of another embodiment of the small scale package of the invention, including an interposer board.

FIG. 10A is a schematic top view of a prior art structure 110 similar to the interface shown in FIG. 2A, viewed in the direction 10A (Rosenberg et al., "The PONI-1 Parallel-Optical Link," 49$^{th}$ Electronic Components and Technology Conference, San Diego, Calif. Jun. 1–4, 1999). This prior art structure for interfacing 1×12 arrays of fibers and VCSELs is provided for comparison with FIG. 10B, which is a schematic top view of a 1×12 optical/optoelectronic connector of the present invention, similar to the interface shown in FIG. 2B, viewed in direction 10B. In FIG. 12A, VCSEL chip 19 is mounted on carrier 47 which is mounted on base 35 (e.g., a flexible printed circuit). Carrier 47 includes conductive pathway(s), to which the VCSEL's back electrical contact forms electrical connection. The VCSEL driver and other control circuitry are on silicon substrate 87. The top electrical contacts 89 to VCSELs 20 are connected to the VCSEL driver circuit 88' in the silicon IC 87 via wire bonds 21'. The base 35 is provided with guideholes 76 for alignment via complementary mating guide pins to an optical fiber bearing ferrule.

Figure 10B:
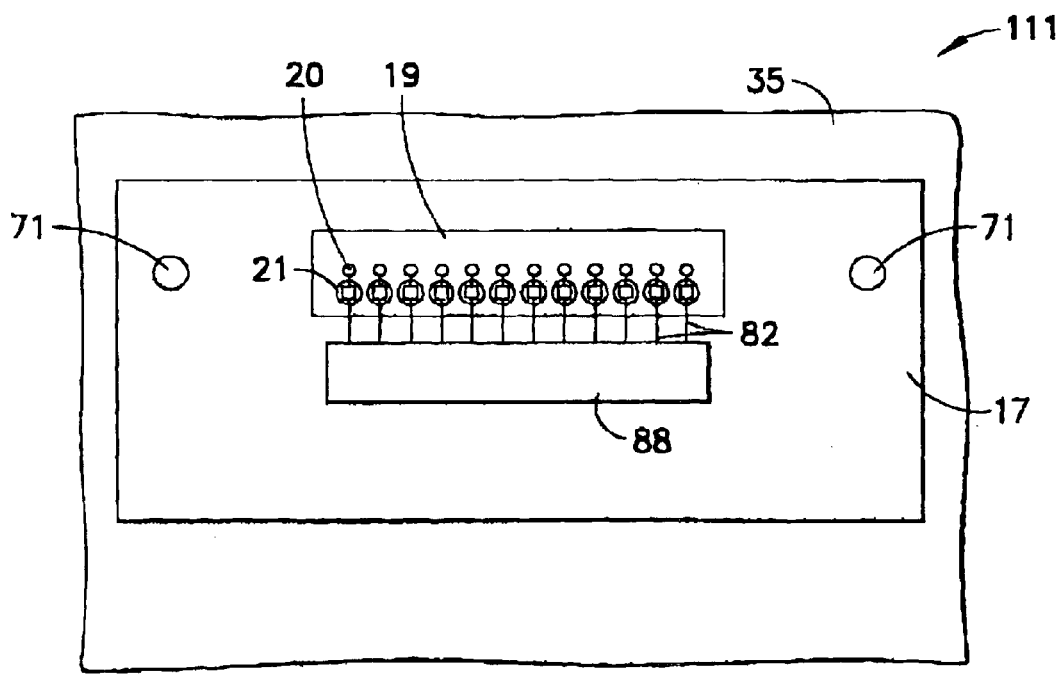

FIG. 10B shows a schematic top view of an optical interface structure 111 similar to the interface shown in FIG. 2A, viewed in the direction 12B. VCSEL chip 19 is mounted on base 35 (a flexible or rigid printed circuit, multichip module, or the like). The VCSEL's back electrical contact connects to electrically conductive pathways on the base 35 (not shown). In contrast to the situation in FIG. 10A, the VCSEL driver and other control circuitry 88 are in a thin silicon layer in regions of sapphire substrate 17. The top electrical contact to each VCSEL 20 is connected to the VCSEL driver via conductive bond 21, formed by flip-chipping or other suitable technique, and conductive traces 82, formed from a conductive material, e.g., aluminum, copper, or other metals or alloys, on the sapphire substrate. Sapphire substrate 17 is provided with guideholes 71 for passive alignment via complementary mating guidepins to the optical fiber bearing ferrule. Because light is transmitted through the transparent substrate 17, the interface 111 possesses improved electrical performance, since the parasitics associated with the wire bond are avoided; physical robustness, since a fragile structure is avoided; and improved manufacturability.

Figure 13A:
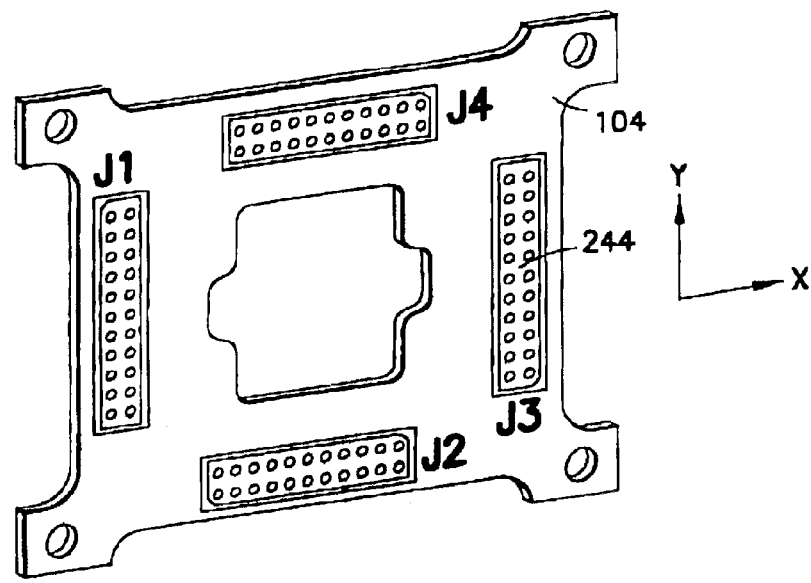
FIGS. 13A–13E show an exploded schematic view of a package according to FIG. 4B, comprising an interposer board (FIG. 13A); to which is mounted a transparent insulating substrate flip-chip bonded to optoelectronic devices (FIG. 13B); aligned by means of guidepins to an array of optical fibers (FIG. 13C) which are positioned in a fiber optic connector (FIG. 13D); the package includes a heat sink and is mounted on a support structure (FIG. 13E).
Figure 13B:
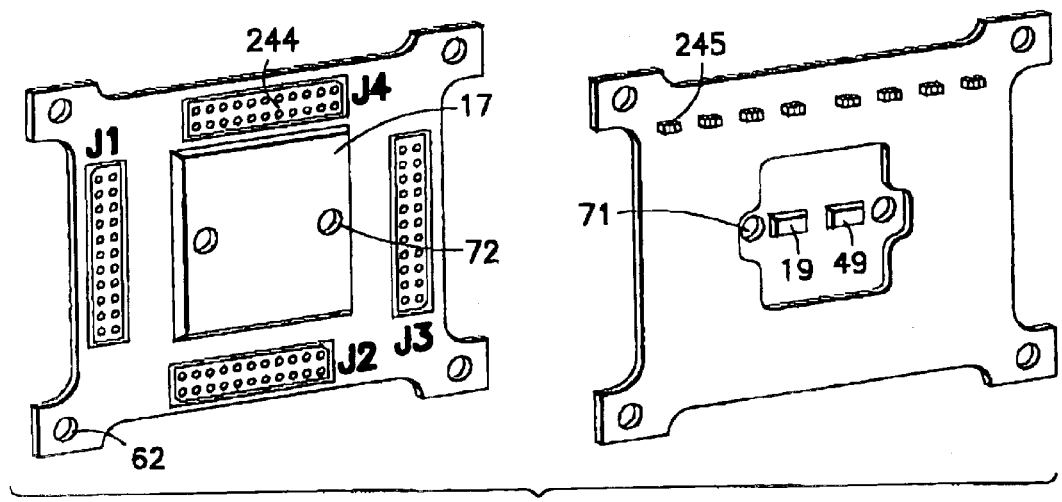
Figure 13C:
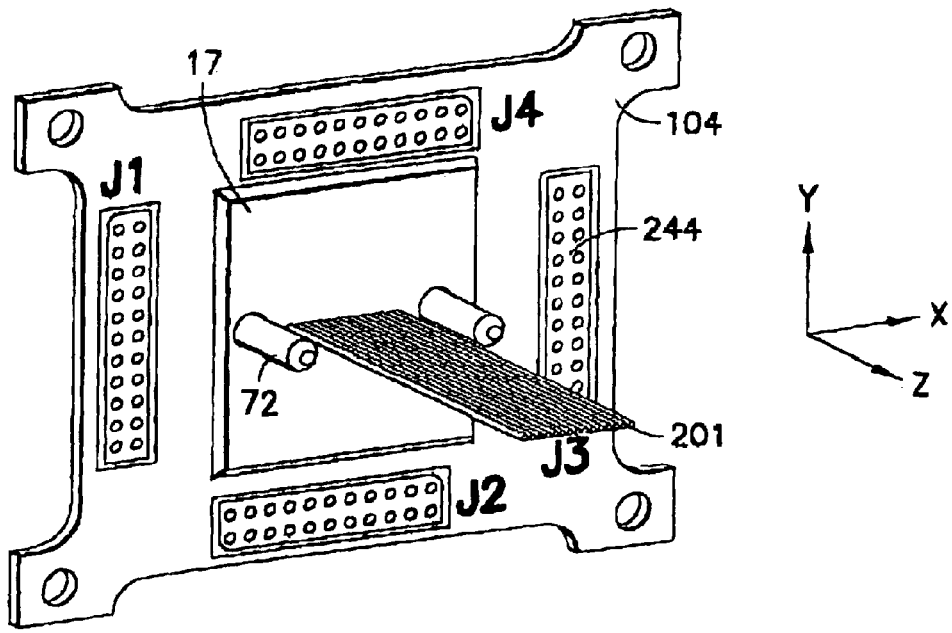
Figure 13D:
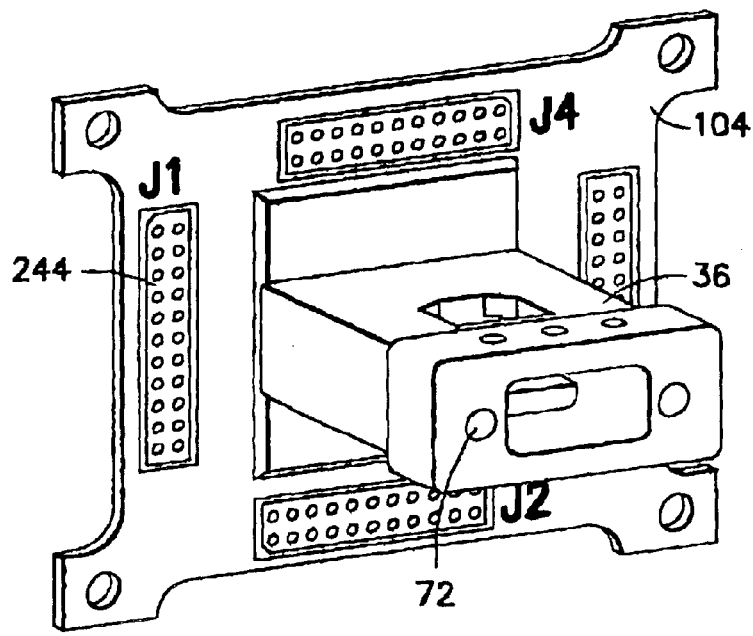

FIGS. 10A and 10B illustrate the flip-chip integrated circuit chip on transparent substrate embodiments of the optical interface, wherein the optoelectronic device is a VCSEL. By analogy with FIG. 2E, it will be clear that an optical interface employing another type of optoelectronic device, e.g., a photodetector, may be formed as in FIGS. 13A and 13B. By analogy with FIG. 3, the optoelectronic devices may comprise light detectors and emitters to form a transceiver structure.

Figure 11A:
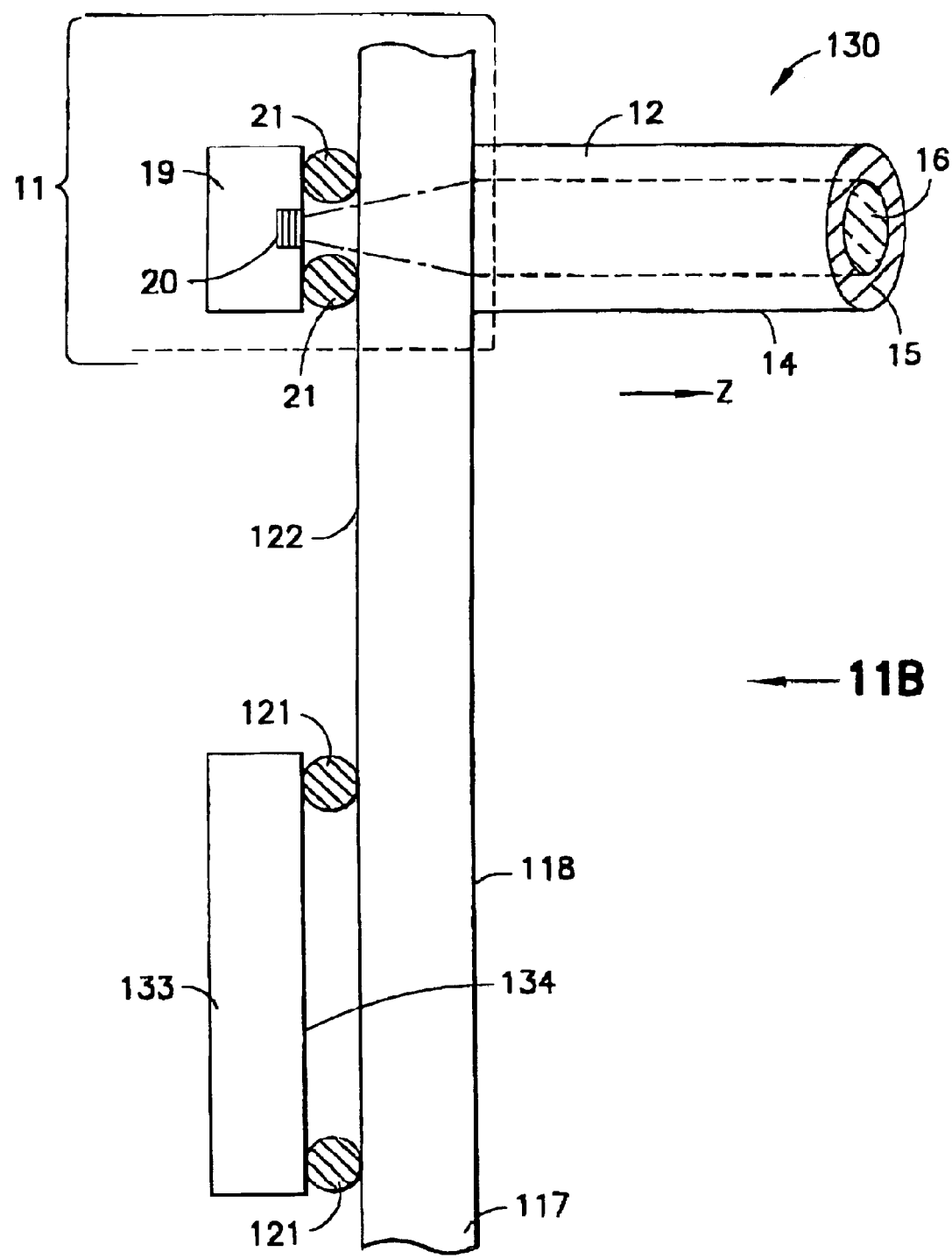
FIG. 11A is a schematic side view of an optical/optoelectronic interface of the invention, wherein an integrated circuit chip is flip-chip bonded to the transparent insulating substrate.

FIG. 11A is a schematic side view of an optical/optoelectronic coupling structure 130 of the invention, wherein a chip 133 comprising CMOS control circuitry is flip-chip bonded via conductive bonds 121 to the transparent insulating substrate 117. The optoelectronic device employed in this coupling structure is a light-emitting device, in this case a vertical cavity surface emitting laser (VCSEL) 20 formed in VCSEL chip 19. The coupling structure comprises (a) an integrated electronic-optoelectronic module 11 and (b) an optical fiber 12 in optical communication with the optoelectronic device. In module 11, the VCSEL chip (optoelectronic substrate) 19 is connected via conductive bonds 21 to the top surface 122 of transparent insulating substrate 117, which is selected from transparent insulating substrate materials such as glasses or crystalline materials such as sapphire or spinel. The control, driver, and input/output (I/O) circuitry are located on top surface 134 of integrated circuit chip 133, which is connected via conductive bonds 121 to the top surface 122 of transparent insulating substrate 117. Such electrical circuitry is typically CMOS circuitry, but may be any type of electrical circuitry that is desired for the application in which the optical/optoelectronic coupling structure is used. Integrated circuit chip 133 is typically silicon, but may be selected from silicon, GaAs, SiGe, and other integrated circuit technologies appropriate to the particular optical interface application. The electrical circuitry includes functions to control the optoelectronic device, in this case a VCSEL driver, and may include other functions needed to manage the optical signal transmission process. The electrical devices are typically CMOS devices, but may be bipolar, SiGe, GaAs, or any other integrated circuit technology useful for the particular optical interface application. Optical fiber 12 having optical core 16, cladding layer 15, and surface 14 is contacted end-on to the bottom surface 118 of the transparent insulating substrate 117.

As was described in detail above, the interface structure may optionally be provided with reflection management coating(s) on the region(s) of substrate 117 which are in the optical path. One or both of the top and bottom surfaces of the transparent insulating substrate may optionally be coated with an antireflective material in the area through which the optical path passes. The interface structure of FIGS. 13A and 13B may optionally further comprise a lens formed in the top or bottom surface of the transparent insulating substrate 117 and situated in the optical path between the optoelectronic device and the optical fiber core. Furthermore, a refractive index matching material such as an optical gel may optionally be present between the optoelectronic device and the top surface of the transparent insulating substrate.

Figure 11B:
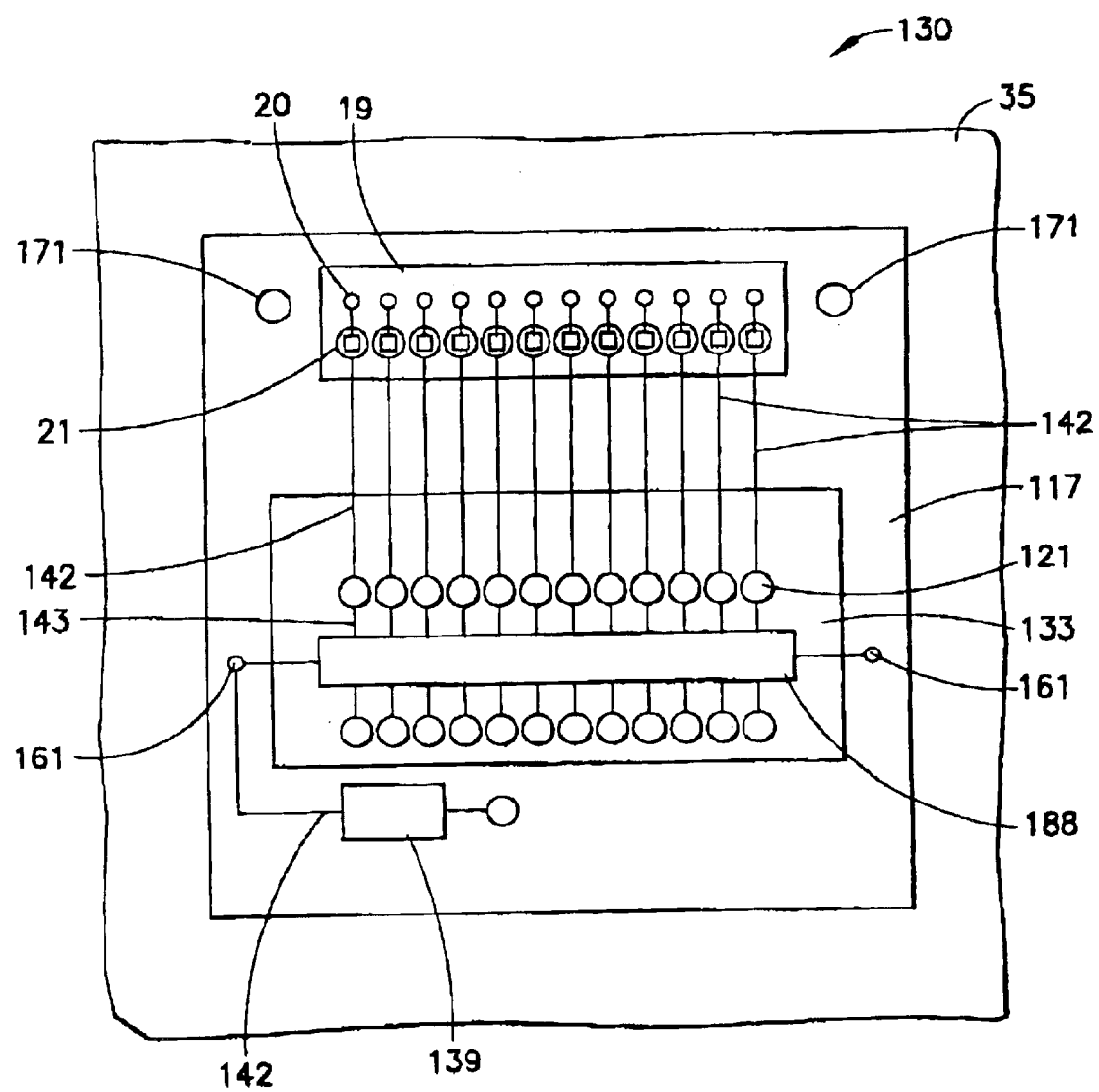
FIG. 11B is a schematic view of the optical output surface of an optical/optoelectronic coupling structure incorporating the elements shown in side view in FIG. 11A.

FIG. 11B is a schematic top view of an optical/optoelectronic coupling structure 130 incorporating the elements shown in side view in FIG. 1A, viewed in direction 13B. VCSEL chip 19 is mounted on base 35 (a flexible or rigid printed circuit, multichip module, or the like). The VCSELs may have back electrical contact connects to electrically conductive pathways on the base 35 (not shown). Alternatively, both VCSEL contacts may be formed to its top surface. The VCSEL driver and other control circuitry 188 are formed on integrated circuit chip 133. Such electrical circuitry is typically CMOS circuitry, but may be any type of electrical circuitry that is desired for the application in which the optical/optoelectronic coupling structure is used. Integrated circuit chip 133 is typically silicon, but may be selected from silicon, GaAs, SiGe, and the like. The electrical circuitry includes functions to control the optoelectronic device, in this case a VCSEL driver, and may include other functions needed to manage the optical signal transmission process. The top electrical contact to each VCSEL 20 is connected to the VCSEL driver via conductive bond 121, formed by flip-chip bonding or other suitable technique, and conductive traces 142, formed from a conductive material, e.g., aluminum, copper, or other metals or alloys, on the transparent substrate. Conductive traces 142 on the transparent substrate 117 provide electrical contact between the integrated circuit chip 133 and one or more optional passive devices 139. The passive devices can be capacitors, inductors or resistors. The passive devices can be formed on the transparent substrate 117 connected by conductive traces 142 or they can be mounted on the transparent substrate using soldering (such as surface mount) or flip-chip bonding techniques. Conductive traces 142 on the transparent substrate 117 provide electrical contact between integrated circuit chip 133 and the base 35 through conductive bonds 161.

Transparent substrate 117 is provided with guideholes 171 for passive alignment via complementary mating guidepins to the optical fiber-bearing ferrule. Because light is transmitted through substrate 117, the optical interface 130 avoids the parasitics associated with wire bonds and possesses improved physical robustness, since a fragile structure is avoided, and hence improved manufacturability.

FIGS. 12A–12E, 13A–13E, 14–17, and 21A–21E relate to an embodiment of the IC/OE package of the invention that employs an alignment method that depends on the accurate placement of mechanical alignment members such as guide pins relative to reference features on interior surface 22 of the transparent insulating substrate. The FIG. 1 system 110 is an example of a package made by this approach. The guide pin holder or the guide pins themselves can be placed together or separately by highly accurate "pick-and-place" machinery used in standard IC package assembly.

In FIGS. 12 through 17 the IC/OE package of the invention is illustrated by describing a small scale package for optoelectronic and electronic devices, configured to optically interface an integrated transceiver such as was shown in FIG. 3, which includes two light receivers (photodetectors) and two light emitters (vertical cavity surface emitting lasers), with a 1×4 array of optical fibers. It will be readily appreciated that small scale packages according to the invention may be built with one or an array of many optoelectronic devices, selected from devices that emit, detect, or manipulate light; for example, photodetectors, lasers, light-emitting diodes, photomodulators, and so forth. The optoelectronic devices may all be of the same type, e.g., VCSELs (for sending optical signals); photodetectors (for receiving optical signals). Alternatively, the optoelectronic devices may be of two or more types, e.g., the example shown of a transceiver comprising light receiving elements (photodetectors) and light emitting elements (VCSELs). The number of optoelectronic devices may vary from one to arrays of many devices, e.g., 1×4; 1×12; 2×12; or larger arrays as are needed for the application. Optoelectronic devices are often manufactured and sold as arrays; the small scale package of the present invention is useful for all of these arrays, and because of its planar nature is not limited to small size arrays. Thus the figures are generally illustrative and are not to be construed as limiting to a particular number or type of optoelectronic device.

FIG. 12A is an exploded side-view schematic representation of an embodiment of the small scale package of the invention, including an interposer board, as in system 100 of FIG. 1. The system is mounted on another support 235 for insertion into an optical network connection. Keying features 247 in the heat sink 105 make it convenient to attach the package 10 to a mounting surface. Guide pins 72, positioned accurately with respect to alignment reference marks on the interior OE surface of 17, extend in the z direction from out of the optical output surface 18 of transparent substrate 17, and can mate with complementary guide holes in optical connector 68 to form a highly precise mechanical alignment between the fibers and OE devices on the interior OE surface of 17, which are also positioned accurately with respect to alignment reference marks on the interior OE surface of 17.

Figure 12B:
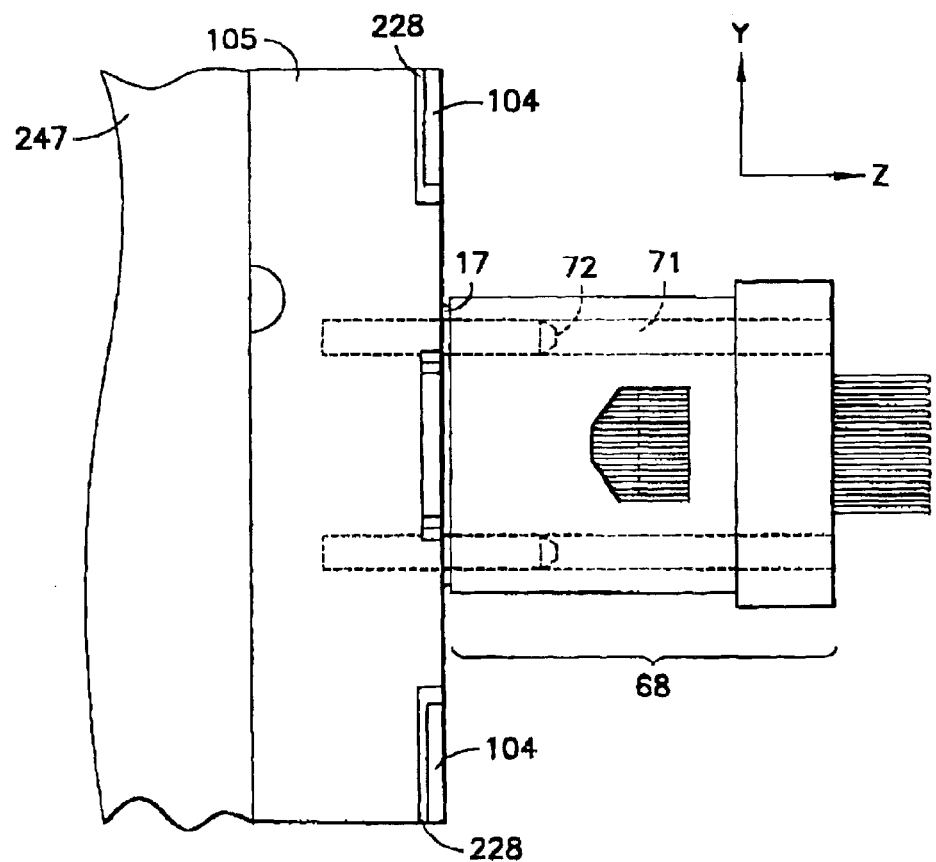
FIG. 12B is a top view of the package of FIG. 12A in tight connection with a fiber optic connector.

FIG. 12B is a top view of the package of FIG. 12A in tight connection with a fiber optic connector 68. FIG. 12C is an exploded side-view schematic representation of the FIG. 12A embodiment of the small scale package of the invention, aligned for coupling with an array of optical fibers mounted in a fiber optic connector 68. FIGS. 12D and 12E are front and back views of a subassembly of the small scale package of the invention, comprising the transparent insulating substrate with flip-chipped optoelectronic devices, attached to a precision guide pin retainer.

Transparent substrate 17 and its flip chip bonded OE dies 19 and 49, is attached through substrate top surface 22 to a supporting member 104 which bears electrical traces for forming electrical interconnections; 104 typically comprises a printed circuit board-like material. PCB-like support member 104 is provided with BGA or solder bump electrical connections 244, which will be used for testing the small scale package and can be used in the end-application as well. A thermally conductive support member 105 acts both as a heat sink and as a physical support; its back surface 106 can provide interface functions to attach the small scale package to, for example, a printed circuit board bearing various other functional elements. In preferred embodiments, support member 105 is a copper heat sink shaped to optimally remove heat from the electronic circuits, e.g., by having a front face which has a profile that brings it quite close to substrate 17. The PCB-type support member 104 is bonded to 105 by adhesive material 228, which is preferably thermally insulating. On the other hand, the flip-chip structure 10 is bonded to the heat sink 105 by adhesive material 229, which is selected to be highly thermally conductive. In this way, heat generated by the electronic circuits on 17 can be efficiently transferred to heat sink 105. Guide pins 72 are held in place by a precision alignment insert 84; they fit into recesses 125 in heat sink 105; the space between recesses 125 and the guide pins 72 is filled with thermally insulating adhesive material 228.

The precision alignment insert 84 is shaped to accurately retain the guide pins at a precise spaced-apart relationship, so that when it is accurately positioned and bonded to the transparent insulating substrate, optical fibers can be precisely aligned with the optoelectronic devices, which were also precisely positioned on the transparent insulating substrate. In preferred embodiments, the precision alignment insert is made of a plastic that has a close coefficient of thermal expansion match to the guide pins and optical fiber ferrule materials. In especially preferred embodiments, the precision alignment insert is molded from the same plastic material that the guide pins are made of.

The small scale package of FIG. 12 is a "male" package—it will mate with guide holes in an optical ferrule by means of the guide pins. It will readily be appreciated that the invention also comprehends "female" small scale packages. The small scale package could to similar effect include guide holes, which would act as receptacles to mate with guide pins from an optical ferrule.

Figure 13E:
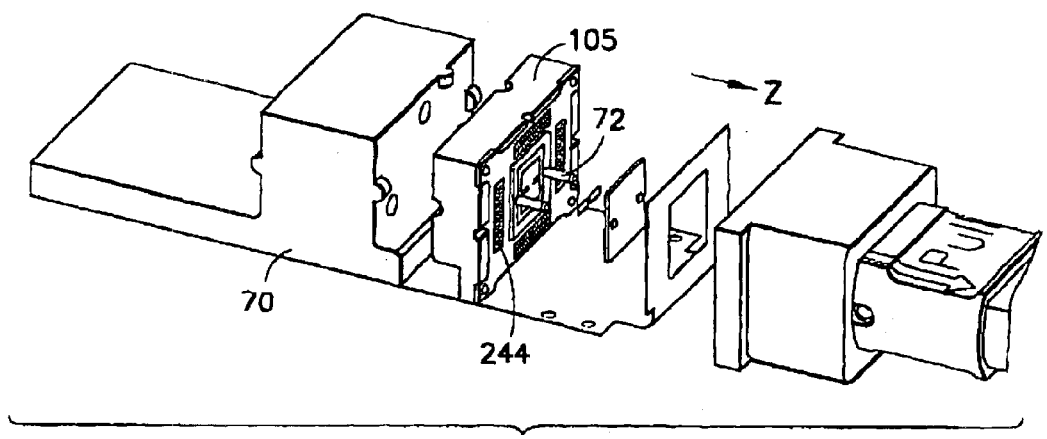

FIGS. 13A–13E show an exploded schematic view of a package according to FIGS. 4B and 12, comprising an interposer board (FIG. 13A); to which is mounted a transparent insulating substrate flip-chip bonded to optoelectronic devices (FIG. 13B); aligned by means of guidepins to an array of optical fibers (FIG. 13C) which are positioned in a fiber optic connector (FIG. 13D); the package includes a heat sink and is mounted on a support structure (FIG. 13E).

Figure 14:
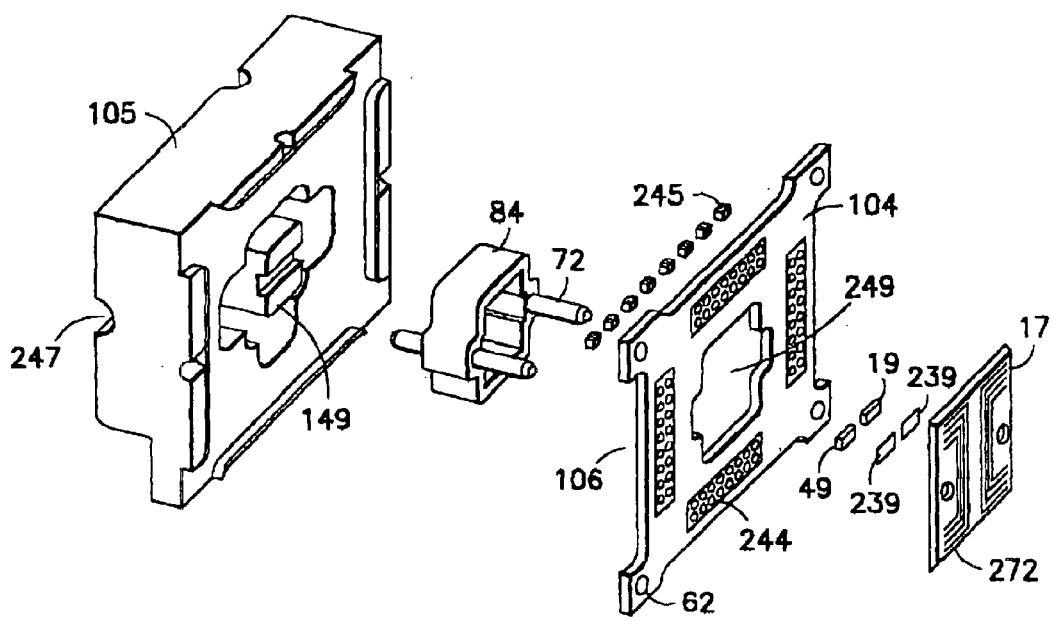
FIG. 14 is an exploded side view schematic of a small scale package according to the present invention.

FIG. 14 is an exploded side view schematic of a small scale package 108 according to the present invention, as shown in FIG. 13. Heat sink support member 105 has keying features 247 for interfacing to an assembly substrate. Layer 246 represents the areas that are bonded by the thermally insulating adhesive material (material 228 in FIG. 2), for example an epoxy or other suitable polymer. Precision alignment insert 84 holds guide pins 72 in a precise spaced-apart relationship. Layer 248 represents areas that are bonded by the thermally conductive adhesive (229 in FIG. 17). Capacitors 245 are attached to back surface 106 of the PCB-like support member 104, which is provided with an open area 249, sufficiently smaller in dimensions that the transparent insulating substrate 17 can be bonded to it around its periphery 272. PCB-like support member 104 has arrays of BGA electrical contacts 244, as needed for forming electrical connections to the components of the small scale package. Optical underfill material 239 is situated between OE device chips 19 and 49 and the transparent insulating substrate 17, which is provided with holes 71 which, as described above, may be sized to function as guide holes or as clearance holes.

Figure 15:
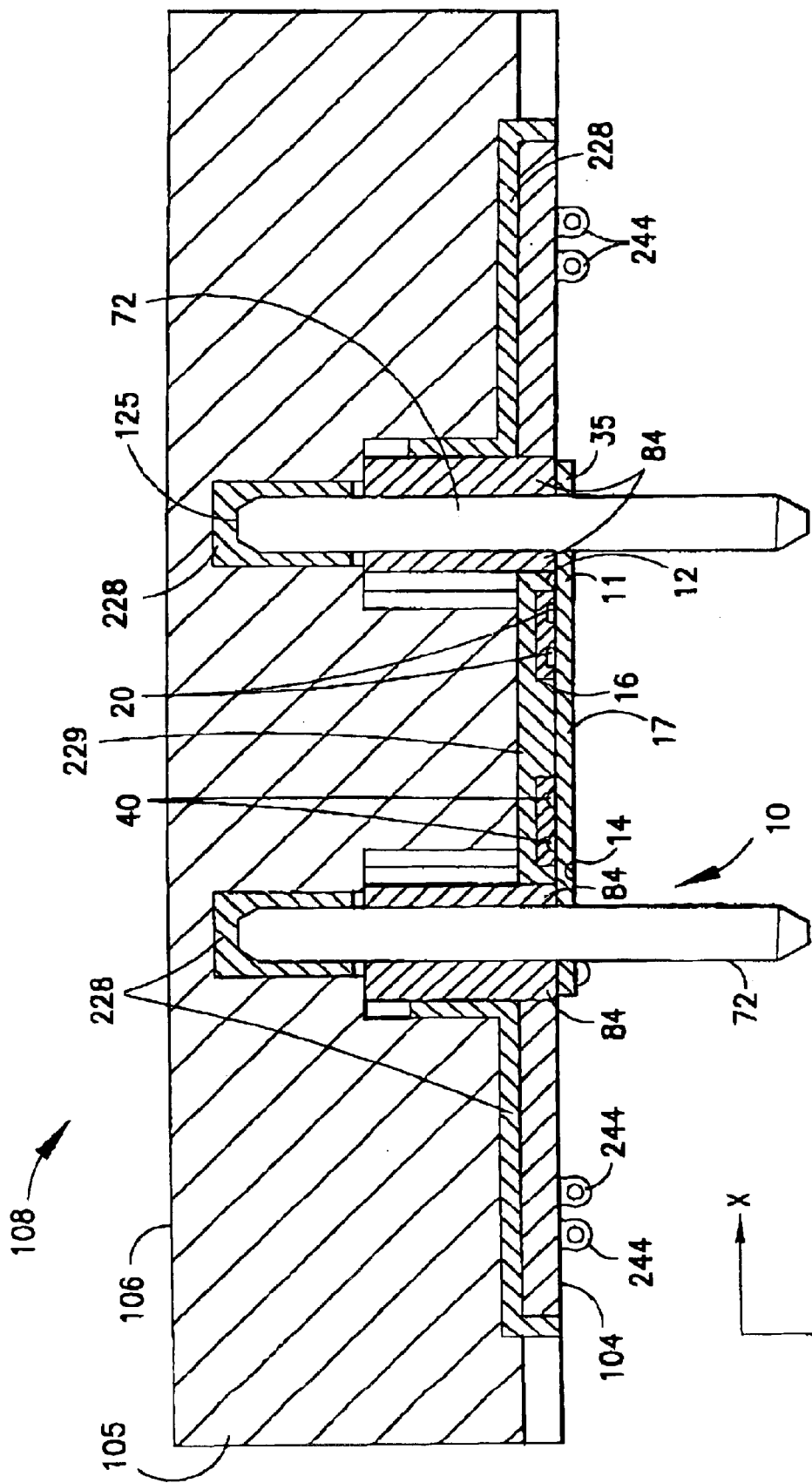
FIG. 15 is a side view cross-section schematic of a small scale package according to the present invention.

FIG. 15 is a side view cross-section (per the dotted line in FIG. 16) schematic of a small scale package 108 according to the present invention, which incorporates an integrated flip-chipped electronic/optoelectronic structure such as the structure shown schematically in FIG. 3.

FIG. 16 is a front view schematic of the assembled small scale package 108 of FIG. 14. Visible through transparent insulating substrate 17 are the OE dies 19 and 49, flip-chipped to the interior surface 22 of 17. Also on the interior surface 22 of 17 is electronic circuitry 257 and conductive traces 256, which electrically connect to the OE devices via the flip chip bonds and to various conductive traces on PCB-like support 104. For simplicity, these latter traces are not shown, but it will be understood that they connect to one or more of BGA electrical connections 244 and thence to the "outside world," that is to the other functionalities that will be present in the final product of which small scale package 108 will be a part.

Figure 17:
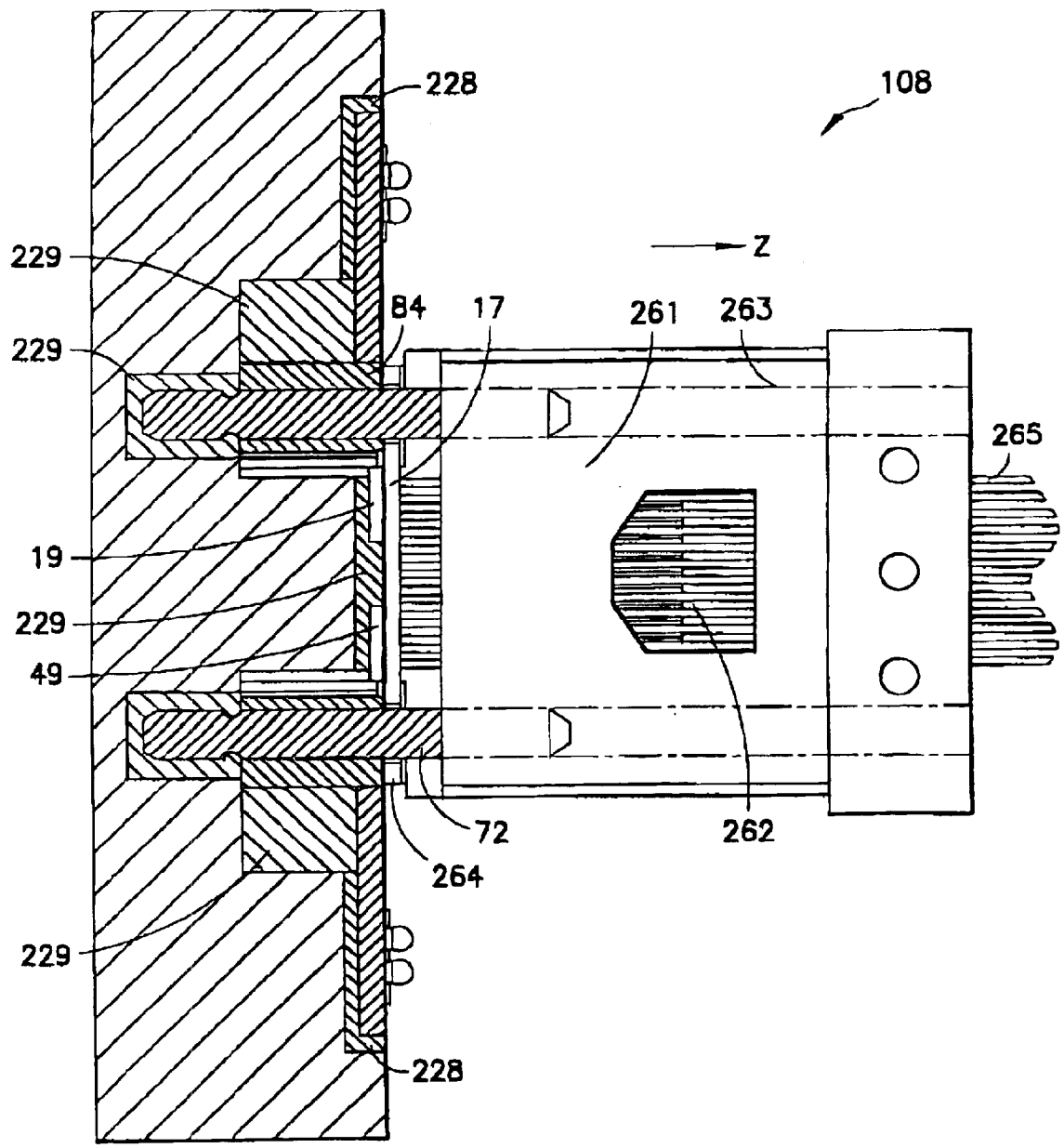
FIG. 17 is a schematic side view cross-section of the small scale package according to the present invention, aligned with an array of optical fibers to form an optical/optoelectronic module.

FIG. 17 is a schematic side view cross section (per the dotted line in FIG. 16) of the small scale package of FIGS. 12–16, aligned with an array of optical fibers to form an optical/optoelectronic connection. The optical fibers 262 are shown in a "ribbonized" array 265 mounted in optical ferrule 261, which has guide holes 263 through which guide pins 72 are inserted. Optional interlayer 264 which may be a flexible polymeric material or an adhesive, provides an interface between the ferrule and the small scale package, and may be selected to provide mechanical cushioning if needed.

The fiber employed in FIG. 17 may be any light transmitting fiber, such as standard glass optical fibers, plastic optical fibers, or bundled arrays of fibers, or can be a waveguide of any size- and function-suitable type. The configuration provided by the inventive coupling structure is advantageous for optically interfacing to many light-guiding structural types. Furthermore, optical fibers may be of the multimode or single mode type.

In general, the precision with which the optical fiber cores can be brought into registration with the optoelectronic devices depends on the precision of:

(5) the positioning and precision of the spacing of the optoelectronic devices on the optoelectronic substrate;

(6) the spacing of the optical fiber cores in the ferrule or other array housing or V-groove substrate;

(7) the precision of placement of the optoelectronic device array bonding to the transparent substrate with respect to features on the transparent substrate (or to the substrate guide holes); and (8) the precision of placement of the precision alignment insert bonding to the transparent substrate with respect to features on the transparent substrate.

With regard to the first factor, the OE devices are formed lithographically in standard semiconductor processing steps; they are produced with high precision. As to the second factor, the standard optical fiber ferrules such as MT connectors have well-defined tolerances of +/− as little as 2 μm. The third and fourth factors are well-controlled, as automated processes that optically align and place objects within very close tolerances have become well-developed in the electronics industry.

The addition of a plastic injection molded optics (or glass array held precisely in a plastic molded part) between the sapphire and fiber cores allows coupling to SMF, enhanced MMF coupling or operation in a CWDM system. For SMF application the fiber core is typically 8 μm of less in diameter. The SMF MT ferrule exists in high precision form, with alignment tolerance from guide pin center to fiber less than +/−0.3 μm. Flip-chip machines with +/−1 μm tolerance are commercially available. An injection molded plastic lens array (commercially available) can achieve efficient coupling when aligned between optoelectronic devices and SMF cores. This lens is passively aligned to the fiber core and optoelectronic device using the guides.

For high bandwidth (10 Gbps or higher) operation it may be desirable to achieve better fiber performance (reduced DMD) by using a special launch condition. The launch condition specifies the properties of the optical beam entering the fiber core. For example, the IEEE committee for 10 GbE is considering a condition in which more than 86% of the light is within a radius of 19 um of the fiber core and less than 30% of the light should be within the center 4.5 um radius. An injection molded plastic lens array (commercially available) can achieve this launch condition. This lens is precisely aligned to the fiber core and optoelectronic device using the guides.

For CWDM applications the light from an array of VCSELs, each having a different wavelength is combined into a single fiber core. An injection molded CWDM component (commercially available) can be placed between the optoelectronic devices and fiber to achieve this function. This part can also be supplied between fiber and multiple detectors so that each detector receives only a single wavelength. This component is precisely aligned to the fiber core and optoelectronic device using the guides.

Operation

FIG. 18 shows plots of coupling efficiency vs. traverse displacement (μm) for a VCSEL coupling to a multimode optical fiber through sapphire substrate of 150 micron thickness for various VCSEL devices.

FIG. 19 shows plots of coupling efficiency vs. tranverse displacement (μm) for a PIN photodetector coupling to a multimode optical fiber through sapphire substrate of 150 micron thickness for various PIN photodetector devices.

Figure 20:
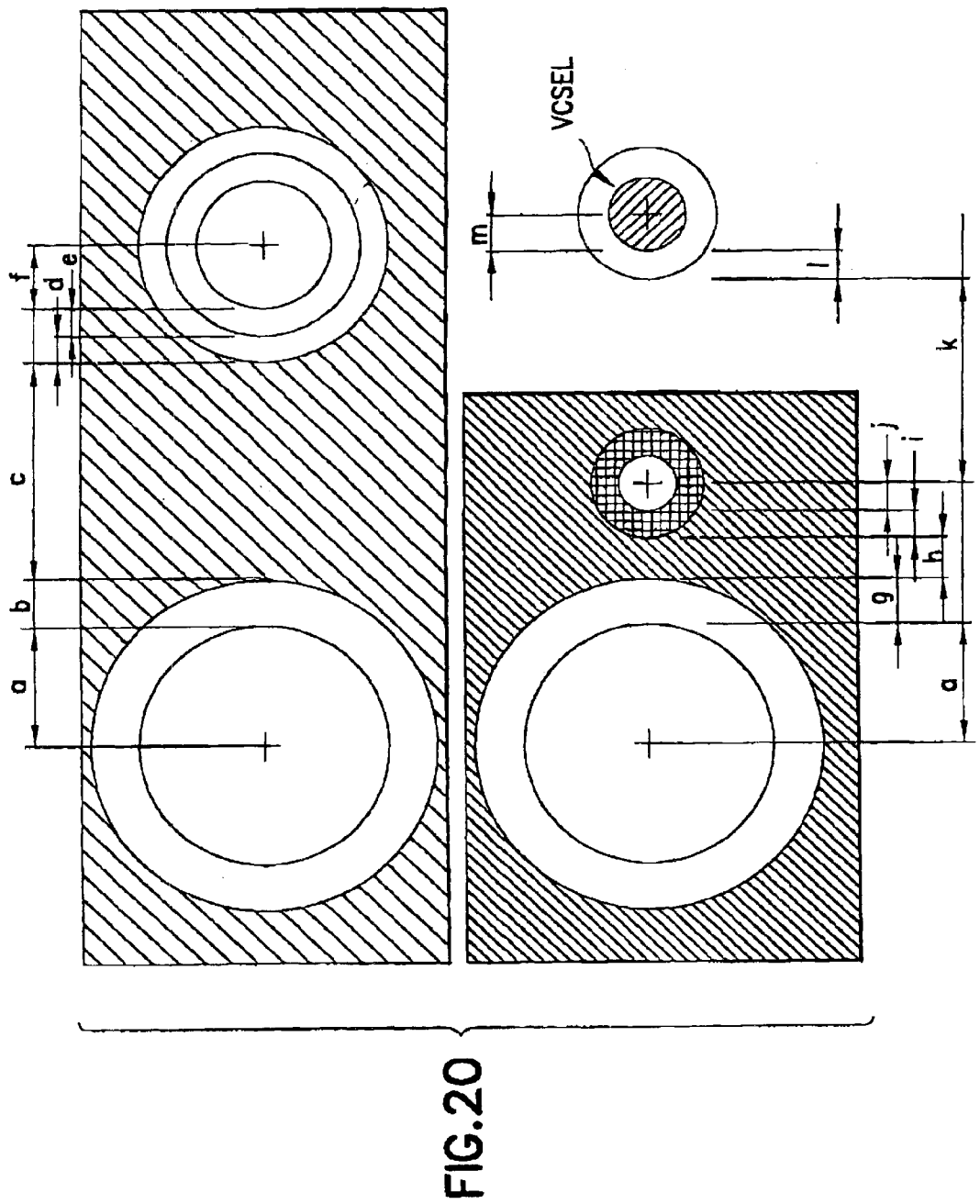
FIG. 20 is graphical depiction of the alignmentvariance for the factors that contribute to overall alignment error in a package such as shown in FIGS. 13–17.

FIG. 20 is a graphical representation of the table below showing the alignment tolerance and variance for the factors that contribute to overall alignment error in a package such as shown in the figures. The upper portion of FIG. 20 describes the alignment of the guide pin center to the fiber core for an MT ferrule. This alignment accuracy can be determined by the accuracy of sub-sections a-f, where "a" is the guide pin diameter, "b" is the guide pin hole diameter in the MT ferrule, "c" is the distance between the guide pin hole and the hole containing the fiber, "d" is the fiber hole diameter, "e" is the fiber cladding and "f" is the fiber core centricity. The lower portion of FIG. 20 describes the alignment of the OE device to features on the substrate; and the alignment of the guide pin holder (labeled here as precision molded pin alignment—PMA) to features on the substrate. This alignment accuracy can be determined by the accuracy of sub-sections a, and g-m, where "a" is the guide pin diameter, "g" is the PMA guide pin hold diameter, "h" is the distance to the alignment feature on the PMA, "i" is the placement accuracy of the PMA to the alignment feature on the substrate, "j" is the accuracy of the alignment feature on the substrate, "k" is the distance between the substrate alignment features for attaching the PMA and OE device, "l" is the placement accuracy of the OE device on the substrate and "m" is the accuracy of the alignment features on the OE device. The alignment of these sub-sections is stated as a tolerance and is the 3-sigma number in the second column. The variance of each subsection is in the third column. From these variances, an overall sigma can be calculated as 3.07 um. The probability of aligning 12 fibers with a certain accuracy is conservatively estimated by the probably of aligning a single fiber to the $12^{th}$ power. Using Gaussian statistics, the 3-sigma probability of aligning 12 OE devices to fibers is equal to the probability of aligning a single fiber of 3.7 times sigma to the $12^{th}$ power. Therefore the overall three sigma number for this example is 11.4 microns. When considering the CTE mismatch between the MT ferrule and OE device substrate of 1.7 microns over 60° C., the overall 3 sigma number is 13.1 microns.

The above example describes typical tolerances of MT ferrule and fiber for multi-mode applications. For single mode applications, both the MT ferrule and fiber have tolerances that are less than their multi-mode counterparts by a factor of 10 or more.

In summary, the IC/OE packaging system of the present invention provides significant performance advantages. An optoelectronic device packaging system is intended to provide optical connectivity to an external optical transmitter or receiver (e.g., optical fiber, waveguide etc.) must provide means for accurate alignment of the OE device light input/output with the optical transmitter or receiver (e.g., optical fiber core) so that a low-loss, efficient optical couple can be formed. A useful optoelectronic device packaging system will also provide the electrical circuitry and electrical features that are needed for OE control and signal handling.

The IC/OE packaging system of the invention in a preferred configuration provides mechanical alignment members for passive alignment to complementary mechanical alignment members in the optical transmitter or receiver housing.

The IC/OE packaging system of the invention enables an optoelectronic optical coupling interface to be made in a highly advantageous way. The IC/OE packaging system configures the packaged optoelectronic device in such a way that an optical link is provided to an external optical transmitter or receiver (e.g., optical fiber, waveguide etc.) and that optical link passes through a transparent insulating substrate. This "through-substrate" optical coupling configuration yields a high performance package, because (1) the OE device is (a) flip-chipped to a first surface of the transparent insulating substrate or (b) formed in a layer of an electronic material deposited on an area of the first surface of the transparent insulating substrate; and (2) the electrical circuitry and electrical features that are needed for OE control and signal handling are (a) formed in a layer of silicon deposited on an area of the first (same) surface of the transparent insulating substrate or (b) flip-chipped to the first (same) surface of the transparent insulating substrate. By contrast with the prior art connector of U.S. Pat. Nos. 6,137,929 and 6,318,909, the IC/OE packaging system of the present invention avoids the need to use wire bonds to electrically connect the OE device to associated silicon circuitry located on a separate IC chip, with the consequent degradation of electrical performance associated with the use of wire bond elements, as well as avoiding the need to insert an additional optical device such as an optical face plate or fiber image guide to bridge the stand-off distance between the OE device and the optical fiber core that is a result of the high profile of the wire bond.

U.S. Pat. Nos. 6,130,979 and 6,227,720 described reducing the number of wire bonds by flip-chip bonding an array of surface-emitting lasers to bonding pads on a lead frame, where the bonding pads are in a specific positional relationship to guide holes in that lead frame, and using guide pins to align the surface-emitting laser array to an optical fiber array in a fiber optic connector having the corresponding guide holes. The lasers emit light perpendicular to the plane of the lead frame. However, surface-emitting lasers do not emit a collimated light beam but rather emit light in a cone that diverges at a cone angle that is approximately 30° in air. All known and available surface-emitting lasers are sensitive to environmental variables such as moisture and must be protected by encapsulation or a protection plate, and when that is done, forming a tight optical couple between each laser and each corresponding optical fiber core becomes impossible. Furthermore, mounting the OE devices on a lead frame (a common type of chip package that uses metal lead that extend outside the housing) obviates many of the advantages of a unitary IC/OE packaging system by introducing the electrical parasitics associated with the electrical leads. By contrast, the IC/OE packaging system of the invention enables the OE devices to be directly flip-chipped to the transparent substrate surface bearing the electrical circuitry and to transmit light through it to the optical fiber cores.

U.S. Pat. No. 6,243,508 described an OE device flip-chipped to a first surface of a transparent substrate and optically coupled through-substrate to an optical waveguide by means of a lens system that is either formed in or attached to a second, opposite, surface of the transparent substrate or that is formed in the first surface of the transparent substrate and located underneath the flip-chipped OE device. In all cases, alignment of the flip-chipped structure to the optical waveguide is provided by alignment features in the second surface of the transparent substrate; the OE device must therefore be accurately aligned through-substrate to features formed on the opposite substrate surface. Aligning features on one plane of a substrate through the substrate to features on the opposing plane of the substrate sacrifices alignment accuracy, and lenses are then necessary for good optical coupling. However, the inclusion of lenses entails significant disadvantages, such as adding substantial cost to the overall module by virtue of additional componentry involved and associated increases in processing time and complexity, as well as increased yield losses resulting from misalignment or misprocessing of the lenses. When the lenses are processed at the wafer scale, errors in processing or alignment can ruin an entire processed wafer of integrated circuitry. A lens intended for positioning beneath a flip-chipped device would need to be fabricated by etching its form into the substrate (expensive, technically difficult) since the more common polymer lenses would deform under the temperature conditions of subsequent processing steps, e.g., bonding. Furthermore, if the OE device is a laser, reflection of light output from the laser back into the laser cavity can cause undesirable fluctuations in the optical output power of the emitter. If too much power is coupled back into the laser from the reflection from the end of the optical fiber, instabilities occur in the laser and the output power oscillates up and down, causing extra and damaging amounts of jitter as the received signal pulses. The aperture (which defines the area in which light exits the laser cavity) of a typical VCSEL device is less than 15 microns in diameter. Unfortunately, an optical lens can perform efficient coupling of back-reflected light into the laser cavity by focusing light to a small area on the laser aperture. This problem has been recognized; e.g., U.S. Pat. No. 6,349,159 ("Lenses that launch high bandwidth modes into a fiber optic cable while eliminating feedback to a laser") describes a lens designed such that light reflected from the end of the optical filter is not focused at a location at which the light is emitted by the laser.

By contrast, the IC/OE packaging system of the invention provides an alignment system that efficiently provides accurate and precise through-substrate optical coupling between flip-chipped OE devices and external optical transmitters or receivers. The inventive alignment system for the IC/OE packaging system aligns all components of the system to alignment reference marks formed by photolithography on the same, first surface of the transparent substrate (the OE or "master alignment" surface). The IC/OE packaging system provides through-substrate optical coupling while avoiding the need for any through-substrate alignment steps and their consequent loss of precision. The mechanical alignment members are aligned to the alignment reference marks on the first surface and by means of openings in the transparent substrate provide passive alignment to external optical transmitters or receivers that are butted up to or in very close (near-contact) proximity to the second (optical output) transparent substrate surface. Consequently, lens assembly is not required, and any accessory pieces can be added onto the mechanical alignment members after fabrication.

Manufacturing

Optoelectronic small scale packages suitable for use in optical-optoelectronic coupling structures are made by methods that include the general steps of:

(1) providing a suitably sized opening in a PCB-like support member;

(2) bonding to the PCB-like support member a transparent insulating substrate having silicon electronic circuits on a top face and clearance or guide holes through it, positioned over the opening and bonded around its periphery;

(3) flip-chip bonding OE chips to the top face of the transparent insulating substrate, positioned in precise spatial relationship to features on the transparent insulating substrate or to its guide holes, and located so that the OE devices emit or receive light through the transparent insulating substrate in areas that are clear of silicon circuitry;

(4) filling the space around the OE chips and the silicon electronic circuits with an optical fill material for protection from moisture and other deleterious environmental effects;

(5) adhesively bonding a precision alignment insert (suited for holding alignment means such as guide pins) to the top face of the transparent insulating substrate, positioned in precise spatial relationship to features on the transparent insulating substrate or to its guide holes, and located so an optical fiber ferrule or waveguide using the alignment means will be positioned such that the OE devices emit or receive light through the transparent insulating substrate and such light will be one-to-one optically coupled with the optical fibers or waveguides;

(6) bonding a thermally conductive support member (for example, a copper heat sink) to the insert and the transparent insulating substrate by means of a thermally conductive adhesive in areas where it is desired to remove heat from the electronic circuits and by means of a thermally insulating adhesive in areas where it is desired to minimize heat flow towards the temperature-sensitive optoelectronic devices.

The PCB-like substrate is provided with solder bumps; these can be provided at various steps as is most convenient. It will be appreciated that the steps shown above can be carried out in different orders than shown.

Figure 21A:
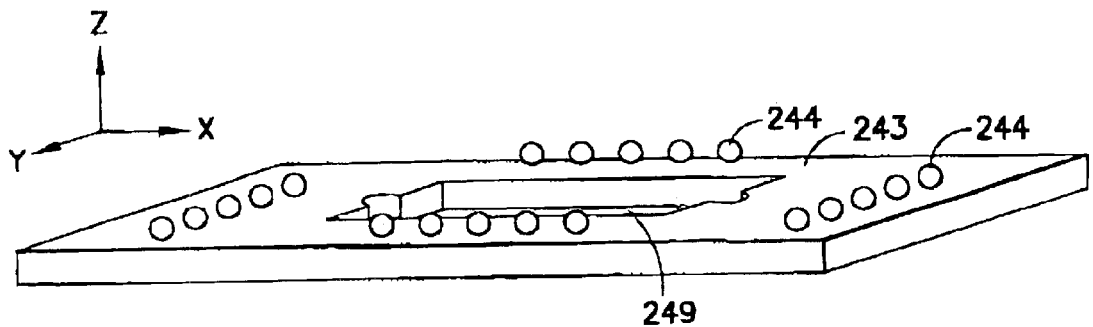
FIGS. 21A–21E depict schematically stages in the assembly of the small scale package according to the present invention.
Figure 21B:
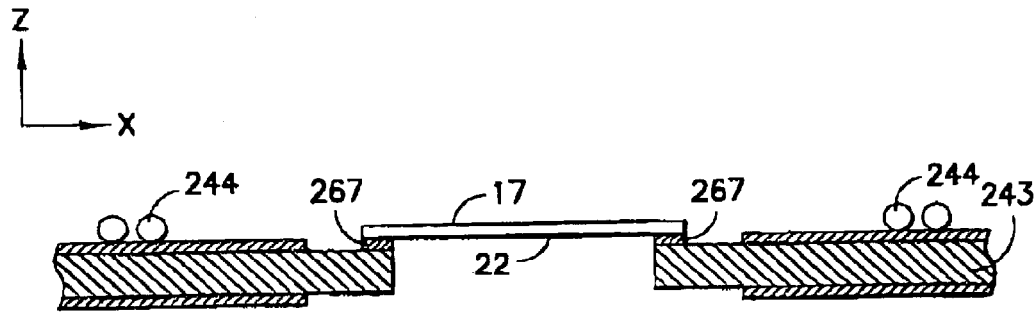
Figure 21C:
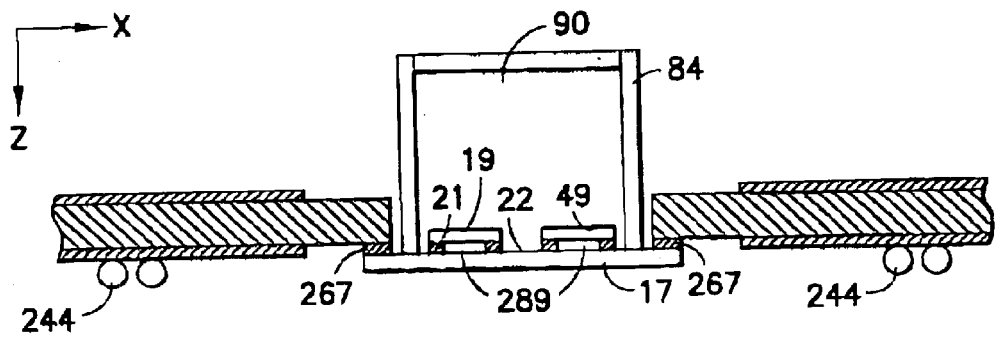
Figure 21D:
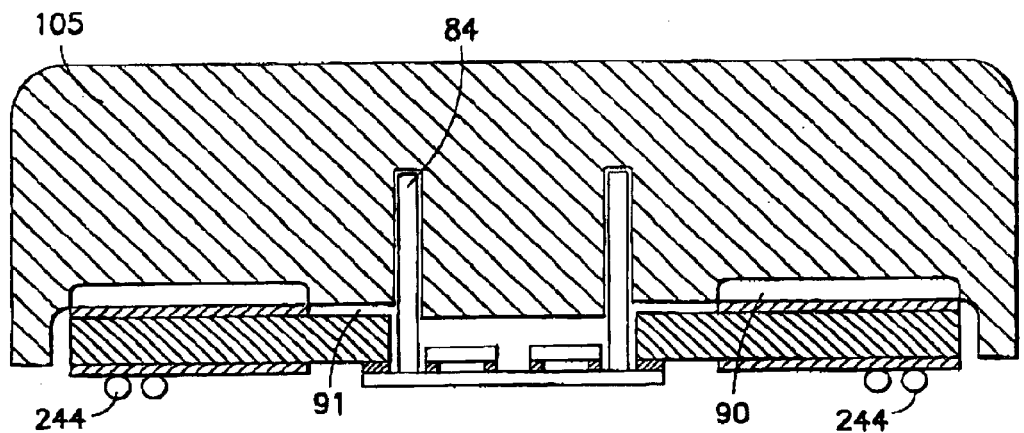
Figure 21E:
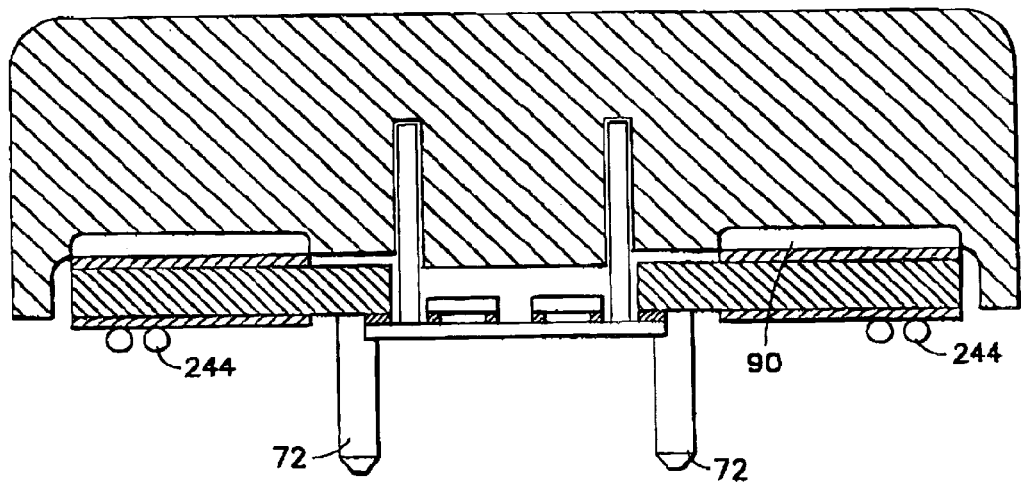

FIGS. 21A–21E show the package at various stages in this assembly process. FIG. 21A shows the PCB-like support member 243 provided with a suitably sized opening 249 and BGA electrical connections 244. FIG. 21B shows in cross-section the transparent insulating substrate 17 bonded to the PCB-like support member 243 via bond 267, which can be any electrically conductive bonding material. The bond can be formed by known methods such as thermal compression, flip chip bonding, etc. or using a conductive adhesive, e.g., silver epoxy. In FIG. 21C, OE chips 19 and 49 have been flip chip bonded to the top surface 22 of the transparent insulating substrate 17, and the precision alignment insert 84 has been positioned and bonded to the transparent insulating substrate. Optical fill material is deposited in spaces 289; thermally conductive adhesive is deposited in space 90; it will serve to draw heat away from 17. In FIG. 21D the molded thermally conductive support member 105 has been attached via a thermally insulating adhesive in space 91, as well as the thermally conductive adhesive that is deposited in space 90. In FIG. 21E the guide pins 72 have been inserted for alignment to an optical fiber ferrule or waveguide.

This is a component designed for assembly using standard semiconductor equipment normally used for assembling and packaging integrated circuits, but not IC-OE modules. The component can be assembled in large batches and manipulated with standard IC component handlers. These handlers can feed assembly parts into high volume flip-chip machines and associated processes. Handlers can also feed components through burn-in and testing equipment.

An optoelectronic module as defined here is a module that performs electrical communications to a printed circuit board and optical communications, typically to fiber-based waveguides. All modules perform a basic conversion of signaling between electrical and optical formats. In addition to this basic function, modules can perform functions of electrical signal processing, such as serializing/deserializing data channels or switching data between channels. Modules may also perform optical signal processing, such as wavelength division multiplexing and demultiplexing. All modules provide an interface to electrical signaling, such as a socket for mounting on a printed circuit board, and provide an interface to optical waveguides, such as MTP receptacle.

This invention describes a component designed for assembly into a module, and is generally not suitable as completed module. The incorporation of this component into a module may require additional assembly of electrical, optical and thermal interface hardware. This component was designed to reduce the cost associated with assembling a complete module. To accomplish cost reduction, we introduce a novel process flow to the module assembly industry. The flow is outlined as follows:
1. Wafer level fabrication of optoelectronic devices, integrated circuits and patterning of transparent, insulating substrate.
2. Wafer level testing of optoelectronic devices and integrated circuits.
3. Dicing of wafers and assembly of known good die into component form.
4. Burn-in, stress and functional testing in an electrical socket with optical access.
5. Final module assembly.

Step 1 is the current fabrication methods, including methods where some or all integrated circuit functions may reside on the optoelectronic wafer or transparent, insulating substrate. Step 2 describes the current method of low-speed wafer screening of optoelectronic devices. For example, in VCSEL testing, parameters such as threshold current and slope efficiency are measured. Wafer level testing of integrated circuits may include tests of high-speed operation. Step 3 describes dicing and sorting of known good optoelectronic and integrated circuit die. Step 4 describes placing the component in sockets for burn-in, stress and functional testing. Burn-in and stress testing is performed only if required. Sockets defined by industry standards, such as the Joint Electron Device Engineering Council (JEDEC) are preferred due to existing industry infrastructure. Sockets are currently available that provide high fidelity electrical signaling over a lifetime of 10s of thousands of repeated component insertions. The testing socket includes a method of coupling light between optoelectronic devices and waveguides. This method of coupling light allows for testing the coupling efficiency between the optoelectronic devices and waveguides. The testing at this stage determines the performance of the integrated circuitry in conjunction with the optoelectronic devices. This testing also measures if the assembly process achieved adequate alignment between optoelectronic devices and guide-pins.

At this stage in the process flow, the component is packaged so that optoelectronic devices are protected from the environment and electro-static discharge. The packaging ensures the component will remain operational through subsequent processing and handling steps, such as multiple solder reflow temperature cycles, solder wash stages, and shipping through uncontrolled environments. In other words, the component is in a form appropriate for handling in a manner similar to that of a packaged integrated circuit.

The step of assembly is the addition of final electrical, optical and thermal hardware to build a module. An example of electrical hardware is a flexible circuit board with a socket connector, such as a Berg Meg-Array connector. Examples of optical hardware are plastic molded lens arrays with holes for alignment to guide pins and MTP connector receptacle. Additional heat sinking may also be required for certain applications.

This assembly method contrasts to previous art on semi-wafer assembly and is testing, which assembles optoelectronic components on all integrated circuits on a wafer before testing. This method exposes the risk of assembling relatively expensive optoelectronic devices onto a non-functional integrated circuit, and associated higher yield loss expense.

While the figures above show the small scale package structure employing one integrated circuit chip, in general, the small scale package may further comprise additional integrated circuit chips bonded to the transparent substrate and electrically connected by means of electrically conductive traces. These additional integrated circuit chips would provided added functionality such as input/output and communication functions.

It will be appreciated that an m×n array of optoelectronic devices may interface with an m×n array of optical fibers by means of the small scale package structures of the invention. Currently, many optical fiber arrays are 1×12 arrays, but 2×24 arrays are available, and the size of the m×n arrays is expected to grow significantly as optical networks increase in size and complexity.

It is desirable to produce a component suitable for handling and testing using current semiconductor industry methods. These methods allow for high-volume production of low cost packaging containing integrated circuits. The key to this handling and testing is the sockets used for burn-in and testing. These sockets accommodate repeated component insertions and removals while maintaining strict mechanical and electrical operating tolerances. Sockets commercially available today allow testing of ball grid array and chip scale packaging at frequencies above 5 GHz. It is desirable that the electrical I/O of the component are electrostatic discharge protected.

Figure 22:
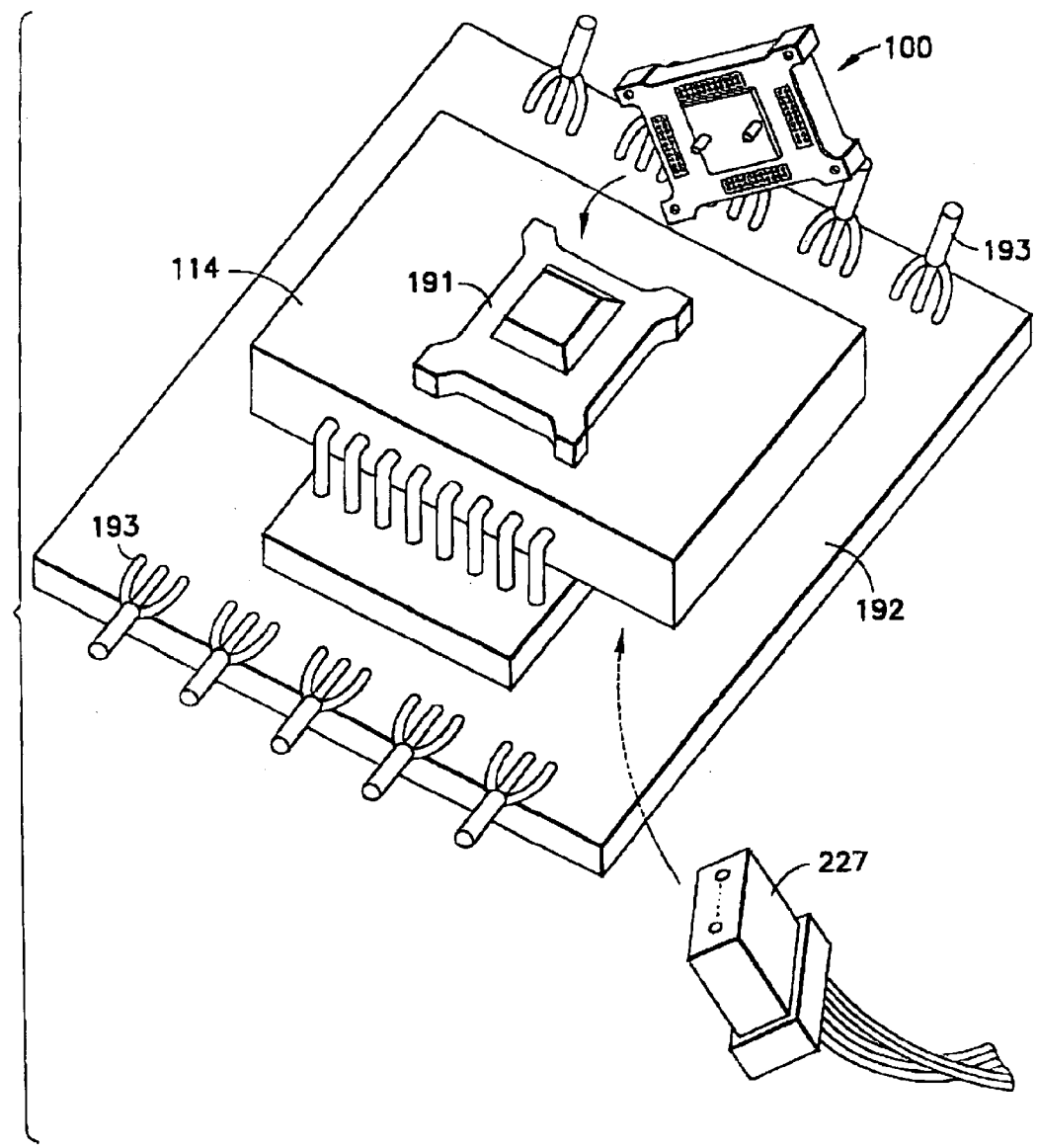
FIG. 22 depicts a small scale package according to the present invention, a fiber optic connector, and a test fixture for testing the electrical and optical performance of the package.

FIG. 22 depicts a small scale package according to the present invention, a fiber optic connector 227 for providing sources and/or receivers for testing the OE devices in package 100, and a test fixture 114 for testing the electrical and optical performance of the package. The test fixture has electrical connections 193 to power supply and test circuits for testing the electrical performance of the package. A retaining area 191 holds the package in position to undergo electrical testing and also facilitates plugging into a fiber connector with optical sources and/or receivers. The fiber connector aligns with the OE devices in package 100 by means of the complementary mechanical alignment features possessed by both; the text fixture holds each in approximately the right position but is not responsible for alignment. Thus testing in the test fixture evaluates the electrical and optical performance of the package.

Figure 23:
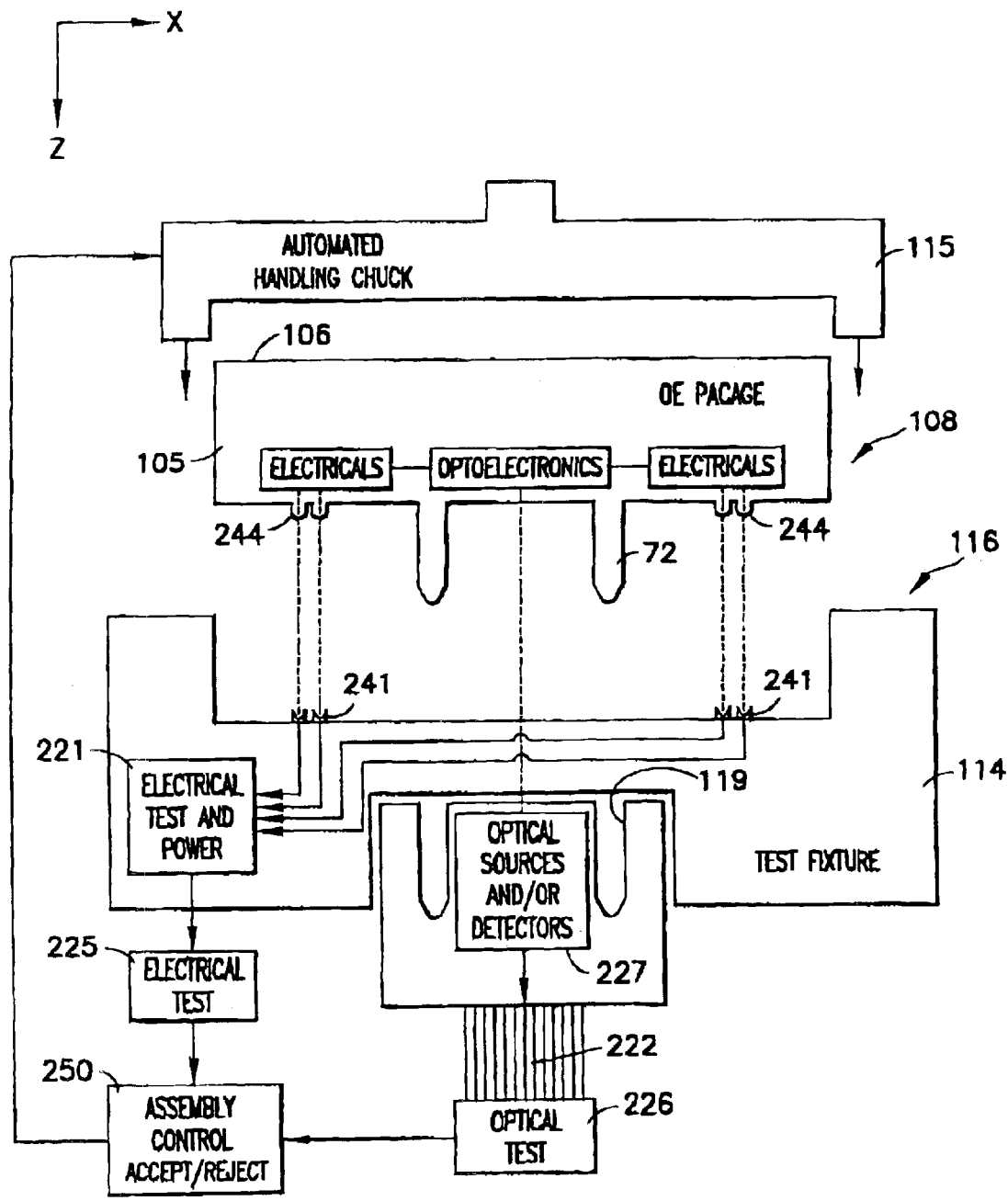
FIG. 23 shows schematically an automated process flow for testing the small scale package by engaging it and an optical source or receiver and analyzing its performance by means of a test fixture such as in FIG. 22.

FIG. 23 shows schematically the test fixture and process for testing small scale package of the invention. Small scale package 108 is held by handling chuck 115 and placed into the test fixture. A series of electrical and optical tests are performed to determining whether the component should be accepted or rejected. The test fixture is designed to allow electrical and optical access to the component. Small scale package 108 mates with complementary features in test socket 116, which comprises a base 114 equipped with electrical and optical signal sending and receiving capability as well as alignment means. The small scale package 108 is mated with the test socket by means of guide pins 72 which fit receptacles 119 in the test socket, thus aligning the OE devices with fibers or waveguides in the test socket and lining up electrical connections that need to be formed for the test process. Electrical connections 244 (solder bumps, BGA etc.) make electrical connection with corresponding electrical connectors 241 in the test socket; the connectors 241 may be spring-loaded to facilitate quick formation of a good connection during automated testing. The test socket is designed for repeated insertions and ejections of the component. The test socket is configured electrically (221) to apply power and electrical signals to appropriately test and diagnose (225) the electrical behavior of the small scale package, and to provide electrical signals to activate the OE devices as well. The OE devices, in this example lasers 20 and photodetectors 40, are aligned to form efficient optical coupling with optical fibers or waveguides 222. These optical fibers or waveguides bring optical signals to and from test equipment. The end-surfaces of the optical fibers or waveguides may optionally be provided with an interlayer 275, which can comprise an optical attenuator. The test socket 116 is appropriately configured electro-optically (227) to send (223) and receive (224) optical signals at appropriate operating speeds to test and diagnose the optical performance (226) of the OE devices, including the accuracy of their alignment with the optical fibers or waveguides.

Signals from the electrical test and optical test are used by the accept/reject function (250) to instruct the handling chuck 115 whether to accept or reject the small scale package part.

A number of advantages are specific to the optoelectronic small scale package structures of the invention, including, in general:
1. Alignment of the OE devices in the package to optical fibers in a ferrule is a simple, passive process whereby that does not require a great number of error-generating alignment steps.
2. The optical fiber end can be brought very close to flush with the transparent insulating substrate to which the optoelectronic device is flip-chipped, since there are no bond wires that create the need for a stand-off, face plate or cover.
3. Optical transparency of the substrate allows easy optical access.
4. The preferred transparent insulating substrates—sapphire, glass—provide a close (+/−10%) match of coefficient of thermal expansion with the III–V substrates (e.g., GaAs) predominantly used for the optoelectronic devices.
5. The preferred transparent insulating substrates—sapphire, glass—are good thermal insulators and serve to isolate the heat generated by the electrical circuits from the optoelectronic devices, which are typically sensitive to thermal swings.
6. The preferred transparent insulating substrates—sapphire, glass—are readily available and manufactured with conductive traces on a major surface.
7. Passive components such as inductors, resistors, and capacitors can readily be integrated on the surface of the preferred transparent insulating substrates—sapphire, glass—or bonded to the surface by, e.g., flip chip or surface solder mount techniques.

Advantages specific to embodiments that that comprise electrical circuitry in an ultrathin silicon layer on a sapphire transparent insulating substrate include:
1. The electrically insulating nature of the sapphire substrate reduces or eliminates electrical parasitic effects which otherwise would limit high-speed operation.
2. Sapphire's thermal coefficient of expansion is very well matched to that of GaAs, the substrate used in many optoelectronic devices. This thermal match makes sapphire—GaAs hybrid device combinations inherently very robust.
3. Good dielectric properties of sapphire reduce or eliminate substrate coupling and substrate loading effects in electronic circuits.
4. The passivation that covers the electrical circuitry in combination with the optical fill material for environmental protection provide a very hardy small scale package, resistant to environmental degradation.

Figure 24A:
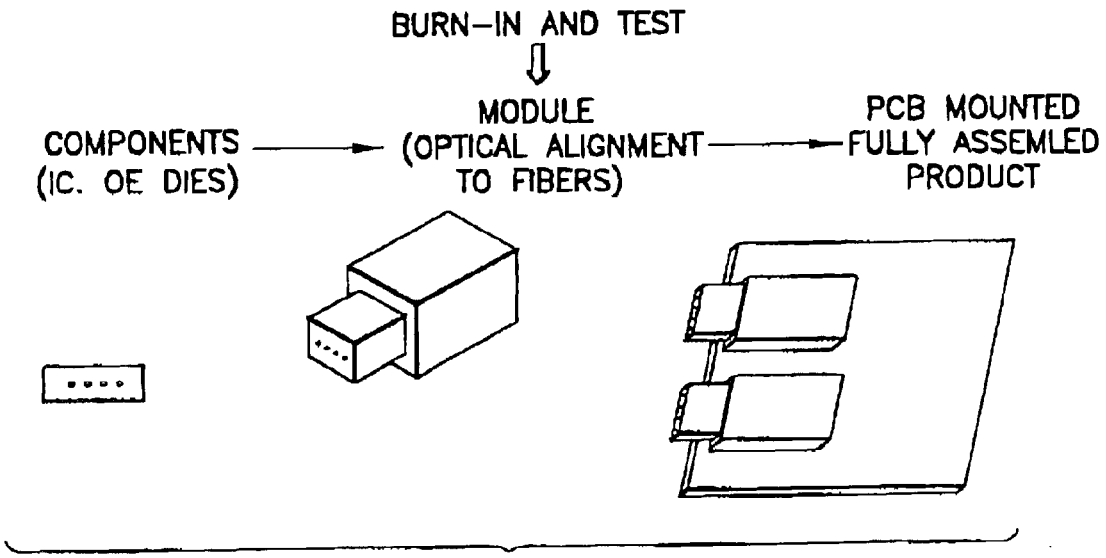
FIGS. 24A and 24B are schematic process flows for assembly of optical data links, according to the prior art (24A) and according to the method of the present invention (24B), showing for each process the stages at which burn-in and testing occurs.
Figure 24B:
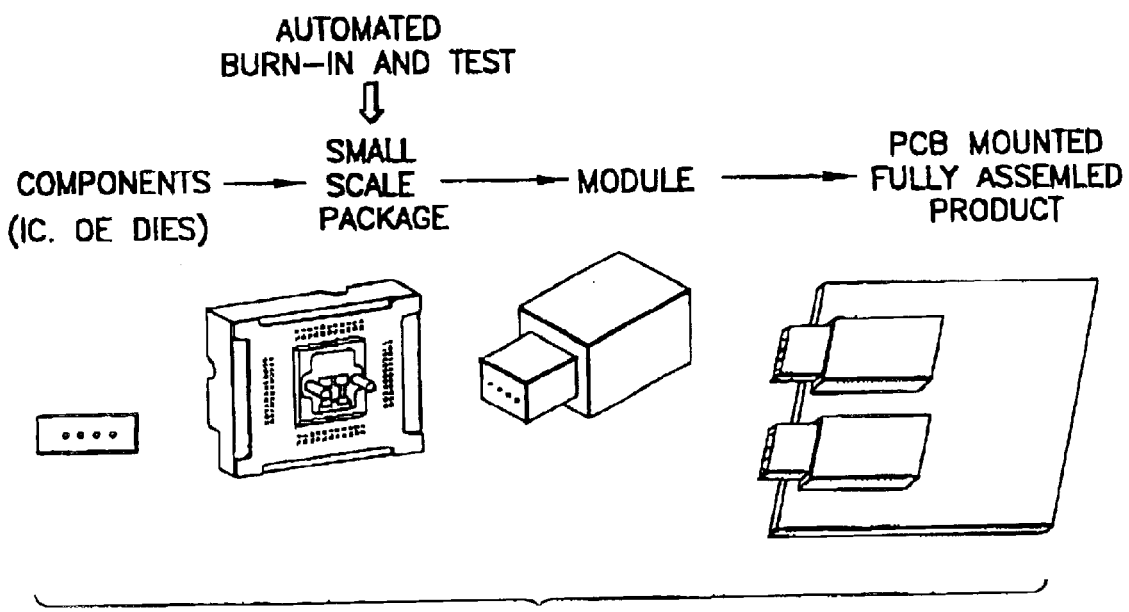

FIGS. 24A and 24B are schematic process flows for assembly of optical data links, according to the prior art (24A) and according to the method of the present invention (24B), showing for each process the stage at which burn-in testing occurs. A key advantage provided by the small scale package invention is the ability to burn in and test the package at an early stage, where losses of non-functional components are relatively cheap. By contrast, if testing must await assembly into an optical/optolectronic module, considerably more investment is wasted when nonfunctional components must be discarded.

It will be understood that the method of the present invention for an optoelectronic small scale package structure based on a transparent insulating substrate bearing the control electronics may be employed with many dimensions and designs typical of such devices. Thus, there are numerous other embodiments of the invention which will be obvious to one skilled in the art, including but not limited to changes in the dimensions of the regions forming the devices, the type of processes used to fabricate devices, the specific circuit designs, etc. Additionally, one skilled in the art will realize that the apparatus and method of the present invention may be embodied in other specific forms without departing form its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An integrated circuitry and optoelectronic packaged assembly, comprising:
    a transparent insulating substrate having first and second surfaces generally parallel to one another,
    at least one optoelectronic device bonded to said first surface of the transparent insulating substrate by flip-chip bonds of less than about 25 µm in height, such that said at least one optoelectronic device is optically accessible to optical signals through said substrate;
    electrical circuit structure at the first surface operatively coupled to the at least one optoelectronic device;
    at least one optical receiver or transmitter on the second surface of the transparent insulating substrate, wherein said optical receiver or transmitter comprises one or more alignment elements;
    mechanical alignment members on said second surface of the transparent insulating substrate, for engaging the alignment elements of said optical receiver or transmitter; and
    at least one alignment reference feature on the first surface of the transparent insulating substrate,
    wherein an optical path is formed between said optoelectronic device and said optical receiver or transmitter through said transparent insulating substrate, and wherein said optical path is free of any optical lens.

2. The assembly of claim 1, wherein the electrical circuit structure includes components selected from the group consisting of electrical circuit devices and connections.

3. The assembly of claim 1, wherein the electrical circuit structure is formed in a thin silicon layer on the first surface.

4. The assembly of claim 1, wherein the electrical circuit structure is formed in an integrated circuit chip that is flip-chip bonded to the first surface.

5. The assembly of claim 1, wherein the mechanical alignment members on said second surface comprise guide pins.

6. The assembly of claim 1, wherein the electrical circuit structure comprises a CMOS circuit.

7. The assembly of claim 1, wherein said substrate is formed of sapphire and the electrical circuit structure comprises an ultrathin silicon-on-sapphire CMOS circuit.

8. The assembly of claim 1, wherein the at least one alignment reference feature comprises at least one alignment mark on the first surface.

9. The assembly of claim 1, wherein the at least one alignment reference feature comprises photolithographically formed indicia.

10. The assembly of claim 1, wherein the at least one alignment reference feature comprises at least one feature of the electrical circuit structure.

11. The assembly of claim 1, further comprising a support member.

12. The assembly of claim 11, further comprising a heat sink mounted on said support member.

13. The assembly of claim 11, wherein the substrate is secured to the support member by conductive bonds.

14. The assembly of claim 13, wherein the support member has an open area beneath the substrate secured thereto, for optical access to said at least one optoelectronic device.

15. The assembly of claim 14, further comprising a heat sink mounted on said support member.

16. The assembly of claim 15, wherein the heat sink is secured to the support member try adhesive bonds.

17. The assembly of claim 16, wherein the assembly is environmentally sealed by the adhesive bonds securing the heat sink to the support member and by the conductive bonds securing the substrate to the support member.

18. The assembly of claim 17, wherein the mechanical alignment members comprise guide pins extending outwardly from the second surface.

19. The assembly of claim 18, wherein the guide pins are engaged in complementary guide holes of a fiber optic connector.

20. The assembly of claim 18, further comprising electrical contact elements on the support member.

21. The assembly of claim 20, wherein the electrical contact elements comprise solder bumps.

22. The assembly of claim 1, wherein the flip-chip bonds are less than about 20 µm in height.

23. The assembly of claim 1, wherein the flip-chip bonds comprise gold-gold bump bonds.

24. An optical/optoelectronic coupling system comprising:
    an optical fiber disposed in an optical fiber connector, wherein:
        the optical fiber connector has a first alignment means comprising a pair of guide holes; and
        the optical fiber is held in a precise positional relationship to the first alignment means;
    an optoelectronic device mounted on a transparent insulating substrate by flip-chip bonds of less than about 25 µm in height, wherein;
        the transparent insulating substrate has substantially parallel top and bottom surfaces and is positioned between the optical fiber and the optoelectronic device such that an optical path is provided between the optoelectronic device and the optical fiber through the transparent insulating substrate, passing through the top and bottom surfaces;
        said optical path is free of any optical lens;
        the transparent insulating substrate has a second alignment means comprising a pair of guide holes corresponding to the first alignment means;
        the optoelectronic device is mounted on the transparent insulating substrate in a precise positional relationship to the second alignment means; and
    alignment members comprising a pair of guide pins complementary to the first and second alignment means, whereby the optical fiber and optoelectronic device are aligned when the alignment members are coupled with the first and second alignment means.

25. The optical/optoelectronic coupling system of claim 24, wherein the optoelectronic device is in electrical communication with electrical circuitry on the transparent insulating substrate.

26. The optical/optoelectronic coupling system of claim 25, wherein the electrical circuitry is present in a thin silicon layer on the transparent insulating substrate.

27. The optical/optoelectronic coupling system of claim 25, wherein the electrical circuitry is flip-chip bonded to the transparent insulating substrate.

28. The optical/optoelectronic coupling system of claim 24, wherein the transparent insulating substrate is selected from the group consisting of sapphire and glasses.

29. The optical/optoelectronic coupling system of claim 24, wherein the transparent insulating substrate is sapphire and the thin silicon layer is an ultrathin silicon-on-sapphire layer.

30. The optical/optoelectronic coupling system of claim 24, wherein the optoelectronic device is selected from the group consisting of lasers, photodetector, and light modulators.

31. The optical/optoelectronic coupling system of claim 24, wherein the optical fiber comprises a single mode fiber.

32. The optical/optoelectronic coupling system of claim 24, wherein the optical fiber comprises a multimode fiber.

33. The optical/optoelectronic coupling system of claim 24, further comprising an array of optoelectronic devices coupled an array of optical fibers.

34. The optical/optoelectronic coupling system of claim 24, wherein the flip-chip bonds are less than about 20 $\mu$m in height.

35. The optical/optoelectronic coupling system of claim 24, wherein the flip-chip bonds comprise gold-gold bump bonds.

36. An optoelectronic assembly, comprising:

a transparent substrate having first and second surfaces and at least one electrical feature;

at least one optoelectronic device attached to the first surface of said transparent substrate by flip-chip bonds of less than about 25 $\mu$m in height and in electrical contact with the at least one electrical feature;

at least two alignment elements on the substrate; and an optical fiber member including an optical fiber in an optical fiber connector on the second surface of said substrate, wherein the optical fiber connector includes alignment means cooperative with said alignment elements on the substrate, wherein an optical path is formed between the optoelectronic device and the optical fiber through the transparent substrate, and wherein said optical path is free of any optical lens.

37. The optoelectronic assembly of claim 36, wherein the flip-chip bonds are less than about 20 $\mu$m in height.

38. The optoelectronic assembly of claim 36, wherein the flip-chip bonds comprise gold-gold bump bonds.

* * * * *

UNITED STATES PATENT AND TRADEMARK OFFICE
CERTIFICATE OF CORRECTION

PATENT NO. : 6,910,812 B2
DATED : June 28, 2005
INVENTOR(S) : Pommer, Richard et al.

It is certified that error appears in the above-identified patent and that said Letters Patent is hereby corrected as shown below:

Column 14,
Line 16, "bum-in" should be -- burn-in --.

Column 34,
Line 18, "60" should be -- 39 --.

Column 52,
Line 9, "try" should be -- by --.

Signed and Sealed this

First Day of November, 2005

JON W. DUDAS
*Director of the United States Patent and Trademark Office*